(12) United States Patent
Nakamura et al.

(10) Patent No.: US 12,436,461 B2
(45) Date of Patent: *Oct. 7, 2025

(54) CHEMICAL LIQUID, PATTERN FORMING METHOD, AND KIT

(71) Applicant: FUJIFILM Corporation, Tokyo (JP)

(72) Inventors: Takashi Nakamura, Shizuoka (JP); Tetsuya Kamimura, Shizuoka (JP); Satomi Takahashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 845 days.

This patent is subject to a terminal disclaimer.

(21) Appl. No.: 16/402,215

(22) Filed: May 2, 2019

(65) Prior Publication Data

US 2019/0258165 A1 Aug. 22, 2019

Related U.S. Application Data

(63) Continuation of application No. PCT/JP2017/040904, filed on Nov. 14, 2017.

(30) Foreign Application Priority Data

Nov. 18, 2016 (JP) ................................ 2016-225410
Feb. 22, 2017 (JP) ................................ 2017-030903
Nov. 13, 2017 (JP) ................................ 2017-217992

(51) Int. Cl.

| G03F 7/16 | (2006.01) |
|---|---|
| G03F 7/004 | (2006.01) |
| G03F 7/038 | (2006.01) |
| G03F 7/039 | (2006.01) |
| G03F 7/11 | (2006.01) |
| G03F 7/20 | (2006.01) |
| H01L 21/027 | (2006.01) |

(52) U.S. Cl.
CPC ............ *G03F 7/038* (2013.01); *G03F 7/0045* (2013.01); *G03F 7/0046* (2013.01); *G03F 7/0048* (2013.01); *G03F 7/0397* (2013.01); *G03F 7/11* (2013.01); *G03F 7/16* (2013.01); *G03F 7/162* (2013.01); *G03F 7/2004* (2013.01); *G03F 7/2041* (2013.01); *H01L 21/027* (2013.01)

(58) Field of Classification Search
CPC . G03F 7/325; G03F 7/16; G03F 7/168; G03F 7/038; G03F 7/0381; G03F 7/0395
See application file for complete search history.

(56) References Cited

U.S. PATENT DOCUMENTS

| 6,117,623 | A | * | 9/2000 | Koshiyama | .......... | C11D 7/5022 |
|---|---|---|---|---|---|---|
| | | | | | | 510/176 |
| 6,147,010 | A | | 11/2000 | Whitman | | |
| 6,265,309 | B1 | * | 7/2001 | Gotoh | ............... | H01L 21/02063 |
| | | | | | | 510/420 |
| 7,884,062 | B2 | | 2/2011 | Koshiyama et al. | | |
| 9,568,830 | B2 | | 2/2017 | Kim et al. | | |
| 11,175,585 | B2 | * | 11/2021 | Murayama | .............. | G03F 7/325 |
| 11,360,389 | B2 | * | 6/2022 | Kamimura | ................ | G03F 7/16 |
| 11,372,331 | B2 | * | 6/2022 | Kamimura | ............ | G03F 7/2006 |
| 11,453,734 | B2 | * | 9/2022 | Kamimura | .......... | C08F 220/365 |
| 11,573,489 | B2 | * | 2/2023 | Kamimura | .............. | G03F 7/168 |
| 11,740,557 | B2 | * | 8/2023 | Kamimura | ............. | B65D 88/06 |
| | | | | | | 510/175 |
| 2008/0176165 | A1 | * | 7/2008 | Xiang | ...................... | C09D 7/20 |
| | | | | | | 430/270.1 |
| 2011/0311914 | A1 | * | 12/2011 | Kamimura | ................ | G03F 7/32 |
| | | | | | | 430/270.1 |
| 2013/0137034 | A1 | | 5/2013 | Fu et al. | | |

(Continued)

FOREIGN PATENT DOCUMENTS

| JP | 2004039828 | 2/2004 |
|---|---|---|
| JP | 2007178589 | 7/2007 |

(Continued)

OTHER PUBLICATIONS

"International Search Report (Form PCT/ISA/210) of PCT/JP2017/040904," mailed on Jan. 23, 2018, with English translation thereof, pp. 1-7.

"Written Opinion of the International Searching Authority (Form PCT/ISA/237) of PCT/JP2017/040904," mailed on Jan. 23, 2018, with English translation thereof, pp. 1-14.

"Office Action of Korea Counterpart Application", issued on Feb. 4, 2021, with English translation thereof, p. 1-p. 8.

"Office Action of Japan Counterpart Application", issued on Mar. 10, 2020, with English translation thereof, pp. 1-14.

(Continued)

*Primary Examiner* — Daborah Chacko-Davis
(74) *Attorney, Agent, or Firm* — JCIPRNET

(57) ABSTRACT

An object of the present invention is to provide a chemical liquid which makes it possible to form a thinner resist film having a uniform thickness on a substrate by using a small amount of resist composition and demonstrates excellent defect inhibition performance. Another object of the present invention is to provide a pattern forming method. A chemical liquid of the present invention contains a mixture of two or more kinds of organic solvents, in which the organic solvents are selected from the group consisting of compounds represented by Formulae (1) to (7), compounds represented by Formulae (9) to (11), a 3- to 5-membered cyclic ketone compound that may have a substituent, a cyclic ketone compound with 6 or more members that may have a substituent, a lactone compound, and a lactam compound, the chemical liquid contains or does not contain an ether-based compound other than the compounds represented by Formula (1), Formula (5), Formula (7), and Formulae (9) to (11), and in a case where the chemical liquid contains the ether-based compound, a content of the ether-based compound in the chemical liquid is less than 10 mass ppm with respect to a total mass of the chemical liquid.

20 Claims, No Drawings

(56) References Cited

U.S. PATENT DOCUMENTS

| | | | |
|---|---|---|---|
| 2016/0054658 A1 | 2/2016 | Yoshidome et al. | |
| 2018/0087010 A1 | 3/2018 | Takahashi et al. | |
| 2019/0025701 A1* | 1/2019 | Kamimura | G03F 7/2006 |
| 2019/0062674 A1* | 2/2019 | Dory | C11D 7/28 |
| 2019/0064672 A1* | 2/2019 | Murayama | H01L 21/0271 |

FOREIGN PATENT DOCUMENTS

| | | |
|---|---|---|
| JP | 2007324393 | 12/2007 |
| JP | 2015232708 | 12/2015 |
| WO | 2007097233 | 8/2007 |
| WO | 2014178333 | 11/2014 |
| WO | 2016181753 | 11/2016 |

OTHER PUBLICATIONS

"Office Action of Korea Counterpart Application", issued on Aug. 3, 2020, with English translation thereof, p. 1-p. 14.
"Office Action of Japan Counterpart Application", issued on Sep. 15, 2020, with English translation thereof, p. 1-p. 4.

* cited by examiner

CHEMICAL LIQUID, PATTERN FORMING METHOD, AND KIT

CROSS-REFERENCE TO RELATED APPLICATIONS

This application is a Continuation of PCT International Application No. PCT/JP2017/040904 filed on Nov. 14, 2017, which claims priority under 35 U.S.C. § 119(a) to Japanese Patent Application No. 2016-225410 filed on Nov. 18, 2016, Japanese Patent Application No. 2017-030903 filed on Feb. 22, 2017 and Japanese Patent Application No. 2017-217992 filed on Nov. 13, 2017. Each of the above applications is hereby expressly incorporated by reference, in its entirety, into the present application.

BACKGROUND OF THE INVENTION

1. Field of the Invention

The present invention relates to a chemical liquid, a pattern forming method, and a kit.

2. Description of the Related Art

During the photolithography process in a semiconductor device manufacturing process, a substrate such as a semiconductor wafer (hereinafter, referred to as "wafer" as well) is coated with an actinic ray-sensitive or radiation-sensitive resin composition (hereinafter, referred to as "resist composition" as well) so as to form an actinic ray-sensitive or radiation-sensitive film (hereinafter, referred to as "resist film" as well). Furthermore, steps of exposing the formed resist film, developing the exposed resist film so as to form a predetermined pattern, and the like are sequentially performed, and in this way, a resist pattern is formed on the wafer.

In recent years, as semiconductor devices have been further scaled down, thinning of resist films have been required. Furthermore, there has been a demand for a technique of forming a uniform resist film by using a small amount of resist composition. As such a technique, a method is known in which a substrate is coated with a chemical liquid called prewet agent before the substrate is coated with a resist composition. In JP2007-324393A, as a prewet agent, a solution is described which is obtained by mixing together a solvent having low volatility and a solvent having low surface tension at a predetermined ratio.

SUMMARY OF THE INVENTION

The inventors of the present invention coated a substrate with the prewet agent described in JP2007-324393A and then with a resist composition. As a result, the inventors have found that depending on the combination of organic solvents, it is difficult to form a thinner resist film having a uniform thickness on the substrate by using a small amount of the resist composition, or defect inhibition performance becomes insufficient. Furthermore, the inventors have found that in a case where the prewet agent contains one kind of organic solvent, sometimes it is difficult to form a resist film due to the variation in the components constituting the resist film and/or stable defect inhibition performance cannot be obtained.

An object of the present invention is to provide a chemical liquid which makes it possible to form a thinner resist film having a uniform thickness on a substrate by using a small amount of resist composition (hereinafter, the above properties will be described as having excellent "resist saving properties" as well) and demonstrates excellent defect inhibition performance. Another object of the present invention is to provide a chemical liquid storage body and a pattern forming method.

In the present specification, the resist saving properties and the defect inhibition performance mean the resist saving properties and the defect inhibition performance measured by the method described in Examples.

In order to achieve the aforementioned objects, the inventors of the present invention carried out an intensive examination. As a result, the inventors have found that the objects can be achieved by the following constitution.

[1] A chemical liquid comprising a mixture of two or more kinds of organic solvents, in which the organic solvents are selected from the group consisting of compounds represented by Formulae (1) to (7), compounds represented by Formulae (9) to (11), a 3- to 5-membered cyclic ketone compound that may have a substituent, a cyclic ketone compound with 6 or more members that may have a substituent, a lactone compound, and a lactam compound, the chemical liquid contains or does not contain an ether-based compound other than the compounds represented by Formula (1), Formula (5), Formula (7), and Formulae (9) to (11), in a case where the chemical liquid contains the ether-based compound, a content of the ether-based compound in the chemical liquid is less than 10 mass ppm with respect to a total mass of the chemical liquid, and the chemical liquid does not include a chemical liquid in which the mixture is formed of a lactone compound and the compound represented by Formula (5), a chemical liquid in which the mixture is formed of the cyclic ketone compound with 6 or more members that may have a substituent and the compound represented by Formula (1), a chemical liquid in which the mixture is formed of a lactone compound, the compound represented by Formula (1), and the compound represented by Formula (5), and a chemical liquid in which the mixture is formed of the compound represented by Formula (1) and the compound represented by Formula (3).

[2] A chemical liquid comprising a mixture of two or more kinds of organic solvents, in which the mixture contains γ-butyrolactone and at least one kind of organic solvent selected from the group consisting of butyl acetate, ethyl lactate, 2-hydroxymethyl isobutyrate, cyclopentanone dimethyl acetal, cyclopentanone, anisole, phenetole, ethylene glycol monomethyl ether acetate, 3-methoxymethyl propionate, and 3-ethoxyethyl propionate, contains dimethyl sulfoxide and at least one kind of organic solvent selected from the group consisting of propylene glycol monomethyl ether acetate, butyl acetate, ethyl lactate, 2-hydroxymethyl isobutyrate, propylene glycol monomethyl ether, cyclopentanone dimethyl acetal, cyclopentanone, cyclohexanone, anisole, phenetole, ethylene glycol monomethyl ether acetate, 3-methoxymethyl propionate, and 3-ethoxyethyl propionate, contains ethylene carbonate and at least one kind of organic solvent selected from the group consisting of propylene glycol monomethyl ether acetate, butyl acetate, ethyl lactate, 2-hydroxymethyl isobutyrate, propylene glycol monomethyl ether, cyclopentanone dimethyl acetal, cyclopentanone, cyclohexanone, anisole, phenetole, ethylene glycol monomethyl ether acetate, 3-methoxymethyl propionate, and 3-ethoxyethyl propionate, contains propylene carbonate and at least one kind of organic solvent selected from the group consisting of propylene glycol monomethyl ether acetate, butyl acetate, ethyl lactate, 2-hydroxymethyl isobutyrate, propylene glycol monomethyl ether, cyclopentanone dimethyl acetal, cyclopentanone, cyclohexanone, anisole, phenetole, ethylene glycol monomethyl ether acetate, 3-methoxymethyl propionate, and 3-ethoxyethyl propionate, contains 1-methyl-2-pyrrolidone and at least one kind of organic solvent selected from the group consisting of propylene glycol monomethyl ether acetate, butyl acetate, ethyl lactate, 2-hydroxymethyl isobutyrate, propylene glycol monomethyl ether, cyclopentanone dimethyl acetal, cyclopentanone, cyclohexanone, anisole, phenetole, ethylene glycol monomethyl ether acetate, 3-methoxymethyl propionate, and 3-ethoxyethyl propionate, contains propylene glycol monomethyl ether acetate and at least one kind of organic solvent selected from the group consisting of butyl acetate, cyclopentanone dimethyl acetal, cyclopentanone, anisole, phenetole, ethylene glycol monomethyl ether acetate, 3-methoxymethyl propionate, and 3-ethoxyethyl propionate, contains cyclohexanone and at least one kind of organic solvent selected from the group consisting of butyl acetate, ethyl lactate, 2-hydroxymethyl isobutyrate, propylene glycol monomethyl ether, cyclopentanone dimethyl acetal, cyclopentanone, anisole, phenetole, ethylene glycol monomethyl ether acetate, 3-methoxymethyl propionate, and 3-ethoxyethyl propionate, contains ethyl lactate and at least one kind of organic solvent selected from the group consisting of butyl acetate, propylene glycol monomethyl ether, cyclopentanone dimethyl acetal, cyclopentanone, anisole, phenetole, ethylene glycol monomethyl ether acetate, 3-methoxymethyl propionate, and 3-ethoxyethyl propionate, contains 2-hydroxymethyl isobutyrate and at least one kind of organic solvent selected from the group consisting of butyl acetate, propylene glycol monomethyl ether, cyclopentanone dimethyl acetal, cyclopentanone, anisole, phenetole, ethylene glycol monomethyl ether acetate, 3-methoxymethyl propionate, and 3-ethoxyethyl propionate, or contains cyclopentanone dimethyl acetal and at least one kind of organic solvent selected from the group consisting of butyl acetate, propylene glycol monomethyl ether, cyclopentanone, anisole, phenetole, ethylene glycol monomethyl ether acetate, 3-methoxymethyl propionate, and 3-ethoxyethyl propionate.

[3] The chemical liquid described in [1] or [2], comprising a mixture of two or more kinds of the organic solvents.

[4] The chemical liquid described in any one of [1] to [3], in which a vapor pressure of the mixture is 160 to 1,000 Pa at 25° C.

[5] The chemical liquid described in any one of [1] to [4], in which the mixture contains a first organic solvent which has a vapor pressure of 160 to 1,000 Pa at 25° C. and a second organic solvent which has a vapor pressure higher than 1,000 Pa at 25° C. or contains two or more kinds of the first organic solvents.

[6] The chemical liquid described in any one of [1] to [5], in which the mixture contains a third organic solvent which has a vapor pressure lower than 160 Pa at 25° C.

[7] The chemical liquid described in any one of [1] to [6], in which a surface tension of the mixture is equal to or higher than 28 mN/m at 25° C.

[8] The chemical liquid described in any one of [1] to [7], in which the mixture contains an organic solvent having a Hansen solubility parameter higher than 9.5 $(MPa)^{0.5}$ in terms of a hydrogen bond element or having a Hansen solubility parameter higher than 15.5 $(MPa)^{0.5}$ in terms of a dispersion element.

[9] The chemical liquid described in any one of [1] to [8] that is used for pre-wetting.

[10] A pattern forming method comprising a pre-wetting step of coating a substrate with the chemical liquid described in any one of [1] to [9] so as to obtain a pre-wetted substrate, a resist film forming step of forming a resist film on the pre-wetted substrate by using an actinic ray-sensitive or radiation-sensitive resin composition, an exposure step of exposing the resist film, and a development step of developing the exposed resist film by using a developer, in which the actinic ray-sensitive or radiation-sensitive resin composition contains a resin including at least one kind of repeating unit selected from the group consisting of a repeating unit represented by Formula (a), a repeating unit represented by Formula (b), a repeating unit represented by Formula (c), a repeating unit represented by Formula (d), and a repeating unit represented by Formula (e) that will be described later.

[11] The pattern forming method described in [10], in which the chemical liquid with which the substrate is coated in the pre-wetting step satisfies the following conditions 1 and 2 that will be described later at 25° C.

[12] A kit comprising the chemical liquid described in any one of [1] to [9] and an actinic ray-sensitive or radiation-sensitive resin composition which contains a resin including at least one kind of repeating unit selected from the group consisting of a repeating unit represented by Formula (a), a repeating unit represented by Formula (b), a repeating unit represented by Formula (c), a repeating unit represented by Formula (d), and a repeating unit represented by Formula (e) that will be described later.

[13] A kit comprising the chemical liquid described in any one of [1] to [9] and an actinic ray-sensitive or radiation-sensitive resin composition, in which the actinic ray-sensitive or radiation-sensitive resin composition contains a resin which has a repeating unit having a phenolic hydroxyl group and has a group generating a polar group by being decomposed by the action of an acid.

[14] A kit comprising the chemical liquid described in any one of [1] to [9] and an actinic ray-sensitive or radiation-sensitive resin composition, in which the actinic ray-sensitive or radiation-sensitive resin composition contains a hydrophobic resin and a resin which has a group generating a polar group by being decomposed by the action of an acid.

[15] A kit comprising the chemical liquid described in any one of [1] to [9] and an actinic ray-sensitive or radiation-sensitive resin composition containing a resin, in which the kit satisfies Condition 1 and Condition 2 that will be described later.

According to the present invention, it is possible to provide a chemical liquid which has excellent resist saving properties and excellent defect inhibition performance (hereinafter, described as "having the effects of the present invention" as well). Furthermore, according to the present invention, it is possible to provide a pattern forming method and a kit.

DESCRIPTION OF THE PREFERRED EMBODIMENTS

Hereinafter, the present invention will be specifically described.

The following constituents will be described based on typical embodiments of the present invention in some cases, but the present invention is not limited to the embodiments.

In the present specification, a range of numerical values described using "to" means a range including the numerical values listed before and after "to" as a lower limit and an upper limit respectively.

In the present invention, "preparation" means not only the preparation of a specific material by means of synthesis or mixing but also the preparation of a predetermined substance by means of purchase and the like.

In the present specification, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-15}$)".

In the present invention, 1 Å (angstrom) equals 0.1 nm.

In the present invention, regarding the description of a group (atomic group), in a case where whether the group is substituted or unsubstituted is not described, as long as the effects of the present invention are not impaired, the group includes a group which does not have a substituent and a group which has a substituent. For example, "alkyl group" includes not only an alkyl group which does not have a substituent (unsubstituted alkyl group) but also an alkyl group which has a substituent (substituted alkyl group). The same is true for each compound.

Furthermore, in the present invention, "radiation" means, for example, far ultraviolet rays, extreme ultraviolet (EUV), X-rays, electron beams, and the like. In addition, in the present invention, light means actinic rays or radiation. In the present invention, unless otherwise specified, "exposure" includes not only exposure, far ultraviolet rays, X-rays, and EUV, and the like, but also lithography by particle beams such as Electron beams or ion beams.

[Chemical Liquid]

The chemical liquid according to a first embodiment of the present invention (hereinafter, this chemical liquid will be simply referred to as "chemical liquid" in some cases in the present specification) is a chemical liquid containing a mixture of two or more kinds of organic solvents, in which the organic solvents are selected from predetermined compounds, the chemical liquid contains or does not contain a predetermined ether-based compound, and in a case where the chemical liquid contains the predetermined ether-based compound, a content of the predetermined ether-based compound in the chemical liquid with respect to a total mass of the chemical liquid is less than 10 mass ppm. Here, the chemical liquid does not include a chemical liquid in which the mixture is formed of a lactone compound and a compound represented by Formula (5), a chemical liquid in which the mixture is formed of a cyclic ketone compound with 6 or more members that may have a substituent and a compound represented by Formula (1), a chemical liquid in which the mixture is formed of a lactone compound, the compound represented by Formula (1), and the compound represented by Formula (5), and a chemical liquid in which the mixture is formed of the compound represented by Formula (1) and a compound represented by Formula (3).

[Ether-Based Compound]

The chemical liquid according to the embodiment contains or does not contain an ether-based compound other than compounds represented by Formula (1), Formula (5), Formula (7), and Formulae (9) to (11) (hereinafter, these compounds will be referred to as "specific compounds" as well). In a case where the chemical liquid contains the ether-based compound, the content of the ether-based compound in the chemical liquid with respect to the total mass of the chemical liquid is less than 10 mass ppm.

In the present specification, the ether-based compound and the organic solvents which will be described later mean different components.

In a case where the chemical liquid according to the embodiment contains the ether-based compound, the content of the ether-based compound in the chemical liquid with respect to the total mass of the chemical liquid is less than 10 mass ppm, and preferably equal to or smaller than 5 mass ppm.

One kind of the ether-based compound may be used singly, or two or more kinds of the ether-based compounds may be used in combination. In a case where two or more kinds of the ether-based compounds are used in combination, the total content thereof is preferably within the above range.

It is preferable that the chemical liquid according to the embodiment does not contain the ether-based compound, because then the chemical liquid has further improved defect inhibition performance. In the present specification, "substantially does not contain the ether-based compound" means that the ether-based compound is not detected in a case where the chemical liquid is measured using the method of Examples by using gas chromatography mass spectrometry which will be described later.

In a case where the chemical liquid does not contain the ether-based compound or in a case where the chemical liquid contains the ether-based compound but the content thereof is within the above range, the effects of the present invention are obtained. Although the mechanism that brings about the effects is not unclear, particularly in a case where the surface tension of the mixture of organic solvents, which will be described later, is equal to or lower than 40 mN/m, the effects become apparent.

As the ether-based compound, known compounds can be used without particular limitation as long as the ether-based compound is not included in the specific compounds. Examples of the ether-based compound include hydrocarbon-based compounds such as glycol ether. Examples of the hydrocarbon-based compounds include dialkylene glycol alkyl ether, dialkylene glycol dialkyl ether, alkylene glycol dialkyl ether, alkylene glycol alkyl ether, and the like. More specifically, examples of these include diethylene glycol methyl ethyl ether, ethylene glycol methyl ether, diethylene glycol methyl ether, diethylene glycol ethyl ether, diethylene glycol butyl ether, diethylene glycol dimethyl ether, diethylene glycol diethyl ether, and the like.

As the ether-based compound, for example, a compound represented by Formula (8) can be used.

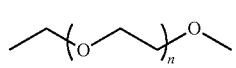

(8)

In Formula (8), n represents an integer equal to or greater than 1. The upper limit of n is not particularly limited, but is preferably equal to or smaller than 3.

The molecular weight of the ether-based compound is not particularly limited. Generally, the molecular weight of the ether-based compound is preferably less than 1,000, more preferably less than 500, and even more preferably less than 200.

It is preferable that the ether-based compound (particularly, the hydrocarbon-based compound) contain none of fluorine (F) and silicone (Si). In a case where the ether-based compound contains none of these, it is possible to prevent the phenomenon in which the ether-based compound molecules are aggregated due to fluorine and/or silicon and/or the phenomenon in which residues remain on a wafer due to the interaction with components (for example, a resin which will be described later and the like) in the wafer and/or a resist solution.

[Mixture of Two or More Kinds of Organic Solvents]

The chemical liquid contains a mixture of two or more kinds of organic solvents. In a case where the chemical liquid contains the mixture of two or more kinds of organic solvents, unlike a chemical liquid containing only one kind of organic solvent, the chemical liquid can be adjusted according to the components constituting a resist film. Furthermore, regardless of the variation of the components constituting a resist film, a stabilized resist film can be formed, or defect inhibition performance can be obtained.

The content of the mixture in the chemical liquid is not particularly limited, but is preferably 99.9% to 100% by mass with respect to the total mass of the chemical liquid in general.

It is preferable that the organic solvents stay as liquids in an environment with −5 kPa (gauge pressure) and 80° C.

<Organic Solvents>

The organic solvents are selected from the group consisting of compounds represented by Formulae (1) to (7), compound represented by Formulae (9) to (11), a 3- to 5-membered cyclic ketone compound that may have a substituent, a cyclic ketone compound with 6 or more members that may have a substituent, a lactone compound, and a lactam compound.

Compound Represented by Formula (1)

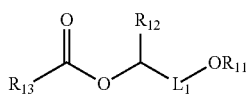

(1)

In Formula (1), $R_{11}$ and $R_{12}$ each independently represent an alkyl group, $R_{13}$ represents a hydrogen atom or an alkyl group, and $L_1$ represents a single bond or an alkylene group.

The alkyl group represented by $R_{11}$ and $R_{12}$ is not particularly limited, and may be any of a linear, branched, or cyclic alkyl group. The number of carbon atoms in the alkyl group is not particularly limited, but is preferably 1 to 8 in general and more preferably 1 to 6.

The number of carbon atoms in the alkylene group represented by $L_1$ is not particularly limited, but is preferably 1 to 8 in general and more preferably 1 to 6.

The compound represented by Formula (1) is not particularly limited, and examples thereof include propylene glycol monomethyl ether acetate and the like.

The content of the compound represented by Formula (1) in the mixture is not particularly limited. However, the content of the compound with respect to the total mass of the mixture is preferably 20% to 80% by mass in general.

Compound Represented by Formula (2)

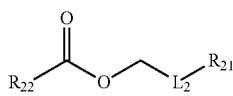

(2)

In Formula (2), $R_{21}$ and $R_{22}$ each independently represent a hydrogen atom or an alkyl group, and $L_2$ represents a single bond or an alkylene group. The alkyl group represented by $R_{21}$ and $R_{22}$ is not particularly limited, and is as described above as the alkyl group represented by $R_{11}$ in Formula (1).

The alkylene group represented by $L_2$ is as described above as the alkylene group represented by $L_1$.

The compound represented by Formula (2) is not particularly limited, and examples thereof include butyl acetate, isoamyl acetate, ethyl acetate, propyl butyrate, butyl butyrate, and the like. Among these, butyl acetate is preferable.

The content of the compound represented by Formula (2) in the mixture is not particularly limited. However, the content of the compound with respect to the total mass of the mixture is preferably 45% to 65% by mass in general.

Compound Represented by Formula (3)

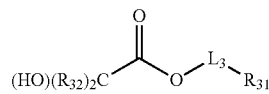

In Formula (3), $R_{31}$ and $R_{32}$ each independently represent a hydrogen atom or an alkyl group. At least one of a plurality of $R_{32}$'s represents an alkyl group. $L_3$ represents a single bond or an alkylene group.

The alkyl group represented by $R_{31}$ and $R_{32}$ is not particularly limited, and is as described above as the alkyl group represented by $R_{11}$ in Formula (1).

The alkylene group represented by $L_3$ is as described above as the alkylene group represented by $L_1$.

The compound represented by Formula (3) is not particularly limited, and examples thereof include methyl lactate, ethyl lactate, propyl lactate, 2-hydroxymethyl isobutyrate, 2-hydroxyethyl isobutyrate, and the like. Among these, ethyl lactate or 2-hydroxymethyl isobutyrate is preferable.

The content of the compound represented by Formula (3) in the mixture is not particularly limited. However, the content of the compound with respect to the total mass of the mixture is preferably 10% to 100% by mass in general, and more preferably 20% to 95% by mass. The state where the content of the compound represented by Formula (3) in the mixture is 100% by mass means that each of two or more kinds of the organic solvents is represented by Formula (3). For example, in the mixture, the content of ethyl lactate is 50% by mass and the content of 2-hydroxymethyl isobutyrate is 50% by mass.

Compound Represented by Formula (4)

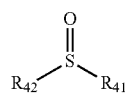

In Formula (4), $R_{41}$ and $R_{42}$ each independently represent an alkyl group. The alkyl group represented by $R_{41}$ and $R_{42}$ is not particularly limited, and is as described above as the alkyl group represented by $R_{11}$ in Formula (1).

The compound represented by Formula (4) is not particularly limited, and examples thereof include dimethyl sulfoxide, dibutyl sulfoxide, and the like. Among these, dimethyl sulfoxide is preferable.

The content of the compound represented by Formula (4) in the mixture is not particularly limited. However, the content of the compound with respect to the total mass of the mixture is preferably 5% to 50% by mass in general, and more preferably 5% to 30% by mass.

Compound Represented by Formula (5)

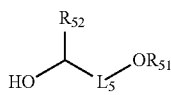

(5)

In Formula (5), $R_{51}$ and $R_{52}$ each independently represent an alkyl group, and $L_5$ represents a single bond or an alkylene group. The alkyl group represented by $R_{51}$ and $R_{52}$ is not particularly limited, and is as described above as the alkyl group represented by $R_{11}$ in Formula (1).

The alkylene group represented by $L_5$ is as described above as the alkylene group represented by $L_1$.

The compound represented by Formula (5) is not particularly limited, and examples thereof include propylene glycol monomethyl ether and the like.

The content of the compound represented by Formula (5) in the mixture is not particularly limited. However, the content of the compound with respect to the total mass of the mixture is preferably 20% to 50% by mass in general.

Compound Represented by Formula (6)

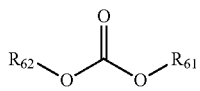

(6)

In Formula (6), $R_{61}$ and $R_{62}$ each independently represent an alkyl group. $R_{61}$ and $R_{62}$ may form a ring by being bonded to each other.

The alkyl group represented by $R_{61}$ and $R_{62}$ Is not particularly limited, and is as described above as the alkyl group represented by $R_{11}$ in Formula (1).

The compound represented by Formula (6) is not particularly limited, and examples thereof include ethylene carbonate, propylene carbonate, 1,2-butylene carbonate, diethyl carbonate, dimethyl carbonate, ethyl methyl carbonate, vinylene carbonate, and the like. Among these, ethylene carbonate or propylene carbonate is preferable.

The content of the compound represented by Formula (6) in the mixture is not particularly limited. However, the content of the compound with respect to the total mass of the mixture is preferably 5% to 50% by mass in general.

Compound Represented by Formula (7)

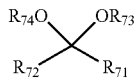

(7)

In Formula (7), $R_{71}$, $R_{72}$, $R_{73}$, and $R_{74}$ each independently represent an alkyl group. $R_{71}$ and $R_{72}$ may form a ring by being bonded to each other.

The alkyl group represented by $R_{71}$ to $R_{74}$ is not particularly limited, and is as described above as the alkyl group represented by $R_{11}$ in Formula (1).

The compound represented by Formula (7) is not particularly limited, and examples thereof include 1,1-dimethoxycyclopentane(cyclopentanonedimethylacetal), cyclopentanone dimethyl acetal, 1,1-dimethoxycyclohexane, 2,2-dibutoxypropane, 2,2-dimethoxypropane, and the like. Among these, cyclopentanone dimethyl acetal is preferable.

The content of the compound represented by Formula (7) in the mixture is not particularly limited. However, the content of the compound with respect to the total mass of the mixture is preferably 20% to 95% by mass in general.

Compound Represented by Formula (9)

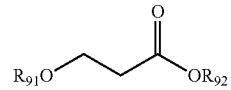

(9)

In Formula (9), $R_{91}$ and $R_{92}$ each independently represent an alkyl group. $R_{91}$ and $R_{92}$ may be the same as or different from each other.

The alkyl group represented by $R_{91}$ and $R_{92}$ is not particularly limited, and is as described above as the alkyl group represented by $R_{11}$ in Formula (1).

The compound represented by Formula (9) is not particularly limited, and examples thereof include 3-methoxymethyl propionate (MMP), 3-ethoxyethyl propionate, and the like.

The content of the compound represented by Formula (9) in the mixture is not particularly limited. However, the content of the compound with respect to the total mass of the mixture is preferably 30% to 97% by mass in general.

Compound Represented by Formula (10)

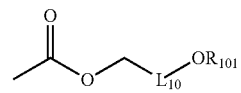

(10)

In Formula (10), $R_{101}$ represents an alkyl group. The alkyl group represented by $R_{101}$ is not particularly limited, and is as described above as the alkyl group represented by $R_{11}$ in Formula (1).

$L_{10}$ represents a single bond or an alkylene group. The alkylene group represented by $L_{10}$ is as described above as the alkylene group represented by $L_1$.

The compound represented by Formula (10) is not particularly limited, and examples thereof include ethylene glycol monomethyl ether acetate and the like.

The content of the compound represented by Formula (10) in the mixture is not particularly limited. However, the content of the compound with respect to the total mass of the mixture is preferably 50% to 90% by mass in general.

Compound Represented by Formula (11)

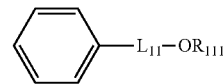

(11)

In Formula (11), $R_{111}$ represents an alkyl group. The alkyl group represented by $R_{111}$ is not particularly limited, and is as described above as the alkyl group represented by $R_{11}$ in Formula (1).

$L_{11}$ represents a single bond or an alkylene group. The alkylene group represented by $L_{11}$ is as described above as the alkylene group represented by $L_1$.

The compound represented by Formula (11) is not particularly limited, and examples thereof include anisole, phenetole, and the like.

The content of the compound represented by Formula (11) in the mixture is not particularly limited. However, the content of the compound with respect to the total mass of the mixture is preferably 1.0% to 85.0% by mass in general.

3- to 5-Membered Cyclic Ketone Compound that May have a Substituent

The substituent is not particularly limited, and examples thereof include a linear, branched, or cyclic alkyl group, a halogen atom, a hydroxyl group, an amino group, a combination of these, and the like.

The number of members of the ring is preferably 4 or 5, and more preferably 5.

The 3- to 5-membered cyclic ketone compound that may have a substituent is not particularly limited, and examples thereof include cyclopentanone, 2,2,4-trimethyl cyclopentanone, cyclobutanone, and the like. Among these, cyclopentanone is preferable.

The content of the 3- to 5-membered cyclic ketone compound that may have a substituent in the mixture is not particularly limited. However, the content of the compound with respect to the total mass of the mixture is preferably 20% to 60% by mass in general.

Cyclic Ketone Compound with 6 or More Members that May have a Substituent

The substituent is not particularly limited, and examples thereof include a linear, branched, or cyclic alkyl group, a halogen atom, a hydroxyl group, an amino group, a combination of these, and the like.

The upper limit of the number of members of the ring is not particularly limited, but is preferably equal to or smaller than 12, more preferably equal to or smaller than 10, and even more preferably equal to or smaller than 8.

The cyclic ketone compound with 6 or more members that may have a substituent is not particularly limited, and examples thereof include cyclohexanone, 4-tert-butyl cyclohexanone, 2-chlorocyclohexanone, dimethyl cyclohexanone, 2-methoxycyclohexanone, cycloheptanone, cyclooctanone, and the like. Among these, cyclohexanone is preferable.

The content of the cyclic ketone compound with 6 or more members that may have a substituent in the mixture is not particularly limited. However, the content of the compound with respect to the total mass of the mixture is preferably 65% to 95% by mass in general.

Lactone Compound

The lactone compound is not particularly limited, and examples thereof include β-propiolactone, β-butyrolactone, β-valerolactone, γ-butyrolactone, γ-valerolactone, γ-caprylolactone, δ-valerolactone, β-methyl-δ-valerolactone, δ-stearolactone, ε-caprolactone, γ-octanoic lactone, 2-methyl-ε-caprolactone, 4-methyl-ε-caprolactone, ε-caprylolactone, ε-palmitolactone, α-hydroxy-γ-butyrolactone, α-methyl-γ-butyrolactone, and the like. Among these, γ-butyrolactone is preferable.

The content of the lactone compound in the mixture is not particularly limited. However, the content of the compound with respect to the total mass of the mixture is preferably 5% to 50% by mass and more preferably 5% to 35% by mass in general.

Lactam Compound

The lactam compound is not particularly limited, and examples thereof include 2-pyrrolidone, 1-methyl-2-pyrrolidone, ε-caprolactam, and the like. Among these, 1-methyl-2-pyrrolidone is preferable.

The content of the lactam compound in the mixture is not particularly limited. However, the content of the compound with respect to the total mass of the mixture is preferably 5% to 50% by mass in general.

The chemical liquid contains a mixture of two or more kinds of the organic solvents.

The mixture preferably contains at least one kind of organic solvent selected from the group consisting of Formula (4), Formula (6), Formula (7), and the 3- to 5-membered cyclic ketone compound that may have a substituent, and more preferably contains at least one kind of organic solvent selected from the group consisting of Formula (4), Formula (6), and Formula (7). The chemical liquid containing the mixture containing the organic solvents has further improved effects of the present invention.

Furthermore, the mixture preferably contains the compound represented by Formula (9) and at least one kind of compound selected from the group consisting of the compound represented by Formula (4) and the compound represented by Formula (6), and is more preferably formed of the compound represented by Formula (9) and the compound represented by Formula (4) or the compound represented by Formula (6).

In addition, the mixture preferably contains the compound represented by Formula (10) and at least one kind of compound selected from the group consisting of the compound represented by Formula (1), the compound represented by Formula (3), the compound represented by Formula (4), the compound represented by Formula (5), the compound represented by Formula (6), the compound represented by Formula (7), and a lactone compound, and is more preferably formed of the compound represented by Formula (10) and at least one kind of compound selected from the group consisting of the compound represented by Formula (1), the compound represented by Formula (3), the compound represented by Formula (4), the compound represented by Formula (5), the compound represented by Formula (6), the compound represented by Formula (7), and a lactone compound.

Moreover, the mixture preferably contains the compound represented by Formula (9) and at least one kind of compound selected from the group consisting of the compound represented by Formula (1), the compound represented by Formula (3), the compound represented by Formula (4), the compound represented by Formula (5), the compound represented by Formula (6), the compound represented by Formula (7), and a lactone compound, and is more preferably formed of the compound represented by Formula (9) and at least one kind of compound selected from the group consisting of the compound represented by Formula (1), the compound represented by Formula (3), the compound represented by Formula (4), the compound represented by Formula (5), the compound represented by Formula (6), the compound represented by Formula (7), and a lactone compound.

Particularly, in view of obtaining a chemical liquid having further improved effects of the present invention, the mixture is even more preferably formed of the compound represented by Formula (1) and the compound represented by Formula (4), formed of the compound represented by Formula (4) and the compound represented by Formula (9), formed of the compound represented by Formula (1) and the compound represented by Formula (6), formed of the compound represented by Formula (6) and the compound represented by Formula (9), formed of the compound represented by Formula (1) and the compound represented by Formula (10), or formed of the compound represented by Formula (1) and the compound represented by Formula (9).

In a case where the mixture of organic solvents contained in the chemical liquid is formed of a lactone compound and the compound represented by Formula (5), the chemical liquid does not have desired performance. Specifically, in a case where a substrate is coated with such a chemical liquid and then coated with a resist composition so as to obtain a predetermined thickness, the thickness of the formed resist film tends to be significantly uneven (desired film thickness controllability is not obtained). Furthermore, in a case where a pattern is formed by the method described in Examples by using the chemical liquid, the amount of residues in an unexposed portion and the number of BRIDGE defects tend to increase. The number of BRIDGE defects will be described later.

In a case where the mixture of organic solvents contained in the chemical liquid is formed the cyclic ketone compound with 6 or more members that may have a substituent and the compound represented by Formula (1), and a pattern is formed using the chemical liquid by the method described in Examples, the amount of residues in an unexposed portion and the number of BRIDGE defects tend to increase.

Furthermore, in a case where the mixture of organic solvents contained in the chemical liquid is formed of a lactone compound, the compound represented by Formula (1), and the compound represented by Formula (5), and a substrate is coated with the chemical liquid and then coated with a resist composition so as to obtain a predetermined thickness, the thickness of the formed resist film tends to be significantly uneven (desired film thickness controllability is not obtained).

In addition, in a case where the mixture of organic solvents contained in the chemical liquid is formed of the compound represented by Formula (1) and the compound represented by Formula (3), and a substrate is coated with the chemical liquid and then with a resist composition so as to obtain a predetermined thickness, the thickness of the formed resist film tends to be significantly uneven (desired film thickness controllability is not obtained).

The mixture of organic solvents contained in the chemical liquid that is formed of the compound represented by Formula (1) and the compound represented by Formula (3) means a mixture formed of two kinds of organic solvents one of which is the compound represented by Formula (1) and the other is the compound represented by Formula (3).

That is, a combination of propylene glycol monomethyl ether acetate and ethyl lactate and a combination of propylene glycol monomethyl ether acetate and 2-hydroxymethyl isobutyrate are included in the aforementioned mixture. In contrast, a mixture of propylene glycol monomethyl ether acetate, ethyl lactate, and 2-hydroxymethyl isobutyrate is not included in the aforementioned mixture because this mixture is formed of three kinds of organic solvents.

Accordingly, the present invention does not include a chemical liquid containing a mixture formed of a lactone compound and the compound represented by Formula (5), a chemical liquid containing a mixture formed of the cyclic ketone compound with 6 or more members that may have a substituent and the compound represented by Formula (1), and a chemical liquid containing a mixture formed of a lactone compound, the compound represented by Formula (1), and the compound represented by Formula (5), and the chemical liquid containing a mixture formed of the compound represented by Formula (1) and the compound represented by Formula (3).

In view of obtaining a chemical liquid having further improved effects of the present invention, it is preferable that the chemical liquid according to the above embodiment contains a mixture of two or more kinds of the organic solvents described above.

In this case, particularly, advantages such as the improvement of robustness of treatment conditions relating to resist saving properties and defect inhibition performance can be obtained. Furthermore, the effects of the present invention can be exerted on various types of resist solutions.

In the present specification, in a case where a chemical liquid is described as "containing a mixture of organic solvents described above", the chemical liquid is regarded as including an aspect in which the chemical liquid contains a byproduct, an isomer, an impurity, and the like that are unintentionally incorporated into the organic solvents.

The chemical liquid containing a mixture formed of MMP and PGMEA has further improved effects of the present invention. Particularly, in a case where the content of MMP in the mixture with respect to the total mass of the mixture is greater than 5% by mass, the chemical liquid has particularly improved resist saving properties. The upper limit of the content of MMP in the mixture is not particularly limited, but is preferably equal to or smaller than 99% by mass in general. It is preferable that the chemical liquid substantially does not contain moisture.

The chemical liquid containing a mixture formed of MMP and PGME has further improved effects of the present invention. Particularly, in a case where the content of MMP in the mixture with respect to the total mass of the mixture is greater than 30% by mass, the chemical liquid has particularly improved resist saving properties. The upper limit of the content of MMP in the mixture is not particularly limited, but is preferably equal to or smaller than 99% by mass in general. It is preferable that the chemical liquid substantially does not contain moisture.

[Other Aspects of Chemical Liquid]

The chemical liquid according to a second embodiment of the present invention is a chemical liquid containing a mixture of two or more kinds of organic solvents. The mixture contains at least one kind of combination among the combinations 1 to 10 of organic solvents described below.

[Mixture of Two or More Kinds of Organic Solvents]

The chemical liquid contains a mixture of two or more kinds of organic solvents.

The content of the mixture in the chemical liquid is not particularly limited, but is preferably 99.9% to 100% by mass in general with respect to the mass of the chemical liquid.

Combination 1

γ-Butyrolactone (GBL) and at least one kind of organic solvent selected from the group consisting of cyclopentanone (CyPn), butyl acetate (nBA), ethyl lactate (EL), 2-hydroxymethyl isobutyrate (HBM), cyclopentanone dimethyl acetal (DBCPN), anisole, phenetole, ethylene glycol monomethyl ether acetate (EGMEA), 3-methoxymethyl propionate (MMP), and 3-ethoxyethyl propionate (EEP)

Combination 2

Dimethyl sulfoxide (DMSO) and at least one kind of organic solvent selected from the group consisting of propylene glycol monomethyl ether (PGME), CyPn, nBA, propylene glycol monomethyl ether acetate (PGMEA), cyclohexanone (CyHx), EL, HBM, DBCPN, anisole, phenetole, EGMEA, MMP, and EEP Combination 3

Ethylene carbonate (EC) and at least one kind of organic solvent selected from the group consisting of PGME, CyPn, nBA, PGMEA, CyHx, EL, HBM, DBCPN, anisole, phenetole, EGMEA, MMP, and EEP Combination 4

Propylene carbonate (PC) and at least one kind of organic solvent selected from the group consisting of PGME, CyPn, nBA, PGMEA, CyHx, EL, HBM, DBCPN, anisole, phenetole, EGMEA, MMP, and EEP Combination 5

1-Methyl-2-pyrrolidone (NMP) and at least one kind of organic solvent selected from the group consisting of PGME, CyPn, nBA, PGMEA, CyHx, EL, HBM, DBCPN, anisole, phenetole, EGMEA, MMP, and EEP Combination 6

PGMEA and at least one kind of organic solvent selected from the group consisting of CyPn, nBA, DBCPN, anisole, phenetole, EGMEA, MMP, and EEP Combination 7

CyHx and at least one kind of organic solvent selected from the group consisting of PGME, CyPn, nBA, EL, HBM, DBCPN, anisole, phenetole, EGMEA, MMP, and EEP Combination 8

EL and at least one kind of organic solvent selected from the group consisting of PGME, CyPn, nBA, DBCPN, anisole, phenetole, EGMEA, MMP, and EEP Combination 9

HBM and at least one kind of organic solvent selected from the group consisting of PGME, CyPn, nBA, DBCPN, anisole, phenetole, EGMEA, MMP, and EEP Combination 10

DBCPN and at least one kind of organic solvent selected from the group consisting of PGME, CyPn, nBA, anisole, phenetole, EGMEA, MMP, and EEP The content of each of the organic solvents in the mixture is not particularly limited, but is preferably 3% to 97% by mass in general and more preferably 5% to 95% by mass.

In view of obtaining a chemical liquid having further improved effects of the present invention, it is preferable that the chemical liquid according to the above embodiment contains a mixture of two or more kinds of organic solvents described above.

In this case, particularly, advantages such as the improvement of robustness of treatment conditions relating to resist saving properties and defect inhibition performance can be obtained. Furthermore, the effects of the present invention can be exerted on various types of resist solutions.

[Physical Properties of Chemical Liquid or Mixture]

Next, preferable aspects of the physical properties common to the chemical liquid or the mixture according to the embodiment of the present invention will be described. In view of making the chemical liquid have further improved effects of the present invention, the vapor pressure and the surface tension of the mixture and Hansen solubility parameters of the organic solvents are preferably within a predetermined range. Hereinafter, each of the physical properties will be described.

[Vapor Pressure of Mixture]

The vapor pressure at 25° C. of the mixture of two or more kinds of organic solvents contained in the chemical liquid is not particularly limited, but is preferably 150 to 1,200 Pa, more preferably 159 to 1,200 Pa, even more preferably 160 to 1,000 Pa, and particularly preferably 173 to 1,000 Pa. In a case where the vapor pressure of the mixture is 160 to 1,000 Pa, the chemical liquid has further improved defect inhibition performance and resist saving properties.

In the present specification, the vapor pressure of the mixture means a vapor pressure calculated by the following method.

First, by using the chemical liquid as a sample, the type and content of each of the organic solvents contained in the chemical liquid are measured using gas chromatography mass spectrometry. In the present specification, an organic solvent means an organic compound whose content in the chemical liquid is greater than 10,000 mass ppm with respect to the total mass of the chemical liquid.

The measurement conditions for the gas chromatography mass spectrometry are as described in Examples.

The mixture is constituted with the organic solvents detected by the aforementioned method. Based on the vapor pressure at 25° C. of each of the organic solvents contained in the mixture and the molar fraction of each of the organic solvents in the mixture, the vapor pressure of the mixture is calculated by the following equation. In the present specification, a sign "Σ" means sum.

Equation: (Vapor pressure of mixture)=Σ((vapor pressure of each of organic solvents at 25° C.)×(molar fraction of each of organic solvents))

In view of making the chemical liquid have further improved effects of the present invention, it is preferable that the mixture contained in the chemical liquid contains a first organic solvent having a vapor pressure of 160 to 1,000 Pa at 25° C. and a second organic solvent having a vapor pressure higher than 1,000 Pa at 25° C. or contains two or more kinds of first organic solvents.

First Organic Solvent

The first organic solvent is an organic solvent having a vapor pressure of 160 to 1,000 Pa at 25° C. Examples of the first organic solvent include PGMEA (493), CyHx (507), EL (187), HBM (267), DBCPN (400), anisole (427), phenetole (211), EGMEA (280), MMP (507), EEP (160), and the like. The numbers in the bracket represent the vapor pressure at 25° C. (unit: Pa).

The content of the first organic solvent in the mixture is not particularly limited. However, generally, the content of the first organic solvent with respect to the total mass of the mixture is preferably 3% to 100% by mass, more preferably 5% to 97% by mass, and even more preferably 10% to 95% by mass. In a case where the mixture contains the second organic solvent, the content of the first organic solvent is preferably 30% to 80% by mass. One kind of the first organic solvent may be used singly, or two or more kinds of the first organic solvents may be used in combination. In a case where two or more kinds of the first organic solvents are used in combination, the total content of the first organic solvents is preferably within the above range.

Second Organic Solvent

The second organic solvent is an organic solvent having a vapor pressure higher than 1,000 Pa at 25° C. Examples of the second organic solvent include nBA (1,200), PGME (1,453), CyPn (1,520), and the like. In view of obtaining a chemical liquid having further improved effects of the present invention, CyPn is preferable. The numbers in the bracket represent the vapor pressure at 25° C. (unit: Pa).

The content of the second organic solvent in the mixture is not particularly limited. However, generally, the content of the second organic solvent with respect to the total mass of the mixture is preferably 20% to 60% by mass. One kind of the second organic solvent may be used singly, or two or more kinds of the second organic solvents may be used in combination. In a case where two or more kinds of the second organic solvents are used in combination, the total content of the second organic solvents is preferably within the above range.

In view of making the chemical liquid have further improved effects of the present invention, it is preferable that the mixture contained in the chemical liquid contains a third organic solvent having a vapor pressure lower than 160 Pa at 25° C.

Particularly, in view of obtaining a chemical liquid having further improved effects of the present invention, the mixture contained in the chemical liquid preferably contains at least one kind of the third organic solvent and at least one kind of the first organic solvent or contains at least one kind of the third organic solvent and at least one kind of the second organic solvent, more preferably contains at least one kind of the third organic solvent and at least one kind of the first organic solvent, even more preferably contains at least one kind of the third organic solvent and at least one kind of the first organic solvent, and particularly preferably contains at least one kind of the third organic solvent and at least one kind of the first organic solvent.

Third Organic Solvent

The third organic solvent means an organic solvent having a vapor pressure lower than 160 Pa at 25° C.

Examples of such an organic solvent include GBL (147), DMSO (13), PC (53), EC (67), NMP (40), and the like, but the third organic solvent is not limited to these. The numbers in the bracket represent the vapor pressure (Pa) at 25° C.

The content of the third organic solvent in the mixture is not particularly limited. However, generally, the content of the third organic solvent with respect to the total mass of the mixture is preferably equal to or smaller than 50% by mass, more preferably less than 35% by mass, even more preferably less than 10% by mass, and particularly preferably equal to or smaller than 5% by mass. The lower limit of the content of the third organic solvent is not particularly limited, but is preferably equal to or greater than 0.01% by mass in general.

One kind of the third organic solvent may be used singly, or two or more kinds of the third organic solvents may be used in combination. In a case where two or more kinds of the third organic solvents are used in combination, the total content thereof is preferably within the above range.

[Surface Tension of Mixture]

The surface tension at 25° C. of the mixture of two or more kinds of organic solvents contained in the chemical liquid is preferably equal to or higher than 28 mN/m, more preferably higher than 29 mN/m, and even more preferably equal to or higher than 30 mN/m. The upper limit of the surface tension is not particularly limited, but is preferably equal to or lower than 45 mN/m in general, more preferably equal to or lower than 42 mN/m, and even more preferably equal to or lower than 40 mN/m.

In a case where the surface tension of the mixture is equal to or higher than 28 mN/m, the chemical liquid has further improved defect inhibition performance (particularly, BRIDGE defect inhibition performance). In a case where the surface tension of the mixture is higher than 29 mN/m, the chemical liquid has further improved effects of the present invention.

In the present specification, the surface tension means a surface tension calculated by the following method.

First, by using the chemical liquid as a sample, the type and content of each of the organic solvents contained in the chemical liquid are measured using gas chromatography mass spectrometry.

The measurement conditions for the gas chromatography mass spectrometry are as described in Examples.

The mixture is constituted with the organic solvents detected by the aforementioned method. Based on the surface tension at 25° C. of each of the organic solvents contained in the mixture and a molar fraction of each of the organic solvents in the mixture, the surface tension of the mixture is calculated by the following equation.

Equation: (Surface tension of mixture)=Σ((surface tension of each of organic solvents at 25° C.)×(molar fraction of each of organic solvents))

[Hansen Solubility Parameter of Organic Solvent]

In view of making the chemical liquid have further improved effects of the present invention, it is preferable that the mixture contains a specific organic solvent having a Hansen solubility parameter higher than 9.5 $(MPa)^{0.5}$ in terms of a hydrogen bond element (hereinafter, referred to as "δh" as well in the present specification) or having a Hansen solubility parameter higher than 15.5 $(MPa)^{0.5}$ in terms of a dispersion element (hereinafter, referred to as "δd" as well in the present specification).

In the present specification, Hansen solubility parameters mean those described in "Hansen Solubility Parameters: A Users Handbook" (Second Edition, pp. 1-310, CRC Press, 2007), and the like. That is, Hansen solubility parameters describe solubility by using multi-dimensional vectors (a dispersion element (δd), a dipole-dipole force element (δp), and a hydrogen bond element (δh)). These three parameters can be considered as coordinates of points in a three-dimensional space called Hansen space.

δh of the specific organic solvent is preferably higher than 9.5 $(MPa)^{0.5}$, and more preferably higher than 11 $(MPa)^{0.5}$. The upper limit of δh is not particularly limited, but is preferably equal to or lower than 15 $(MPa)^{0.5}$ in general.

δd of the specific organic solvent is preferably higher than 15.5 $(MPa)^{0.5}$, and more preferably equal to or higher than 17 $(MPa)^{0.5}$. The upper limit of δd is not particularly limited, but is preferably equal to or lower than 20 $(MPa)^{0.5}$.

Examples of the specific solvent include DBCPN (4.2, 16.6), HBM (12.2, 16.5), EL (12.5, 16.0), CyHx (5.1, 17.8), PGMEA (9.8, 15.6), CyPN (4.8, 17.8), GBL (7.0, 17.4), DMSO (10.2, 18.4), PC (6.5, 17.3), EC (8.0, 18.1), NMP (7.2, 18.0), and the like. The numbers in the bracket represent Hansen solubility parameters (δh and δd), and the unit thereof is $(MPa)^{0.5}$.

Examples of the combination of the organic solvents contained in the mixture include the following combinations, but the present invention is not limited thereto. The numbers in the bracket represent the content (% by mass) of each of the organic solvents with respect to the total mass of the mixture.

Examples of the combination include GBL(5)/DBCPN (95), GBL(5)/HBM(95), GBL(5)/EL(95), GBL(50)/CyPn (50), GBL(50)/nBA(50), DMSO(5)/HBM(95), DMSO(5)/ EL(95), DMSO(30)/CyHx(70), DMSO(30)/PGMEA(70), DMSO(40)/nBA(60), DMSO(50)/PGME(50), DMSO(50)/ CyPn(50), PC(5)/CyHx(95), PC(5)/HBM(95), PC(5)/EL (95), PC(20)/PGMEA(80), PC(20)/DBCPN(80), PC(50)/ PGME(50), PC(50)/CyPn(50), EC(5)/HBM(95), EC(5)/EL (95), EC(20)/CyHx(80), EC(20)/PGMEA(80), EC(50)/ PGME(50), EC(50)/CyPn(50), NMP(5)/HBM(95), NMP (5)/EL(95), NMP(20)/CyHx(80), NMP(20)/PGMEA(80), NMP(20)/DBCPN(80), NMP(50)/PGME(50), NMP(50)/ CyPn(50), PGMEA(80)/CyPn(20), CyHx(80)/CyPn(20), CyHx(80)/EL(20), CyHx(80)/HBM(20), CyHx(80)/ DBCPN(20), EL(70)/PGME(30), EL(70)/CyPn(30), EL(20)/DBCPN(80), EL(40)/HBM(60), HBM(80)/PGME (20), HBM(80)/CyPn(20), HBM(80)/DBCPN(20), DBCPN (80)/PGME(20), DBCPN(80)/CyPn(20), PGMEA(80)/ CyPn(20), PGMEA(70)/EL(10)/CyPn(30), CyHx(80)/

PGMEA(60)/CyPn(20), DBCPN(80)/EL(30)/CyPn(20), DMSO(10)/HBM(35)/PGMEA(55), DMSO(5)/EL(45)/CyPn(50), DMSO(5)/HBM(25)/CyHx(70), DMSO(5)/HBM(25)/DBCPN(70), GBL(5)/HBM(35)/PGMEA(60), GBL(10)/HBM(35)/PGMEA(55), GBL(20)/HBM(35)/PGMEA(45), GBL(25)/HBM(35)/PGMEA(40), GBL(30)/HBM(35)/PGMEA(35), GBL(10)/EL(30)/CyPn(60), GBL(10)/HBM(25)/CyHx(65), GBL(10)/HBM(25)/DBCPN(65), EC(10)/HBM(45)/PGMEA(45), EC(10)/EL(30)/CyPn(60), EC(10)/HBM(25)/CyHx(65), EC(10)/HBM(25)/DBCPN(65), MMP(95)/DMSO(5), MMP(97)/DMSO(3), MMP(95)/PC(5), MMP(97)/PC(3), EGMEA(50)/PGMEA(50), EGMEA(50)/EL(50), EGMEA(80)/DBCPN(20), EGMEA(80)/PGME(20), EGMEA(90)/GBL(10), EGMEA(90)/DMSO(10), EGMEA(90)/PC(10), MMP(50)/PGMEA(50), MMP(50)/EL(50), MMP(80)/DBCPN(20), MMP(80)/PGME(20), MMP(90)/GBL(10), MMP(90)/DMSO(10), MMP(90)/PC(10), EEP(30)/EL(70), and the like.

[Use of Chemical Liquid]

The chemical liquid according to the above embodiment is preferably used for manufacturing semiconductors. Specifically, in a semiconductor device manufacturing process including a lithography step, an etching step, an ion implantation step, a peeling step, and the like, the chemical liquid is used for treating an organic substance after each step is finished or before the next step is started. Specifically, the chemical liquid is suitably used as a prewet solution, a developer, a rinsing solution, a peeling solution, and the like.

Furthermore, the chemical liquid can also be used as a diluent of a resin contained in a resist solution (which will be described later). In addition, the chemical liquid may be diluted with another organic solvent and/or water, and the like.

The chemical liquid can also be suitably used for other uses in addition to the manufacturing of semiconductors. The chemical liquid can be used as a developer or a rinsing solution of polyimide, a resist for a sensor, a resist for a lens, and the like.

In addition, the chemical liquid can also be used as a solvent for medical uses or for washing. Particularly, the chemical liquid can be suitably used for washing containers, piping, substrates (for example, a wafer and glass), and the like.

Particularly, the chemical liquid according to the above embodiment is more preferably used for pre-wetting. That is, it is preferable that the chemical liquid according to the above embodiment is used as a prewet solution.

The chemical liquid can be used for pre-wetting and for rinsing the edge of a wafer before or after resist coating.

Furthermore, in a case where a substrate (wafer) is coated with a Bottom of AntiReflection Coating (BARC) composition before being coated with an actinic ray-sensitive or radiation-sensitive resin composition, it is also possible to remove the BARC composition, with which the edge portion of the wafer is unintentionally coated, by using the chemical liquid.

[Manufacturing Method of Chemical Liquid]

As the manufacturing method of the chemical liquid, known manufacturing methods can be used without particular limitation. Examples of the manufacturing method of the chemical liquid include a manufacturing method including a step of preparing organic solvents and a step of mixing together the organic solvents so as to obtain a mixture. The manufacturing method may additionally include a step of purifying the organic solvents and/or the mixture by using a filter or the like. Furthermore, the manufacturing method may additionally include an electricity removing step of removing the electricity from the organic solvents and/or the mixture so as to reduce the charge potential thereof.

As the organic solvents used for manufacturing the chemical liquid, it is preferable to prepare organic solvents in which the content of an impurity is small. Examples of commercial products of such organic solvents include those called "high-purity grade products".

Examples of the method for purifying the organic solvents and/or the mixture include methods such as distillation, filtration, and the like. As a distillation device and a filtration device, known devices can be used.

<Container>

The chemical liquid may be temporarily stored in a container until the chemical liquid is used. As the container for storing the chemical liquid, known containers can be used without particular limitation.

As the container storing the chemical liquid, a container for manufacturing semiconductors is preferable which has a high internal cleanliness and hardly causes elution of impurities.

Examples of the usable container specifically include a "CLEAN BOTTLE" series manufactured by AICELLO CORPORATION, "PURE BOTTLE" manufactured by KODAMA PLASTICS Co., Ltd., and the like, but the container is not limited to these.

As the container, for the purpose of preventing mixing of impurities into the chemical liquid (contamination), it is preferable to use a container in which the inner wall of the container has a 6-layer structure formed of 6 kinds of resins or has a 7-layer structure formed of 6 kinds of resins. Examples of these containers include the containers described in JP2015-123351A.

It is preferable in the container, the device used for manufacturing the chemical liquid, and the member (filter or the like) used for manufacturing the chemical liquid, the portions (the inner wall of the container, the inner wall of the device, the interior of the member, and the like; hereinafter, referred to as "liquid contact portion" as well) that contact the chemical liquid are washed before the container, the device, and the member are used. As a liquid used for washing, a washing solution containing few impurities is preferable. As the washing solution, for example, "high-purity grade products" described above, solutions obtained by purifying the high-purity grade products, the chemical liquid, a solution obtained by diluting the chemical liquid, and the like are preferable. At the time of washing the liquid contact portion of the device used for manufacturing the chemical liquid by using a washing solution, it is preferable that the liquid contact portion is washed until the amount of impurities contained in the washing solution becomes equal to or smaller than a predetermined amount (preset value). After being manufactured, the chemical liquid may be bottled using a container such as a gallon bottle or a quart bottle, transported, and stored. The gallon bottle may be formed of a glass material or other materials.

In order to prevent the change of the components in the solution during storage, purging may be performed in the interior of the container by using an inert gas (nitrogen, argon, or the like) having a purity equal to or higher than 99.99995% by volume. Particularly, a gas with small moisture content is preferable. The temperature at the time of transport and storage may be room temperature. However, in order to prevent alteration, the temperature may be controlled within a range of −20° C. to 30° C.

(Clean Room)

It is preferable that all of the manufacturing of the chemical liquid, the opening and/or washing of the container, the handling including storage of the solution, the treatment and analysis, and the measurement are performed in a clean room. It is preferable that the clean room meets the 14644-1 clean room standard. The clean room preferably meets any of International Organization for Standardization (ISO) class 1, ISO class 2, ISO class 3, or ISO class 4, more preferably meets ISO class 1 or ISO class 2, and even more preferably meets ISO class 1.

[Pattern Forming Method]

It is preferable that the chemical liquid is used for forming a resist pattern (hereinafter, simply referred to as "pattern") used for manufacturing semiconductors. The pattern forming method in which the chemical liquid is used is not particularly limited, and examples thereof include known pattern forming methods.

Particularly, it is preferable that the pattern forming method includes the following steps.

(A) Pre-wetting step of coating substrate with chemical liquid so as to obtained pre-wetted substrate (B) Resist film forming step of forming resist film on pre-wetted substrate by using actinic ray-sensitive or radiation-sensitive resin composition (C) Exposure step of exposing resist film (D) Development step of developing exposed resist film by using developer Hereinafter, the aspect of each of the steps will be described.

[(A) Pre-Wetting Step]

The pre-wetting step is a step of coating a substrate with the chemical liquid.

As the substrate, know substrates used for manufacturing semiconductors can be used without particular limitation. Examples of the substrate include an inorganic substrate such as silicon, $SiO_2$, or SiN, a coating-type inorganic substrate such as Spin On Glass (SOG), and the like, but the substrate is not limited to these.

Furthermore, the substrate may be a substrate with an antireflection film comprising an antireflection film. As the antireflection film, known organic or inorganic antireflection films can be used without particular limitation.

As the method for coating the substrate with the chemical liquid, known coating methods can be used without particular limitation. Particularly, as the coating method, spin coating is preferable because this method makes it possible to form a uniform resist film by using smaller amounts of the actinic ray-sensitive or radiation-sensitive resin composition in the resist film forming step which will be described later.

As the method for coating the substrate with the chemical liquid, known coating methods can be used without particular limitation. Particularly, as the coating method, spin coating is preferable because this method makes it possible to form a uniform resist film by using smaller amounts of the actinic ray-sensitive or radiation-sensitive resin composition in the resist film forming step which will be described later.

The thickness of a chemical liquid layer formed on the substrate by using the chemical liquid is not particularly limited. Generally, the thickness of the chemical liquid layer is preferably 0.001 to 10 μm, and more preferably 0.005 to 5 μm.

Provided that a resist solution, with which the substrate is to be coated, is a resist for ArF immersion exposure, and that the surface tension of the resist solution is 28.8 mN/m, although the surface tension of the mixture in the chemical liquid is not particularly limited, it is preferable to supply the chemical liquid to the wafer as a prewet solution by making the surface tension of the chemical liquid become higher than the surface tension of the resist solution.

Generally, the chemical liquid is supplied to the wafer by a method of moving a prewet nozzle to a position above the central portion of the wafer. Then, by opening or closing a valve, the chemical liquid is supplied to the wafer.

In a state where the wafer stands still, a predetermined amount of the chemical liquid is supplied to the central portion of the wafer from the prewet nozzle. Then, the wafer is rotated at a first speed V1 which is, for example, about 500 rotation per minute (rpm) such that the chemical liquid on the wafer spreads over the entire surface of the wafer. As a result, the entire surface of the wafer is wet with the chemical liquid.

The upper limit of the first speed V1 is not particularly limited, but is preferably equal to or lower than 3,000 rpm.

Thereafter, the valve of a line connected to a resist solution is opened. As a result, the resist solution starts to be jetted from a resist nozzle, and the resist solution starts to be supplied to the central portion of the wafer. In this way, (B) resist film forming step (which will be described later) is started.

In the resist film forming step, from the first speed V1, the rotation speed of the wafer is increased to a high speed which is a second speed V2 of about 2,000 to 4,000 rpm for example. The wafer rotating at the first speed V1 before the start of the resist film forming step is then gradually accelerated such that the speed continuously and smoothly changes. At this time, the acceleration of the rotation of the wafer is gradually increased from zero, for example. At the time when the resist film forming step ends, the acceleration of the rotation of the wafer is reduced such that the rotation speed of the wafer W smoothly reaches the second speed V2. In this way, during the resist film forming step, the rotation speed of the wafer changes such that the transition from the first speed V1 to the second speed V2 is represented by an S-shaped curve. In the resist film forming step, due to the centrifugal force, the resist solution supplied to the central portion of the wafer spreads over the entire surface of the wafer, whereby the surface of the wafer is coated with the resist solution.

The technique for saving resist by changing the rotation speed of a wafer at the time of resist coating is specifically described in JP2009-279476A.

The interval between a point in time when (A) pre-wetting step has finished and a point in time when resist solution coating in (B) resist film forming step is started is not particularly limited, but is preferably equal to or shorter than 7 seconds in general.

The chemical liquid may be recycled. That is, the chemical liquid used in the pre-wetting step can be recovered and reused in the pre-wetting step for other wafers.

In a case where the chemical liquid is recycled, it is preferable to adjust the content of the impurity metal, the organic impurity, water, and the like contained in the recovered chemical liquid. The adjustment method is as described above regarding the manufacturing method of the chemical liquid.

<Affinity Between Chemical Liquid and Resin>

Regarding the affinity between the chemical liquid used in the pre-wetting step and the actinic ray-sensitive or radiation-sensitive resin composition which will be described later, there is no particular limitation. However, in view of making it possible to form a more uniform resist film by using smaller amounts of the actinic ray-sensitive or radiation-sensitive resin composition, it is preferable that the chemical liquid and the resin contained in the actinic ray-sensitive or radiation-sensitive resin composition satisfy the following relationship (in a case where the actinic ray-sensitive or radiation-sensitive resin composition contains two or more kinds of resins, "mixture" of the resins is regarded as the resin; the content mass ratio of each of the resins in the mixture is the same as the content mass ratio of each of the resins in the actinic ray-sensitive or radiation-sensitive resin composition with respect to the total mass of the resins; the above resins do not include a hydrophobic resin which will be described later).

The chemical liquid and the resin preferably satisfy the following condition 1 and condition 2 at 25° C. In a case where the chemical liquid satisfies the following condition 1 and condition 2 at 25° C., it is possible to form a more uniform resist film by using smaller amounts of the actinic ray-sensitive or radiation-sensitive resin composition.
(Condition 1)

Rsq1 calculated by Equation 1 based on a proton spin-spin relaxation time measured for a chemical liquid and a first test solution formed of a resin and the chemical liquid by using a pulsed nuclear magnetic resonance-type particle interface characteristic evaluator is higher than 0.5.

$$Rsq1=(\tau 0/\tau 1)-1 \qquad \text{(Equation 1)}$$

In Equation 1, $\tau 0$ represents a spin-spin relaxation time of the chemical liquid, and $\tau 1$ represents a spin-spin relaxation time of the first test solution. The resin contained in the first test solution is regarded as being dissolved in the chemical liquid.

Details of Condition 1 will be described.

First, the pulsed nuclear magnetic resonance-type particle interface characteristic evaluator is an evaluator adopting a method of observing the state of spin (magnetism) of a target. Examples of the pulsed nuclear magnetic resonance-type particle interface characteristic evaluator include "Acorn Area" manufactured by Xigo Nanotools, and the like.

The aforementioned evaluator measures a time (spin-spin relaxation time) taken for a measurement target to return to the normal state immediately after the application of energy thereto (excitation state). In the test solution (first test solution) in which the resin is dissolved in the chemical liquid, the spin-spin relaxation time changes by being affected by the type of organic solvent in the chemical liquid contacting the resin and the like.

It is unclear why the above change occurs. Presumably, this is because the amount of molecules of the organic solvent contacting the resin affects the spin-spin relaxation time.

It is considered that the amount of molecules of the organic solvent contacting the resin may change by being affected by the surface area of the resin, the wettability between the organic solvent and the resin, and the like. That is, presumably, the amount of the organic solvent molecules may reflect the strength of the interaction between the resin and the chemical liquid.

Rsq1 calculated by Equation 1 based on a proton spin-spin relaxation time is a parameter showing the compatibility between a resin and a chemical liquid.

$$Rsq1=(\tau 0/\tau 1)-1 \qquad \text{(Equation 1)}$$

It is preferable that Rsq1 is higher than 0.5. In a case where Rsq1 is higher than 0.5, the chemical liquid and the resin exhibit higher compatibility. The upper limit of Rsq1 is not particularly limited, but is preferably equal to or lower than 10.0 in general.
(Condition 2)

SRsq calculated by Equation 2 based on a proton spin-spin relaxation time measured for a second test solution, which is formed of the resin and the chemical liquid and in which the content of the resin is different from the content of the resin in the first test solution, and the first test solution by using a pulsed nuclear magnetic resonance-type particle interface characteristic evaluator is higher than −1.

$$SRsq=(Rsq2-Rsq1)/(c2-c1) \qquad \text{(Equation 2)}$$

In Equation 2, Rsq1 represents a value calculated by Equation 1, and Rsq2 represents a value calculated by Equation 3. c1 and c2 represent the mass-based content of the resin in the first test solution and the second test solution respectively. The unit of the mass-based content is % by mass, and c2>c1. The resin contained in the first test solution and the second test solution is regarded as being dissolved in the chemical liquid.

$$Rsq2=(\tau 0/\tau 2)-1 \qquad \text{(Equation 3)}$$

In Equation 3, $\tau 0$ has the same definition as $\tau 0$ in Equation 1, and $\tau 2$ represents a spin-spin relaxation time of the second test solution.

Details of Condition 2 will be described.

In Equation 2, c1 and c2 represent the content of the resin (% by mass) in the first test solution and the second test solution respectively. As long as the resin is thoroughly dissolved in the first test solution and the second test solution, c1 and c2 are not particularly limited. For example, c1 may be 0.5% by mass, and c2 may be 3.0% by mass or the like.

SRsq represents a rate of change of Rsq in a predetermined concentration range (c2−c1). SRsq is preferably higher than −1, and more preferably equal to or higher than −0.8. The upper limit of SRsq is not particularly limited, but is preferably equal to or lower than 10 in general. In a case where SRsq is higher than −1, the resin tends to remain more homogeneously dispersed in the chemical liquid, and it becomes more difficult for the resin to be aggregated.

[(B) Resist Film Forming Step]

The resist film forming step is a step of forming a resist film on the pre-wetted substrate (substrate comprising a chemical liquid layer) by using an actinic ray-sensitive or radiation-sensitive resin composition. Hereinafter, first, aspects of the actinic ray-sensitive or radiation-sensitive resin composition will be described.

<Actinic Ray-Sensitive or Radiation-Sensitive Resin Composition>

As the actinic ray-sensitive or radiation-sensitive resin composition which can be used in the resist film forming step, known actinic ray-sensitive or radiation-sensitive resin compositions can be used without particular limitation.

It is preferable that the actinic ray-sensitive or radiation-sensitive resin composition (hereinafter, referred to as "resist composition" as well) contains a resin (hereinafter, referred to as "acid-decomposable resin" as well in the present specification), which contains a repeating unit containing a group generating a polar group (a carboxyl group, a phenolic hydroxyl group, or the like) by being decomposed by the action of an acid, and a compound (hereinafter, referred to as "photoacid generator" as well in the present specification) which generates an acid by the irradiation of actinic rays or radiation.

Particularly, in view of obtaining further improved effects of the present invention, the following resist compositions are preferable.

Resist composition containing resin represented by Formula (I) which will be described later Resist composition containing acid-decomposable resin having phenolic hydroxyl group which will be described later Resist composition containing hydrophobic resin, which will be described later, and acid-decomposable resin Hereinafter, each of the components of the resist compositions will be described.

(Acid-Decomposable Resin)

In an acid-decomposable group, a polar group is protected with a group dissociated by an acid (acid-dissociable group). Examples of the acid-dissociable group include —C($R_{36}$)($R_{37}$)($R_{38}$), —C($R_{36}$)($R_{37}$)(O$R_{39}$), —C($R_{01}$)($R_{02}$)(O$R_{39}$), and the like.

In the formulae, $R_{36}$ to $R_{39}$ each independently represent an alkyl group, a cycloalkyl group, an aryl group, an aralkyl group, or an alkenyl group. $R_{36}$ and $R_{37}$ may form a ring by being bonded to each other.

$R_{10}$ and $R_{02}$ each independently represent a hydrogen atom, an alkyl group, a cycloalkyl group, an aryl group, an aralkyl group, or an alkenyl group.

Examples of the acid-decomposable resin include a resin P having an acid-decomposable group represented by Formula (AI).

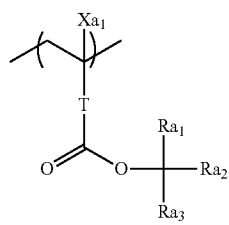

(AI)

In Formula (AI), $Xa_1$ represents a hydrogen atom or an alkyl group which may have a substituent.

T represents a single bond or a divalent linking group.

$Ra_1$ to $Ra_3$ each independently represent an alkyl group (linear or branched) or a cycloalkyl group (monocyclic or polycyclic).

Two out of $R_1$ to $Ra_3$ may form a cycloalkyl group (monocyclic or polycyclic) by being bonded to each other.

Examples of the alkyl group represented by $Xa_1$ which may have a substituent include a methyl group and a group represented by —$CH_2$—$R_{11}$. $R_{11}$ represents a halogen atom (a fluorine atom or the like), a hydroxyl group, or a monovalent organic group.

$Xa_1$ is preferably a hydrogen atom, a methyl group, a trifluoromethyl group, or a hydroxymethyl group.

Examples of the divalent linking group represented by T include an alkylene group, a —COO-Rt- group, a —O-Rt- group, and the like. In the formula, Rt represents an alkylene group or a cycloalkylene group.

T is preferably a single bond or a —COO-Rt- group. Rt is preferably an alkylene group having 1 to 5 carbon atoms, and more preferably a —$CH_2$— group, a —($CH_2$)$_2$— group, or a —($CH_2$)$_3$— group.

The alkyl group represented by $R_1$ to $Ra_3$ preferably has 1 to 4 carbon atoms.

The cycloalkyl group represented by $R_1$ to $Ra_3$ is preferably a monocyclic cycloalkyl group such as a cyclopentyl group or a cyclohexyl group or a polycyclic cycloalkyl group such as a norbornyl group, a tetracyclodecanyl group, a tetracyclododecanyl group, or an adamantyl group.

The cycloalkyl group formed by bonding of two groups out of $Ra_1$ to $Ra_3$ is preferably a monocyclic cycloalkyl group such as a cyclopentyl group or a cyclohexyl group or a polycyclic cycloalkyl group such as a norbornyl group, a tetracyclodecanyl group, a tetracyclododecanyl group, or an adamantyl group, and more preferably a monocyclic cycloalkyl group having 5 or 6 carbon atoms.

In the cycloalkyl group formed by bonding of two groups out of $Ra_1$ to $Ra_3$, for example, one methylene group constituting the ring may be substituted with a heteroatom such as an oxygen atom or a group having a heteroatom such as a carbonyl group.

As the repeating unit represented by Formula (AI), for example, an aspect is preferable in which $Ra_1$ is a methyl group or an ethyl group, and $Ra_2$ and $Ra_3$ form the aforementioned cycloalkyl group by being bonded to each other.

Each of the above groups may have a substituent. Examples of the substituent include an alkyl group (having 1 to 4 carbon atoms), a halogen atom, a hydroxyl group, an alkoxy group (having 1 to 4 carbon atoms), a carboxy group, an alkoxycarbonyl group (having 2 to 6 carbon atoms), and the like. The number of carbon atoms in the substituent is preferably equal to or smaller than 8.

The total content of the repeating unit represented by Formula (AI) with respect to all the repeating units in the resin P is preferably 20 to 90 mol %, more preferably 25 to 85 mol %, and even more preferably 30 to 80 mol %.

Specific examples of the repeating unit represented by Formula (AI) will be shown below, but the present invention is not limited thereto.

In the specific examples, Rx and $Xa_1$ each independently represent a hydrogen atom, $CH_3$, $CF_3$, or $CH_2OH$. Rxa and Rxb each represent an alkyl group having 1 to 4 carbon atoms. Z represents a substituent containing a polar group. In a case where there is a plurality of Z's, Z's are independent from each other. p represents 0 or a positive integer. Examples of the substituent represented by Z containing a polar group include a hydroxyl group, a cyano group, an amino group, an alkyl amide group, a sulfonamide group, and a linear or branched alkyl group or cycloalkyl group having these groups.

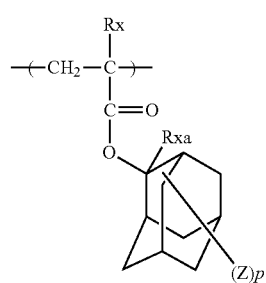

1

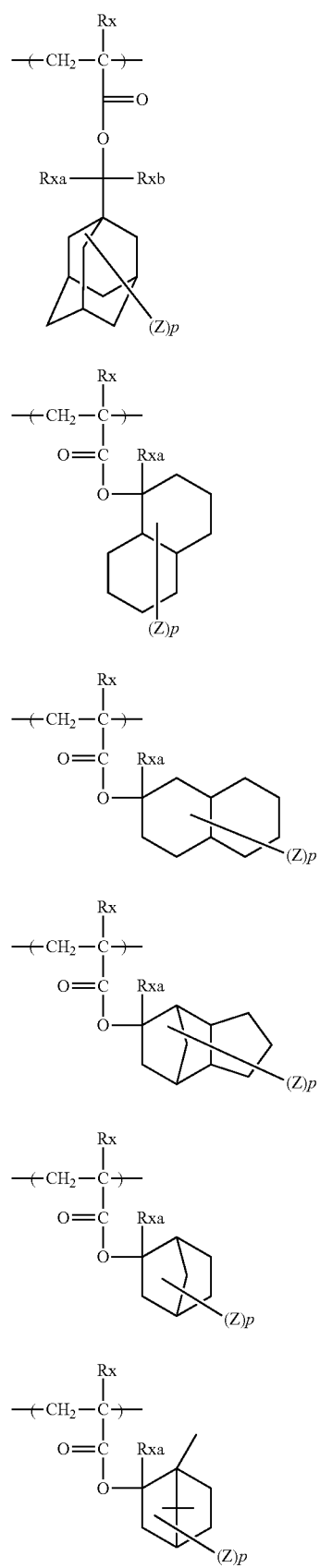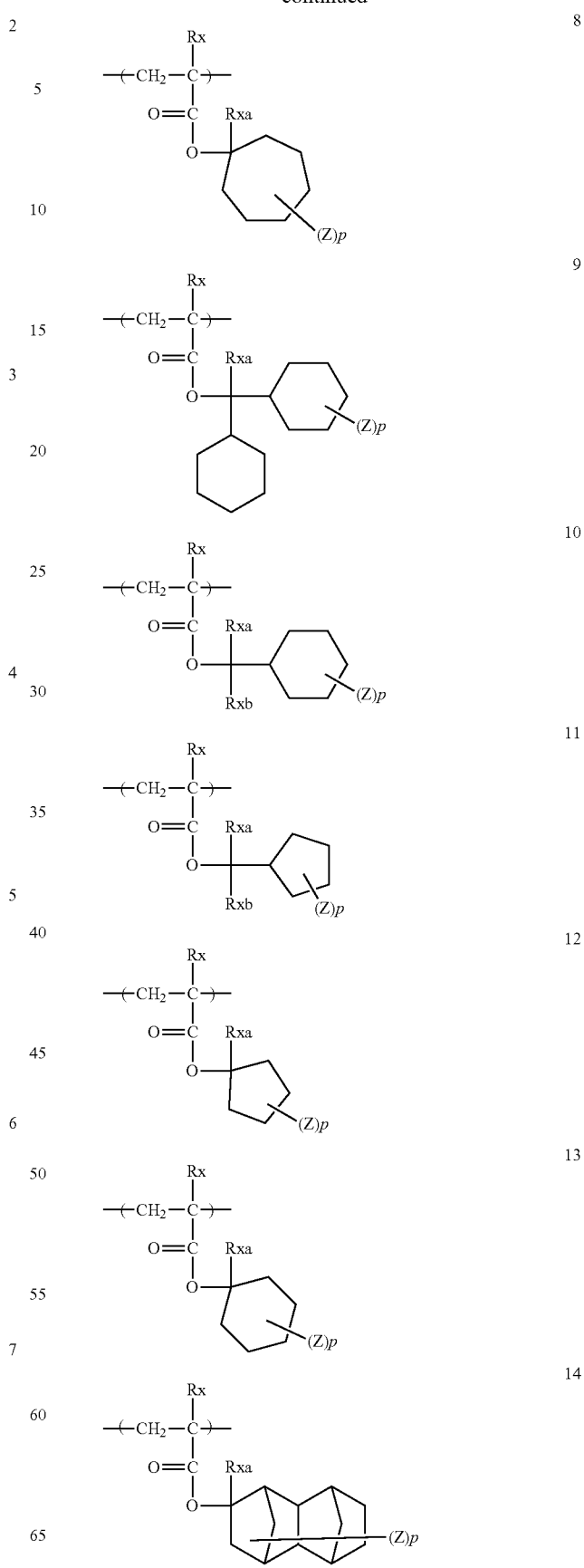

-continued

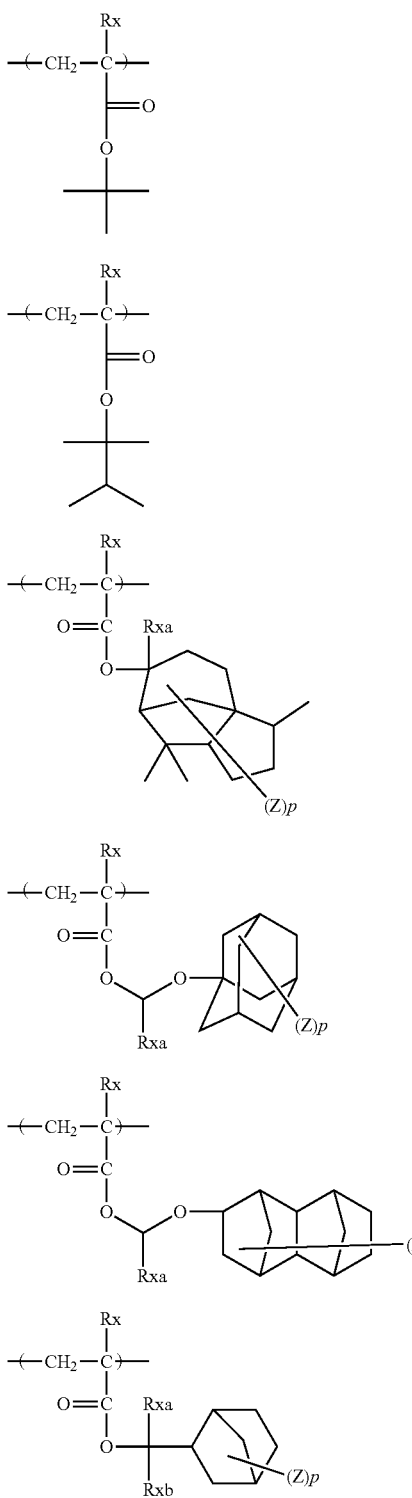

(Repeating Unit Having Lactone Structure)

It is preferable that the resin P contains a repeating unit Q having a lactone structure.

The repeating unit Q having a lactone structure preferably has a lactone structure on a side chain. For example, the repeating unit Q is more preferably a repeating unit derived from a (meth)acrylic acid derivative monomer.

One kind of repeating unit Q having a lactone structure may be used singly, or two or more kinds of repeating units Q may be used in combination. It is preferable to use one kind of repeating unit Q.

The content of the repeating unit Q having a lactone structure with respect to all the repeating units in the resin P is, for example, 3 to 80 mol %, and preferably 3 to 60 mol %.

The lactone structure is preferably a 5- to 7-membered lactone structure, and more preferably a structure in which another ring structure is fused with a 5- to 7-membered lactone structure by forming a bicyclo structure or a spiro structure.

It is preferable that the lactone structure has a repeating unit having a lactone structure represented by any of Formulae (LC1-1) to (LC1-17). As the lactone structure, a lactone structure represented by Formula (LC1-1), Formula (LC1-4), Formula (LC1-5), or Formula (LC1-8) is preferable, and a lactone structure represented by Formula (LC1-4) is more preferable.

LC1-1

LC1-2

LC1-3

LC1-4

LC1-5

LC1-6

-continued

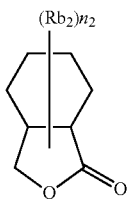
LC1-7

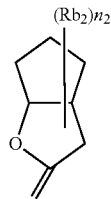
LC1-14

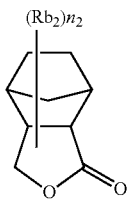
LC1-8

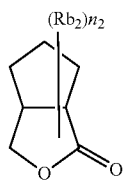
LC1-15

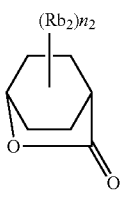
LC1-9

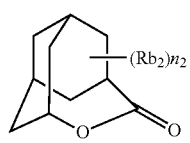
LC1-16

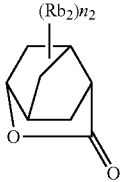
LC1-10

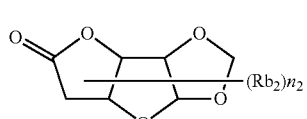
LC1-17

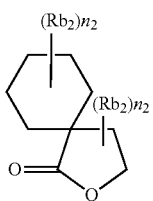
LC1-11

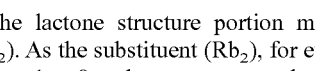

LC1-12

The lactone structure portion may have a substituent ($Rb_2$). As the substituent ($Rb_2$), for example, an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxy group, a halogen atom, a hydroxyl group, a cyano group, an acid-decomposable group, and the like are preferable. $n_2$ represents an integer of 0 to 4. In a case where $n_2$ is equal to or greater than 2, a plurality of substituents ($Rb_2$) may be the same as or different from each other, and a plurality of substituents ($Rb_2$) may form a ring by being bonded to each other.

The resin P is preferably a resin including a repeating unit selected from the group consisting of a repeating unit represented by Formula (a), a repeating unit represented by Formula (b), a repeating unit represented by Formula (c), a repeating unit represented by Formula (d), and a repeating unit represented by Formula (e) (hereinafter, this resin will be referred to as "resin represented by Formula (I)" as well).

LC1-13

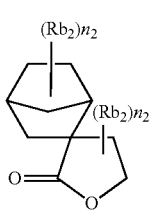

The resin represented by Formula (I) is a resin whose solubility in a developer (chemical liquid which will be described later), which contains an organic solvent as a main component is reduced, by the action of an acid. The resin contains an acid-decomposable group. In the chemical liquid, the resin represented by Formula (I) is excellently dissolved. Therefore, the chemical liquid makes it easy to obtain a uniform resist film by using smaller amounts of the resist composition. Hereinafter, the resin represented by Formula (I) will be described.

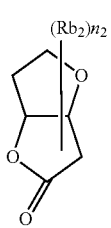

Resin Represented by Formula (I)

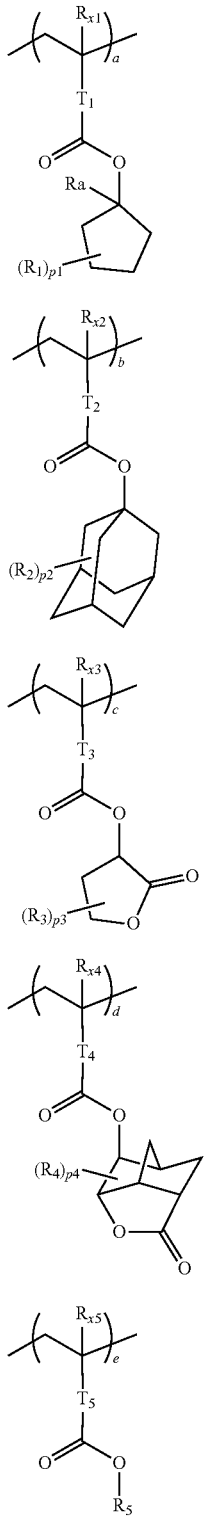

Formula (I) is constituted with a repeating unit (a) (repeating unit represented by Formula (a)), a repeating unit (b) (repeating unit represented by Formula (b)), a repeating unit (c) (repeating unit represented by Formula (c)), a repeating unit (d) (repeating unit represented by Formula (d)), and a repeating unit (e) (repeating unit represented by Formula (e)).

In Formula (I), $R_{x1}$ to $R_{x5}$ each independently represent a hydrogen atom or an alkyl group which may have a substituent.

$R_1$ to $R_4$ each independently represent a monovalent substituent, and p1 to p4 each independently represent 0 or a positive integer.

Ra represents a linear or branched alkyl group.

$T_1$ to $T_5$ each independently represent a single bond or a divalent linking group.

$R_5$ represents a monovalent organic group.

a to e each represent mol %. a to e each independently represent a number included in a range of $0 \le a \le 100$, $0 \le b \le 100$, $0 \le c < 100$, $0 \le d < 100$, and $0 \le e < 100$. Here, a+b+c+d+e=100, and a+b≠0.

In Formula (I), the repeating unit (e) has a structure different from all of the repeating units (a) to (d).

Examples of the alkyl group represented by $R_{x1}$ to $R_{x5}$ that may have a substituent include a methyl group and a group represented by —$CH_2$—$R_{11}$. $R_{11}$ represents a halogen atom (a fluorine atom or the like), a hydroxyl group, or a monovalent organic group.

$R_{x1}$ to $R_{x5}$ preferably each independently represent a hydrogen atom, a methyl group, a trifluoromethyl group, or a hydroxymethyl group.

Examples of the divalent linking group represented by $T_1$ to $T_5$ in Formula (I) include an alkylene group, a —COO-Rt- group, a —O-Rt- group, and the like. In the formula, Rt represents an alkylene group or a cycloalkylene group.

$T_1$ to $T_5$ preferably each independently represent a single bond or a —COO-Rt- group. Rt is preferably an alkylene group having 1 to 5 carbon atoms, and more preferably a —$CH_2$— group, a —$(CH_2)_2$— group, or a —$(CH_2)_3$— group.

In Formula (I), Ra represents a linear or branched alkyl group. Examples thereof include a methyl group, an ethyl group, a t-butyl group, and the like. Among these, a linear or branched alkyl group having 1 to 4 carbon atoms is preferable.

In Formula (I), $R_1$ to $R_4$ each independently represent a monovalent substituent. $R_1$ to $R_4$ are not particularly limited, and examples thereof include a hydroxyl group, a cyano group, and a linear or branched alkyl or cycloalkyl group having a hydroxyl group, a cyano group, and the like.

In Formula (I), p1 to p4 each independently represent 0 or a positive integer. The upper limit of p1 to p4 equals the number of hydrogen atoms which can be substituted in each repeating unit.

In Formula (I), $R_5$ represents a monovalent organic group. $R_5$ is not particularly limited, and examples thereof include a monovalent organic group having a sultone structure, a monovalent organic group having a cyclic ether such as tetrahydrofuran, dioxane, 1,4-thioxane, dioxolane, and 2,4,6-trioxabicyclo[3.3.0]octane, and an acid-decomposable group (for example, an adamantyl group quaternized by the substitution of carbon in a position bonded to a —COO group with an alkyl group).

The repeating unit (b) in Formula (I) is preferably formed of the monomer described in paragraphs [0014] to [0018] in JP2016-138219A.

In Formula (I), a to e each represent mol %. a to e each independently represent a number included in a range of $0 \le a \le 100$, $0 \le b \le 100$, $0 \le c < 100$, $0 \le d < 100$, and $0 \le e < 100$. Here, a+b+c+d+e=100, and a+b≠0.

In Formula (I), a+b (the content of the repeating unit having an acid-decomposable group with respect to all the repeating units) is preferably 20 to 90 mol %, more preferably 25 to 85 mol %, and even more preferably 30 to 80 mol %.

Furthermore, in Formula (I), c+d (the content of the repeating unit having a lactone structure with respect to all the repeating units) is preferably 3 to 80 mol %, and more preferably 3 to 60 mol %.

One kind of each of the repeating unit (a) to repeating unit (e) may be used singly, or two or more kinds of each of the repeating unit (a) to repeating unit (e) may be used in combination. In a case where two or more kinds of repeating units are used in combination, the total content of each repeating unit is preferably within the above range.

The weight-average molecular weight (Mw) of the resin represented by Formula (I) is preferably 1,000 to 200,000 in general, more preferably 2,000 to 20,000, and even more preferably 3,000 to 15,000. The weight-average molecular weight is determined by Gel Permeation Chromatography (GPC) by using tetrahydrofuran (THF) as a developing solvent, and expressed in terms of polystyrene.

In the actinic ray-sensitive or radiation-sensitive resin composition, the content of the resin represented by Formula (I) based on the total solid content of the actinic ray-sensitive or radiation-sensitive resin composition is preferably 30% to 99% by mass in general, and more preferably 50% to 95% by mass.

(Repeating Unit Having Phenolic Hydroxyl Group)

The resin P may contain a repeating unit having a phenolic hydroxyl group.

Examples of the repeating unit having a phenolic hydroxyl group include a repeating unit represented by General Formula (I).

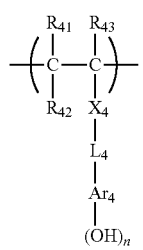

(I)

In the formula, $R_{41}$, $R_{42}$, and $R_{43}$ each independently represent a hydrogen atom, an alkyl group, a halogen atom, a cyano group, or an alkoxycarbonyl group. Here, $R_{42}$ and $Ar_4$ may form a ring by being bonded to each other. In this case, $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents an (n+1)-valent aromatic ring group. In a case where $Ar_4$ forms a ring by being bonded to $R_{42}$, $Ar_4$ represents an (n+2)-valent aromatic ring group.

n represents an integer of 1 to 5.

The alkyl group represented by $R_{41}$, $R_{42}$, and $R_{43}$ in General Formula (I) is preferably an alkyl group having 20 or less carbon atoms such as a methyl group, an ethyl group, a propyl group, an isopropyl group, a n-butyl group, a sec-butyl group, a hexyl group, a 2-ethylhexyl group, an octyl group, or a dodecyl group which may have a substituent, more preferably an alkyl group having 8 or less carbon atoms, and even more preferably an alkyl group having 3 or less carbon atoms.

The cycloalkyl group represented by $R_{41}$, $R_{42}$, and $R_{43}$ in General Formula (I) may be monocyclic or polycyclic. The cycloalkyl group is preferably a monocyclic cycloalkyl group having 3 to 8 carbon atoms such as a cyclopropyl group, a cyclopentyl group, or a cyclohexyl group which may have a substituent.

Examples of the halogen atom represented by $R_{41}$, $R_{42}$, and $R_{43}$ in General Formula (I) include a fluorine atom, a chlorine atom, a bromine atom, and an iodine atom. Among these, a fluorine atom is preferable.

As the alkyl group contained in the alkoxycarbonyl group represented by $R_{41}$, $R_{42}$, and $R_{43}$ in General Formula (I), the same alkyl group as the alkyl group represented by $R_{41}$, $R_{42}$, and $R_{43}$ described above is preferable.

Examples of the substituent in each of the above groups include an alkyl group, a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxycarbonyl group, a cyano group, a nitro group, and the like. The number of carbon atoms in the substituent is preferably equal to or smaller than 8.

$Ar_4$ represents an (n+1)-valent aromatic ring group. Examples of a divalent aromatic ring group obtained in a case where n is 1 include an arylene group having 6 to 18 carbon atoms such as a phenylene group, a tolylene group, a naphthylene group, or an anthracenylene group which may have a substituent and an aromatic ring group containing a hetero ring such as thiophene, furan, pyrrole, benzothiophene, benzofuran, benzopyrrole, triazine, imidazole, benzimidazole, triazole, thiadiazole, or thiazole.

Specific examples of the (n+1)-valent aromatic ring group obtained in a case where n is an integer equal to or greater than 2 include groups obtained by removing (n−1) pieces of any hydrogen atoms from the specific examples of the divalent aromatic ring group described above.

The (n+1)-valent aromatic ring group may further have a substituent.

Examples of the substituent that the alkyl group, the cycloalkyl group, the alkoxycarbonyl group, the alkylene group, and the (n+1)-valent aromatic ring group described above can include the alkyl group exemplified as $R_{41}$, $R_{42}$, and $R_{43}$ in General Formula (I); an alkoxy group such as a methoxy group, an ethoxy group, a hydroxyethoxy group, a propoxy group, a hydroxypropoxy group, or a butoxy group; and an aryl group such as a phenyl group.

Examples of the alkyl group represented by $R_{64}$ in —CONR$_{64}$— ($R_{64}$ represents a hydrogen atom or an alkyl group) represented by $X_4$ include an alkyl group having 20 or less carbon atoms such as a methyl group, an ethyl group, a propyl group, an isopropyl group, a n-butyl group, a sec-butyl group, a hexyl group, a 2-ethylhexyl group, an octyl group, or a dodecyl group which may have a substituent. Among these, an alkyl group having 8 or less carbon atoms is more preferable.

$X_4$ is preferably a single bond, —COO—, or —CONH—, and more preferably a single bond or —COO—.

The alkylene group represented by $L_4$ is preferably an alkylene group having 1 to 8 carbon atoms such as a methylene group, an ethylene group, a propylene group, a butylene group, a hexylene group, or an octylene group which may have a substituent.

Ar₄ is preferably an aromatic ring group having 6 to 18 carbon atoms that may have a substituent, and more preferably a benzene ring group, a naphthalene ring group, or a biphenylene ring group.

It is preferable that the repeating unit represented by General Formula (I) comprises a hydroxystyrene structure. That is, Ar₄ is preferably a benzene ring group.

The repeating unit having a phenolic hydroxyl group is preferably a repeating unit represented by General Formula (p1).

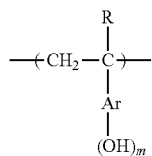
(p1)

R in General Formula (p1) represents a hydrogen atom, a halogen atom, or a linear or branched alkyl group having 1 to 4 carbon atoms. A plurality of R's may be the same as or different from each other. As R in General Formula (p1), a hydrogen atom is preferable.

Ar in General Formula (p1) represents an aromatic ring, and examples thereof include an aromatic hydrocarbon ring having 6 to 18 carbon atoms that may have a substituent, such as a benzene ring, a naphthalene ring, an anthracene ring, a fluorene ring, or a phenanthrene ring, and an aromatic hetero ring containing a hetero ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, or a thiazole ring. Among these, a benzene ring is more preferable.

m in General Formula (p1) represents an integer of 1 to 5. m is preferably 1.

Specific examples of the repeating unit having a phenolic hydroxyl group will be shown below, but the present invention is not limited thereto. In the formulae, a represents 1 or 2.

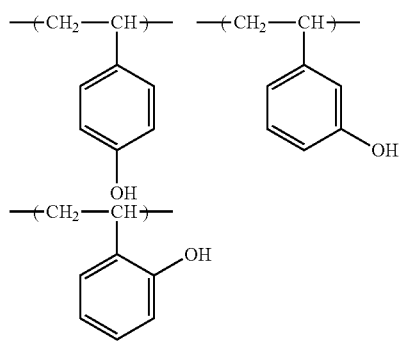

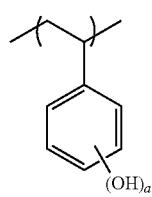
(B-1)

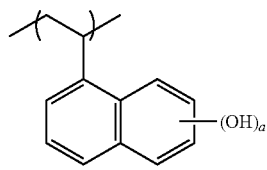
(B-2)

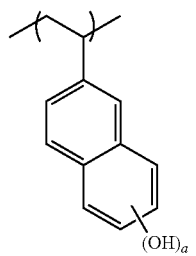
(B-3)

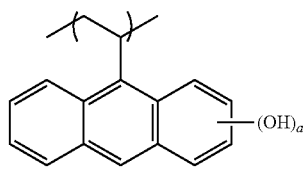
(B-4)

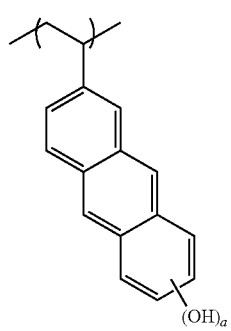
(B-5)

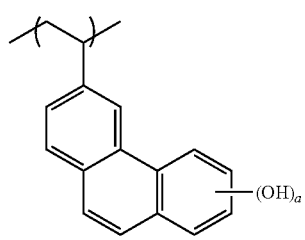
(B-6)

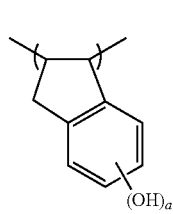
(B-7)

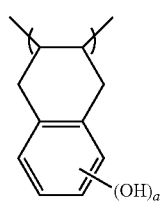
(B-8)

(B-9) 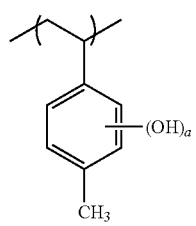
(B-10) 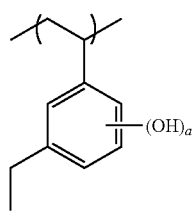
(B-11) 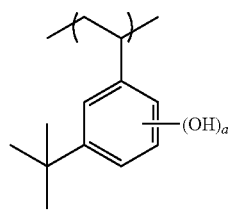
(B-12) 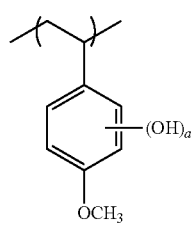
(B-13) 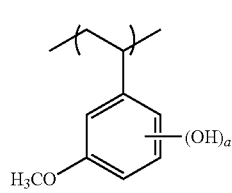
(B-14) 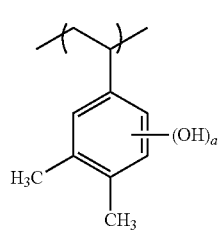
(B-15) 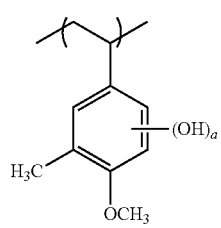
(B-16) 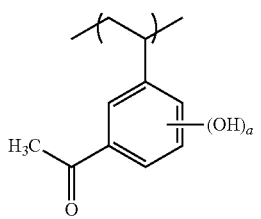
(B-17) 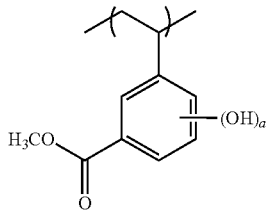
(B-18) 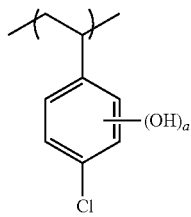
(B-19) 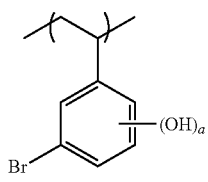
(B-20) 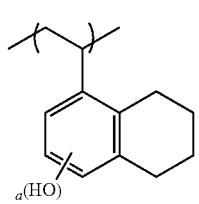
(B-21) 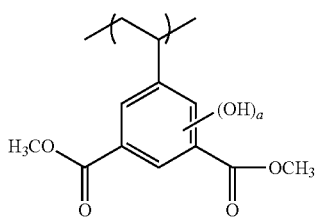
(B-22) 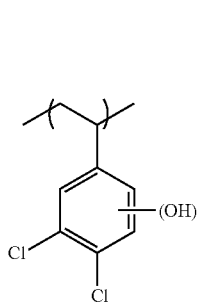

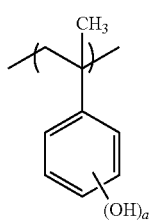 (B-23)
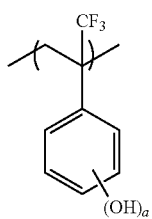 (B-24)
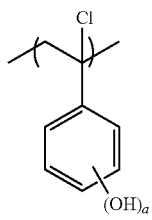 (B-25)
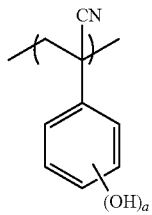 (B-26)
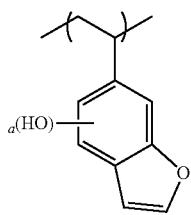 (B-27)
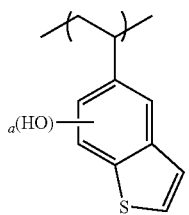 (B-28)
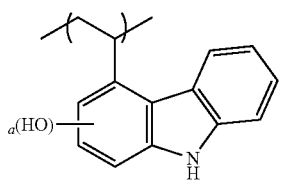 (B-29)
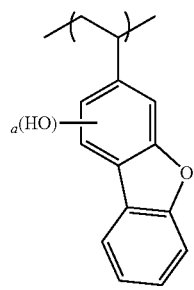 (B-30)
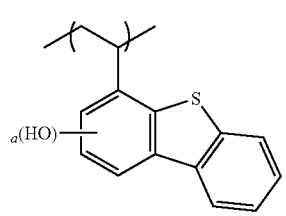 (B-31)
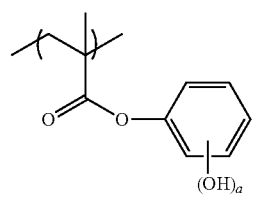 (B-32)
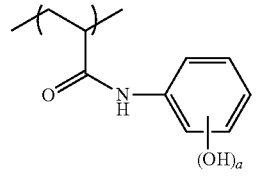 (B-33)
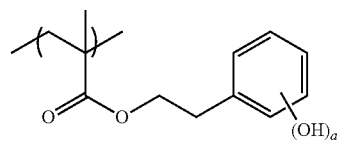 (B-34)
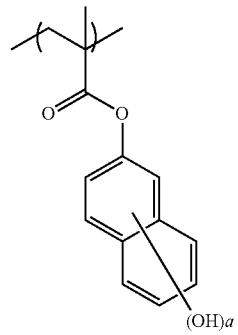 (B-35)

-continued

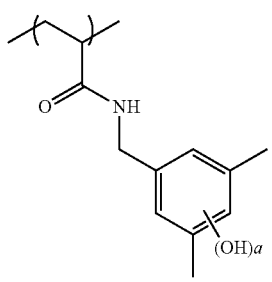
(B-36)

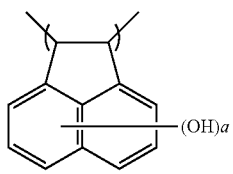
(B-37)

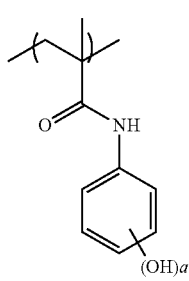
(B-38)

The content of the repeating unit having a phenolic hydroxyl group with respect to all the repeating units in the resin P is preferably 0 to 50 mol %, more preferably 0 to 45 mol %, and even more preferably 0 to 40 mol %.

(Repeating Unit Containing Organic Group Having Polar Group)

The resin P may further contain a repeating unit containing an organic group having a polar group, particularly, a repeating unit having an alicyclic hydrocarbon structure substituted with a polar group.

In a case where the resin P further contains such a repeating unit, the substrate adhesiveness and the affinity with a developer are improved. As the alicyclic hydrocarbon structure substituted with a polar group, an adamantyl group, a diamantyl group, or a norbornane group is preferable. As the polar group, a hydroxyl group or a cyano group is preferable.

Specific examples of the repeating unit having a polar group will be shown below, but the present invention is not limited thereto.

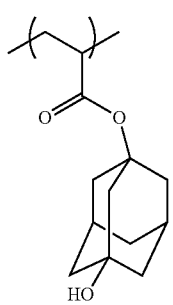 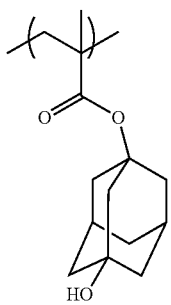

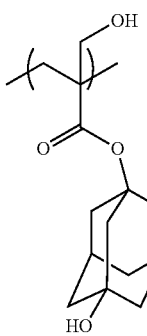 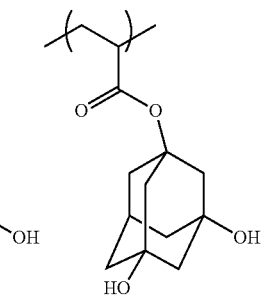

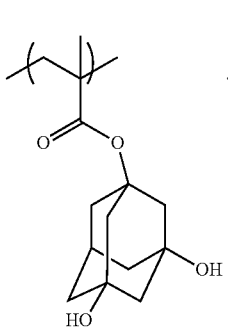 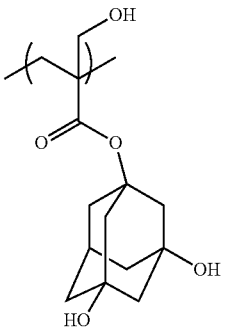

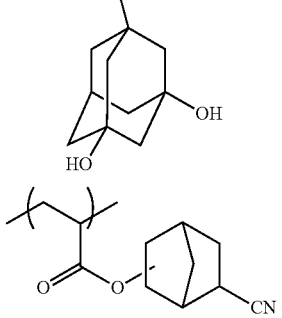

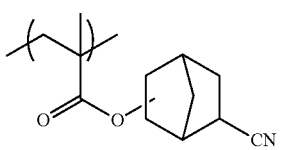

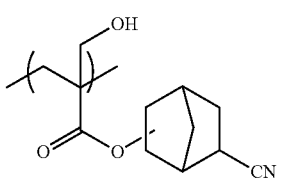

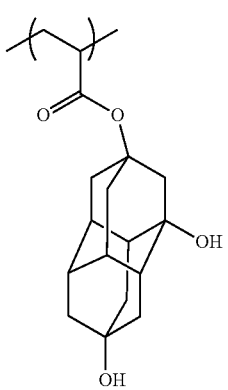 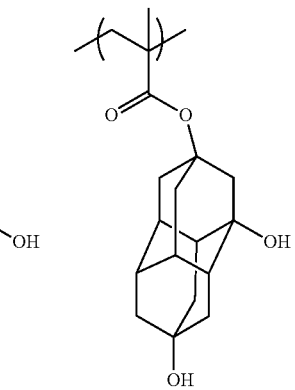

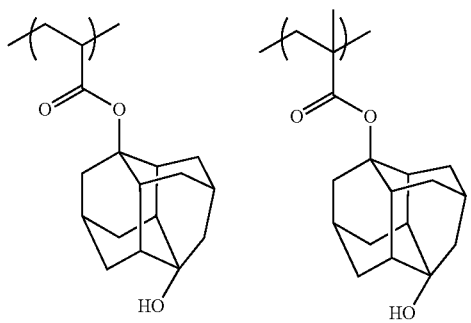

In a case where the resin P contains the repeating unit containing an organic group having a polar group, the content of the repeating unit with respect to all the repeating units in the resin P is preferably 1 to 50 mol %, more preferably 1 to 30 mol %, even more preferably 5 to 25 mol %, and particularly preferably 5 to 20 mol %.

(Repeating Unit Having Group (Photoacid Generating Group) Generating Acid by Irradiation of Actinic Rays or Radiation)

The resin P may contain a repeating unit having a group (photoacid generating group) generating an acid by the irradiation of actinic rays or radiation.

Examples of the repeating unit having a group (photoacid generating group) generating an acid by the irradiation of actinic rays or radiation include a repeating unit represented by Formula (4).

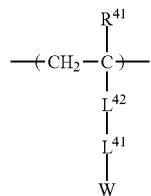

(4)

$R^{41}$ represents a hydrogen atom or a methyl group. $L^{41}$ represents a single bond or a divalent linking group. $L^{42}$ represents a divalent linking group. W represents a structural moiety generating an acid on a side chain by being decomposed by the irradiation of actinic rays or radiation.

Specific examples of the repeating unit represented by Formula (4) will be shown below, but the present invention is not limited thereto.

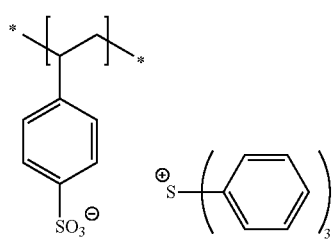

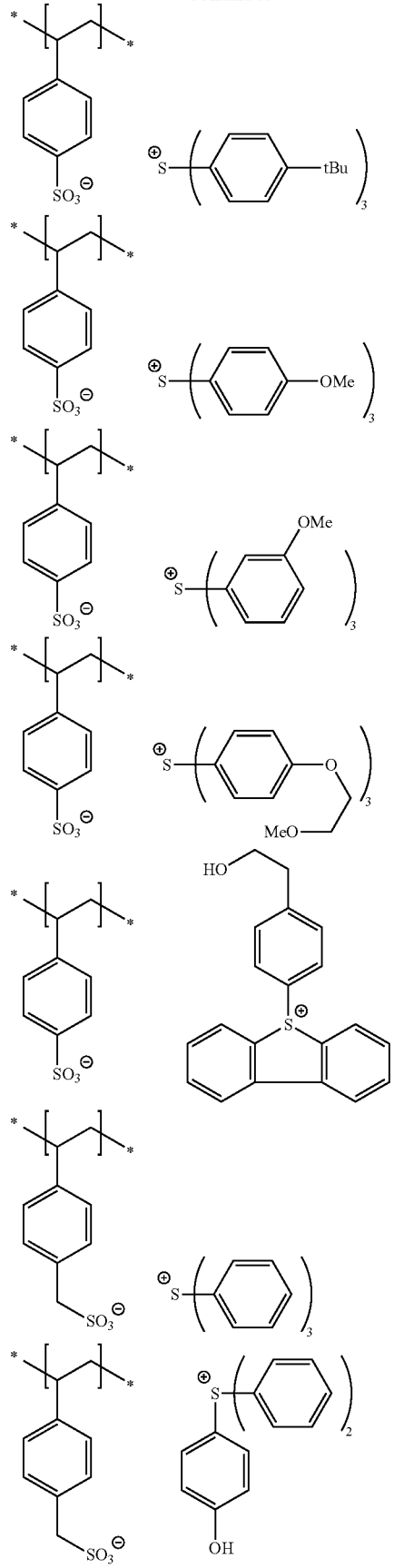

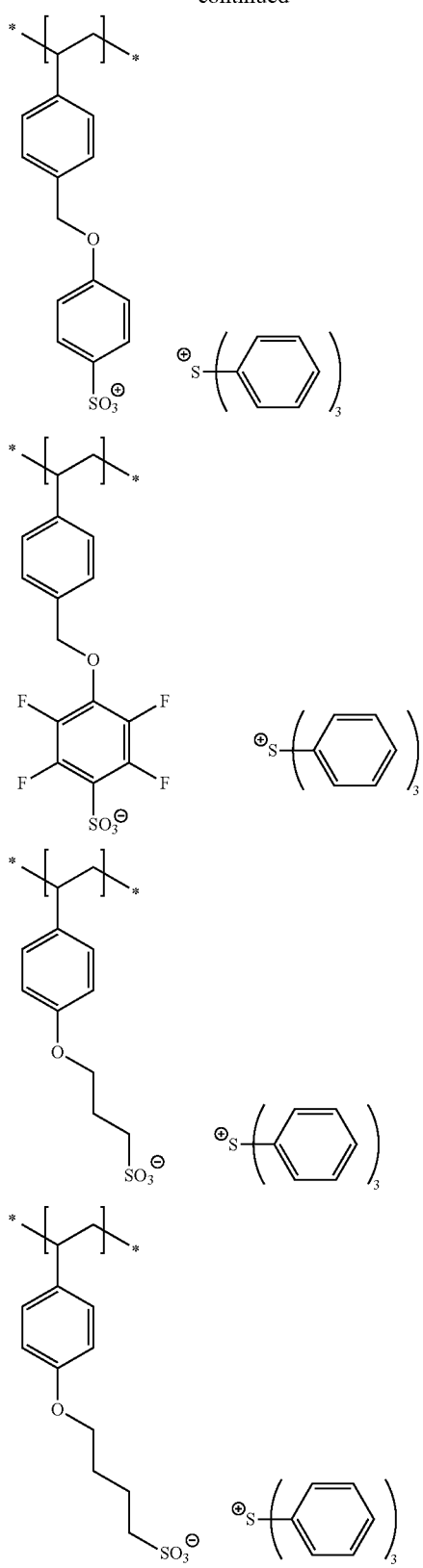

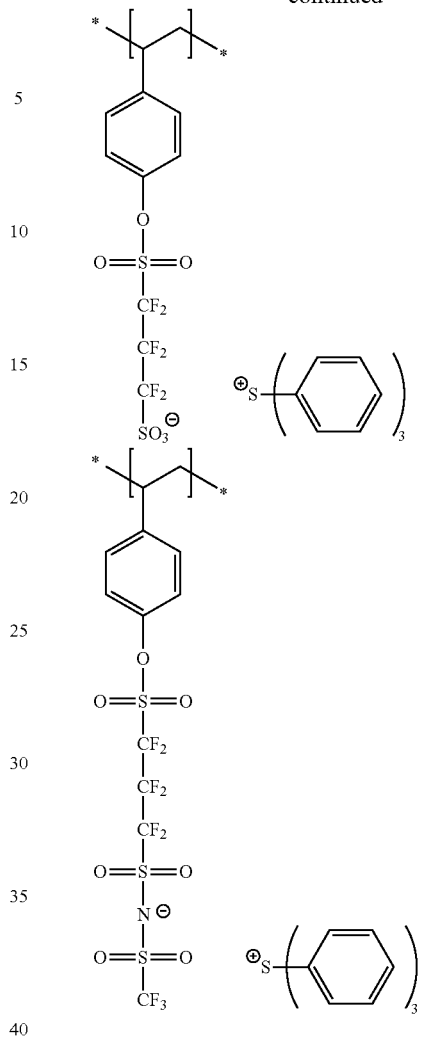

Examples of the repeating unit represented by Formula (4) also include the repeating units described in paragraphs [0094] to [0105] in JP2014-041327A.

In a case where the resin P contains the repeating unit having a photoacid generating group, the content of the repeating unit having a photoacid generating group with respect to all the repeating units in the resin P is preferably 1 to 40 mol %, more preferably 5 to 35 mol %, and even more preferably 5 to 30 mol %.

The resin P may contain a repeating unit represented by Formula (VI).

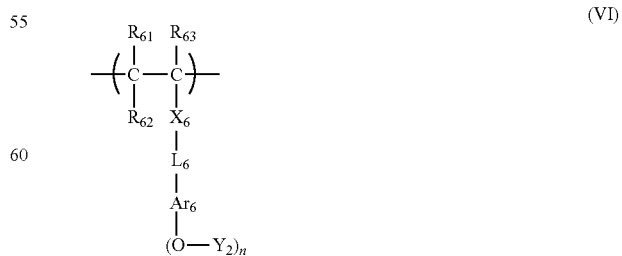

In Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. Here, $R_{62}$ may form a ring by being bonded to $Ar_6$, and in this case, $R_{62}$ represents a single bond or an alkylene group.

$X_6$ represents a single bond, —COO—, or —CONR$_{64}$—. $R_{64}$ represents a hydrogen atom or an alkyl group.

$L_6$ represents a single bond or an alkylene group.

$Ar_6$ represents an (n+1)-valent aromatic ring group. In a case where $Ar_6$ forms a ring by being bonded to $R_{62}$, $Ar_6$ represents an (n+2)-valent aromatic ring group.

In a case where n≥2, $Y_2$ each independently represents a hydrogen atom or a group which is dissociated by the action of an acid. Here, at least one of $Y_2$'s represents a group which is dissociated by the action of an acid.

n represents an integer of 1 to 4.

As the group $Y_2$ which is dissociated by the action of an acid, a structure represented by Formula (VI-A) is preferable.

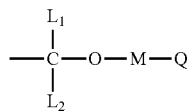

(VI-A)

$L_1$ and $L_2$ each independently represent a hydrogen atom, an alkyl group, a cycloalkyl group, an aryl group, or a group obtained by combining an alkylene group and an aryl group.

M represents a single bond or a divalent linking group.

Q represents an alkyl group, a cycloalkyl group which may contain a heteroatom, an aryl group which may contain a heteroatom, an amino group, an ammonium group, a mercapto group, a cyano group, or an aldehyde group.

At least two out of Q, M, and $L_1$ may form a ring (preferably a 5- or 6-membered ring) by being bonded to each other.

The repeating unit represented by Formula (VI) is preferably a repeating unit represented by Formula (3).

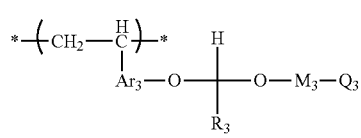

(3)

In Formula (3), $Ar_3$ represents an aromatic ring group.

$R_3$ represents a hydrogen atom, an alkyl group, a cycloalkyl group, an aryl group, an aralkyl group, an alkoxy group, an acyl group, or a heterocyclic group.

$M_3$ represents a single bond or a divalent linking group.

$Q_3$ represents an alkyl group, a cycloalkyl group, an aryl group, or a heterocyclic group.

At least two out of $Q_3$, $M_3$, and $R_3$ may form a ring by being bonded to each other.

The aromatic ring group represented by $Ar_3$ is the same as $Ar_6$ in Formula (VI) in a case where n in Formula (VI) is 1. $Ar_3$ is more preferably a phenylene group or a naphthylene group, and even more preferably a phenylene group.

Specific examples of the repeating unit represented by Formula (VI) will be shown below, but the present invention is not limited thereto.

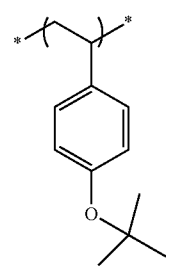

(VI-1)

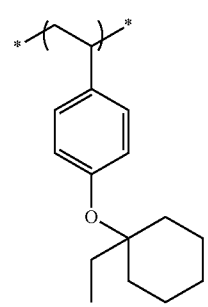

(VI-2)

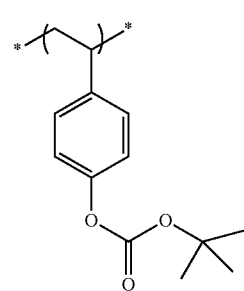

(VI-3)

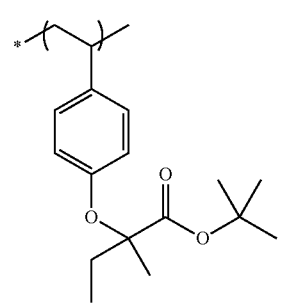

(VI-4)

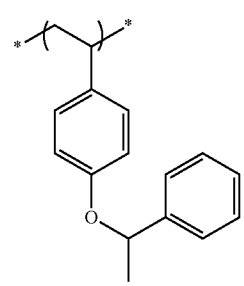

(VI-5)

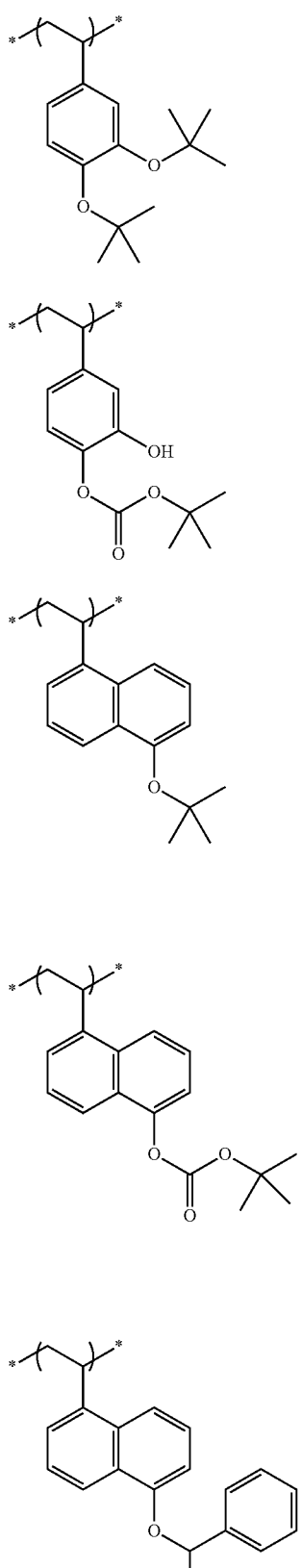
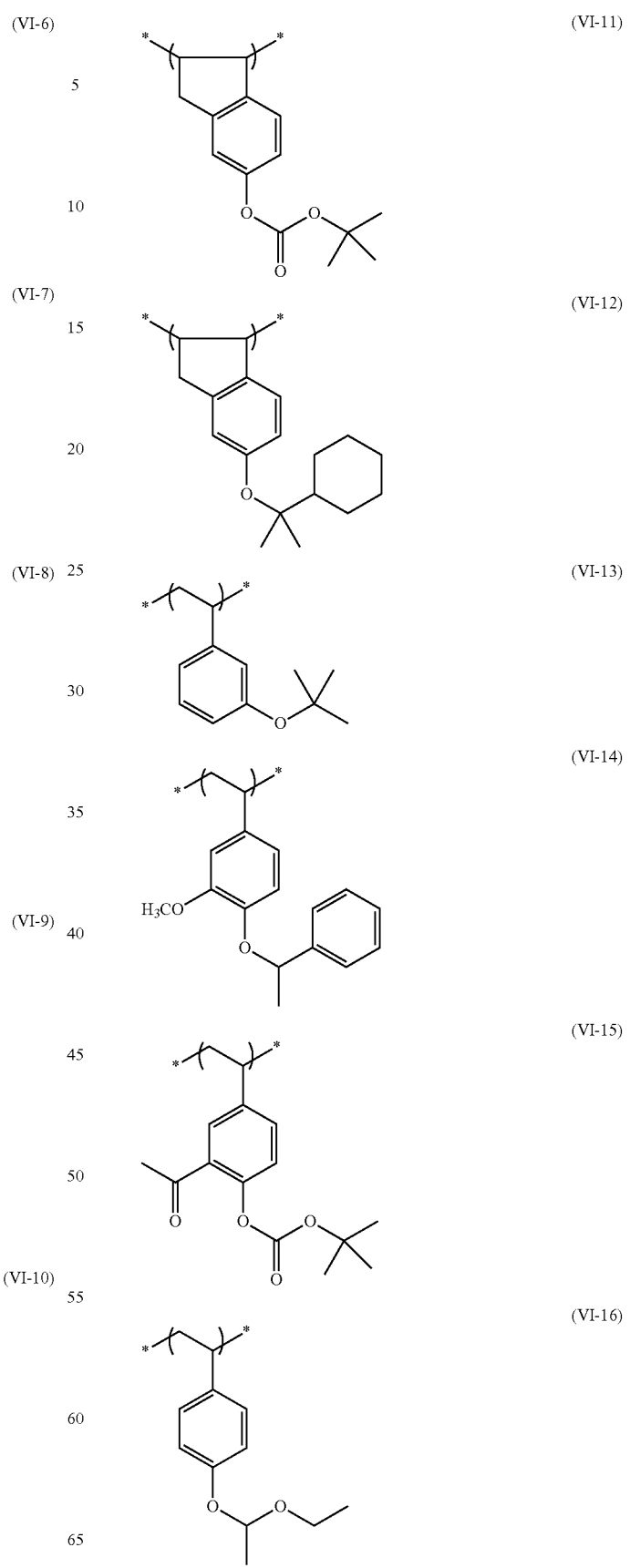

(VI-17)
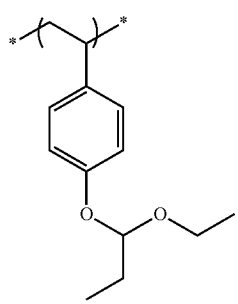
(VI-18)
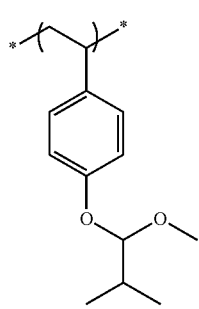
(VI-19)
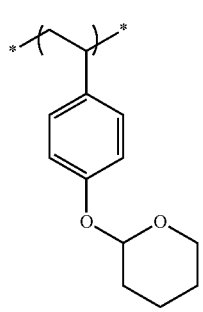
(VI-20)
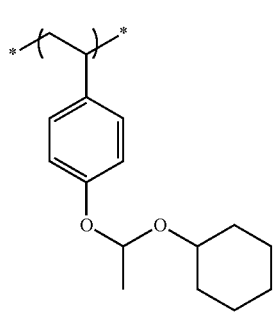
(VI-21)
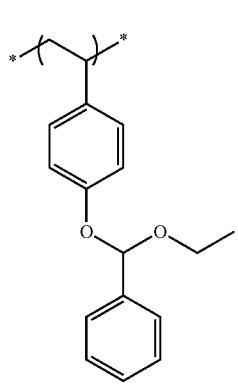
(VI-22)
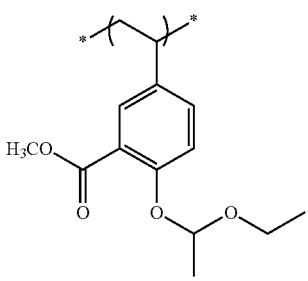
(VI-23)
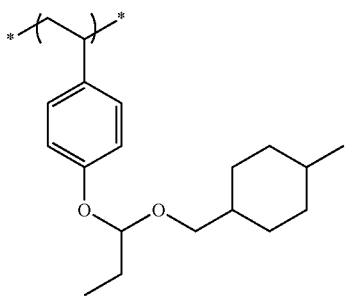
(VI-24)
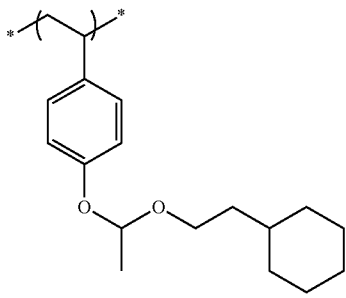
(VI-25)
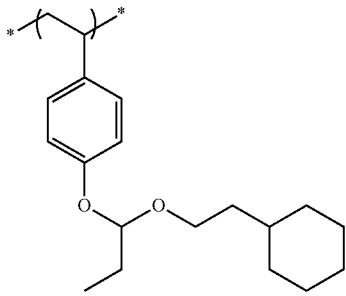
(VI-26)
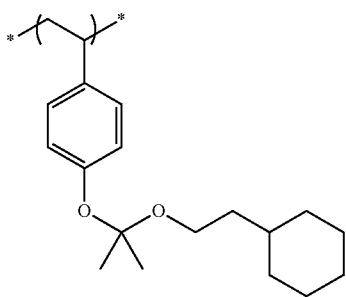

(VI-27) 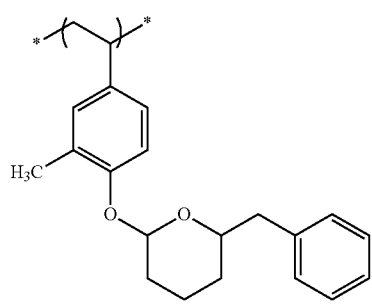
(VI-28) 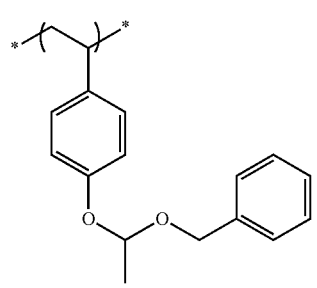
(VI-29) 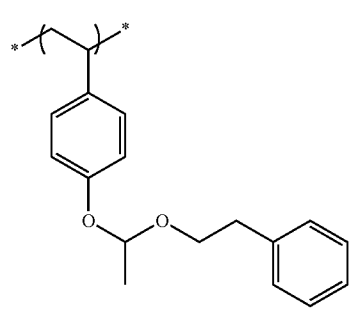
(VI-30) 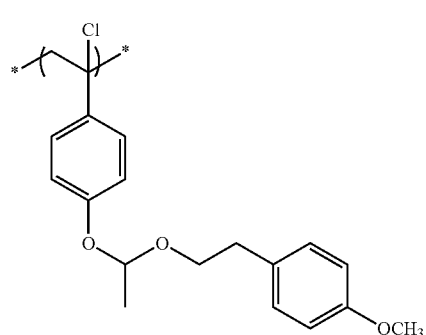
(VI-31) 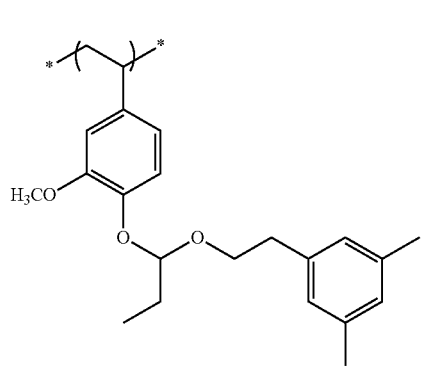
(VI-32) 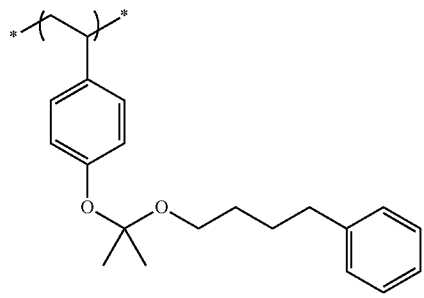
(VI-33) 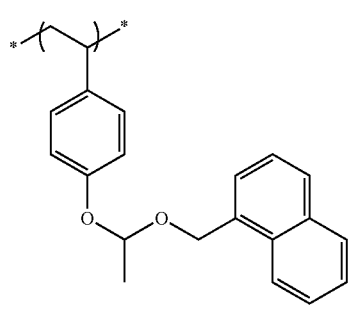
(VI-34) 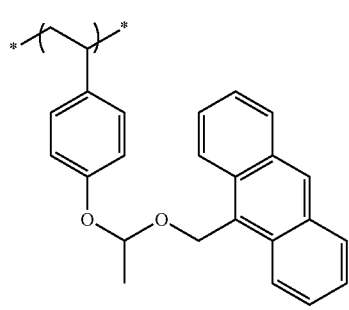
(VI-35) 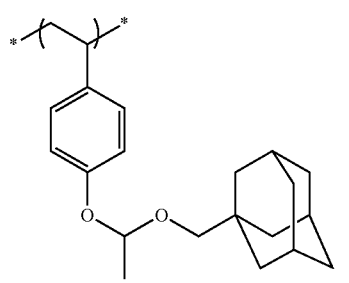
(VI-36) 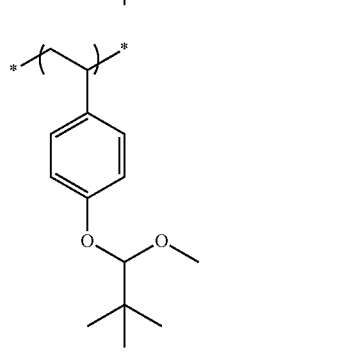
The resin P may contain a repeating unit represented by Formula (4).

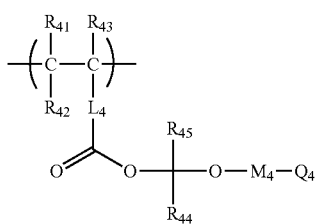
(4)

In Formula (4), $R_{41}$, $R_{42}$, and $R_{43}$ each independently represent a hydrogen atom, an alkyl group, a cycloalkyl group, a halogen atom, a cyano group, or an alkoxycarbonyl group. $R_{42}$ and $L_4$ may form a ring by being bonded to each other, and in this case, $R_{42}$ represents an alkylene group.

$L_4$ represents a single bond or a divalent linking group. In a case where $L_4$ forms a ring together with $R_{42}$, $L_4$ represents a trivalent linking group.

$R_{44}$ and $R_{45}$ each represent a hydrogen atom, an alkyl group, a cycloalkyl group, an aryl group, an aralkyl group, an alkoxy group, an acyl group, or a heterocyclic group.

$M_4$ represents a single bond or a divalent linking group.

$Q_4$ represents an alkyl group, a cycloalkyl group, an aryl group, or a heterocyclic group.

At least two out of $Q_4$, $M_4$, and $R_{44}$ may form a ring by being bonded to each other.

$R_{41}$, $R_{42}$, and $R_{43}$ have the same definition as $R_{41}$, $R_{42}$, and $R_{43}$ in Formula (IA), and the preferable range thereof is also the same.

$L_4$ has the same definition as T in Formula (AI), and the preferable range thereof is also the same.

$R_{44}$ and $R_{45}$ have the same definition as $R_3$ in Formula (3), and the preferable range thereof is also the same.

$M_4$ has the same definition as $M_3$ in Formula (3), and the preferable range thereof is also the same.

$Q_4$ has the same definition as $Q_3$ in Formula (3), and the preferable range thereof is also the same.

Examples of the ring formed by bonding of at least two out of $Q_4$, $M_4$, and $R_{44}$ include a ring formed by bonding of at least two out of $Q_3$, $M_3$, and $R_3$, and the preferable range thereof is also the same.

Specific examples of the repeating unit represented by Formula (4) will be shown below, but the present invention is not limited thereto.

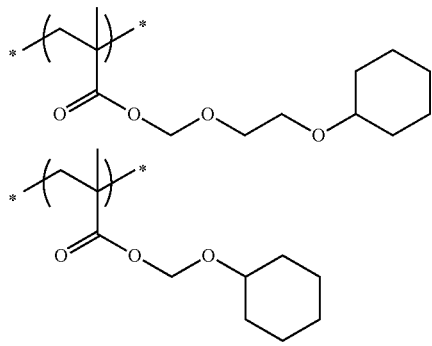

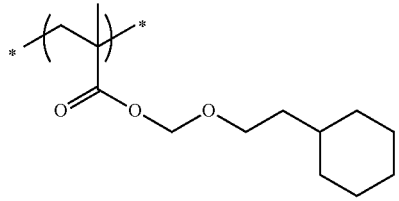

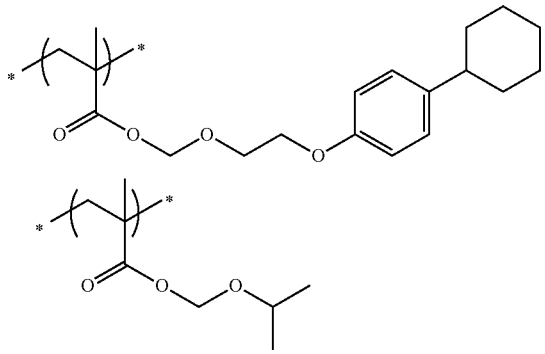

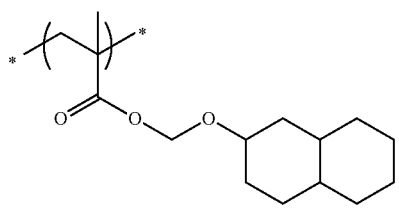

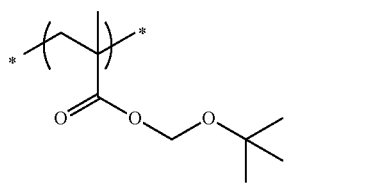

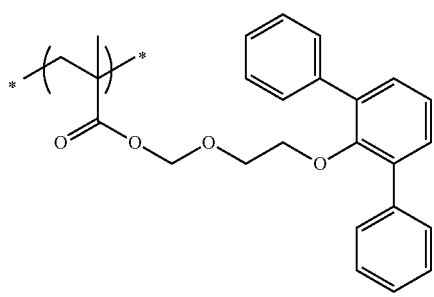

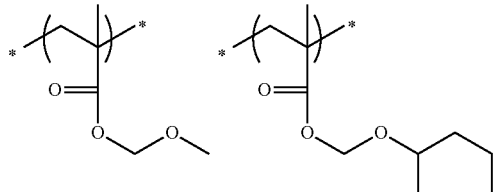

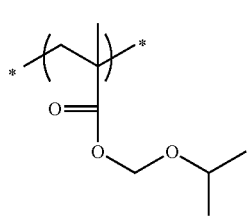

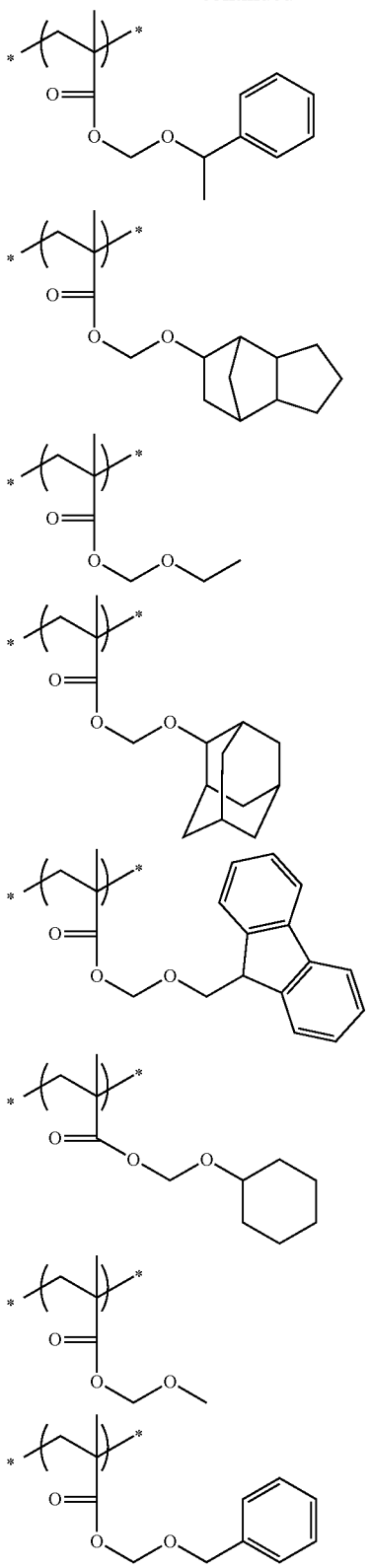

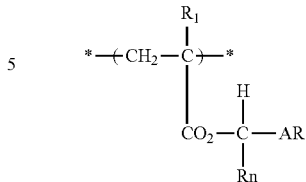

In Formula (BZ), AR represents an aryl group. Rn represents an alkyl group, a cycloalkyl group, or an aryl group. Rn and AR may form a nonaromatic ring by being bonded to each other.

$R_1$ represents a hydrogen atom, an alkyl group, a cycloalkyl group, a halogen atom, a cyano group, or an alkyloxycarbonyl group.

Specific examples of the repeating unit represented by Formula (BZ) will be shown below, but the present invention is not limited thereto.

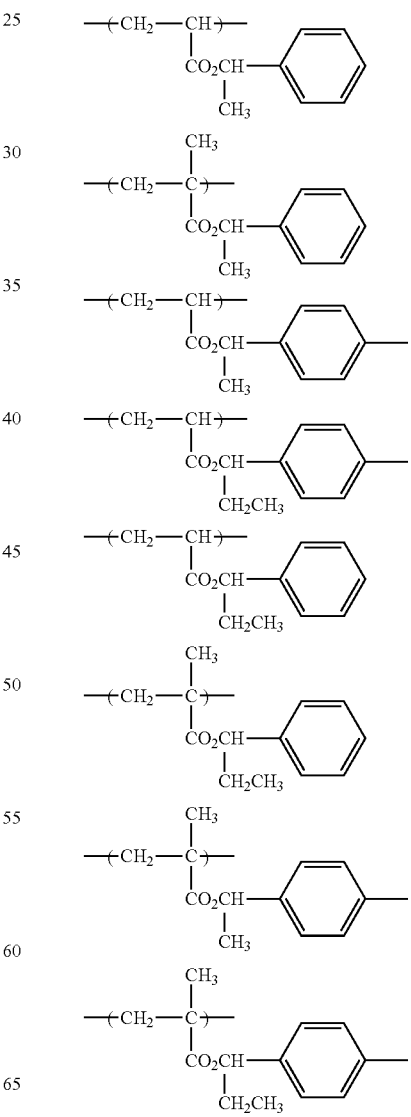

The resin P may contain a repeating unit represented by Formula (BZ).

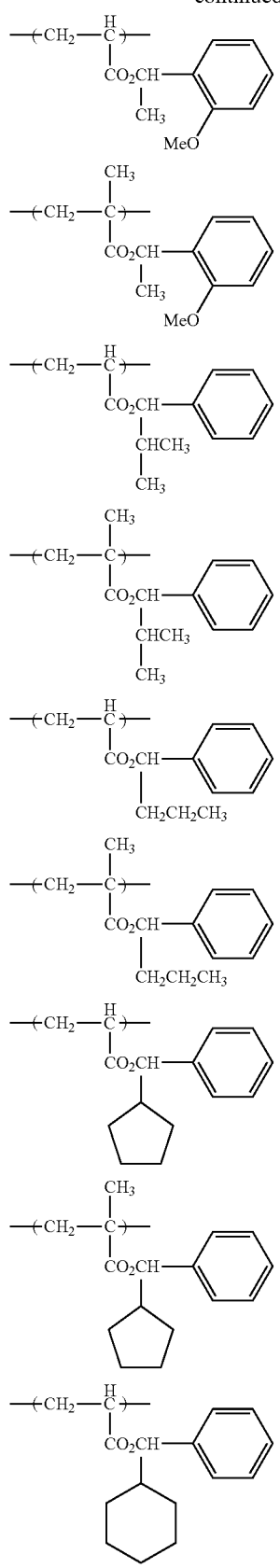
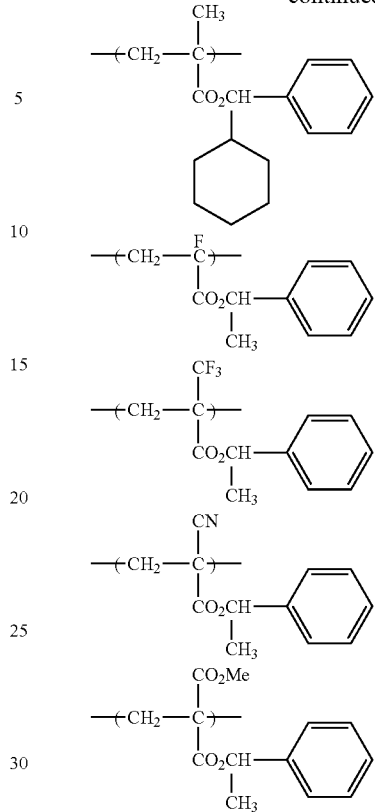

In the resin P, the content of the repeating unit having an acid-decomposable group (total content in a case where the resin P contains a plurality of kinds of the repeating units) with respect to all the repeating units in the resin P is preferably 5 to 80 mol %, more preferably 5 to 75 mol %, and even more preferably 10 to 65 mol %.

The resin P may contain a repeating unit represented by Formula (V) or Formula (VI).

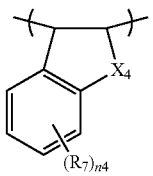

(V)

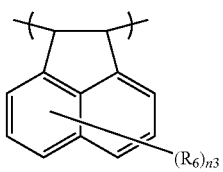

(VI)

In the formulae, $R_6$ and $R_7$ each independently represent a hydrogen atom, a hydroxy group, a linear, branched, and cyclic alkyl group having 1 to 10 carbon atoms, an alkoxy group, an acyloxy group, a cyano group, a nitro group, an amino group, a halogen atom, an ester group (—OCOR or —COOR: R represents an alkyl group having 1 to 6 carbon atoms or a fluorinated alkyl group), or a carboxyl group.

$n_3$ represents an integer of 0 to 6.

$n_4$ represents an integer of 0 to 4.

$X_4$ represents a methylene group, an oxygen atom, or a sulfur atom.

Specific examples of the repeating unit represented by Formula (V) or Formula (VI) will be shown below, but the present invention is not limited thereto.

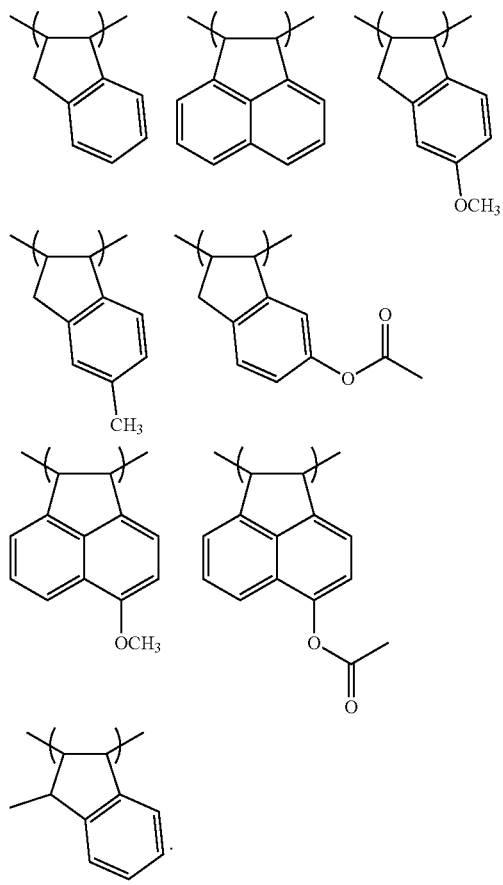

The resin P may further contain a repeating unit having a silicon atom on a side chain. Examples of the repeating unit having a silicon atom on a side chain include a (meth)acrylic repeating unit having a silicon atom, a vinyl-based repeating unit having a silicon atom, and the like. Typically, the repeating unit having a silicon atom on a side chain is a repeating unit having a group having a silicon atom on a side chain. Examples of the group having a silicon atom include a trimethylsilyl group, a triethylsilyl group, a triphenylsilyl group, a tricyclohexylsilyl group, a tristrimethylsiloxysilyl group, a tristrimethylsilyl silyl group, a methyl bistrimethylsilyl silyl group, a methyl bistrimethylsiloxysilyl group, a dimethyltrimethylsilyl silyl group, a dimethyl trimethylsiloxysilyl group, cyclic or linear polysiloxane shown below, a cage-like, ladder-like, or random silsesquioxane structure, and the like. In the formulae, R and $R^1$ each independently represent a monovalent substituent. * represents a bond.

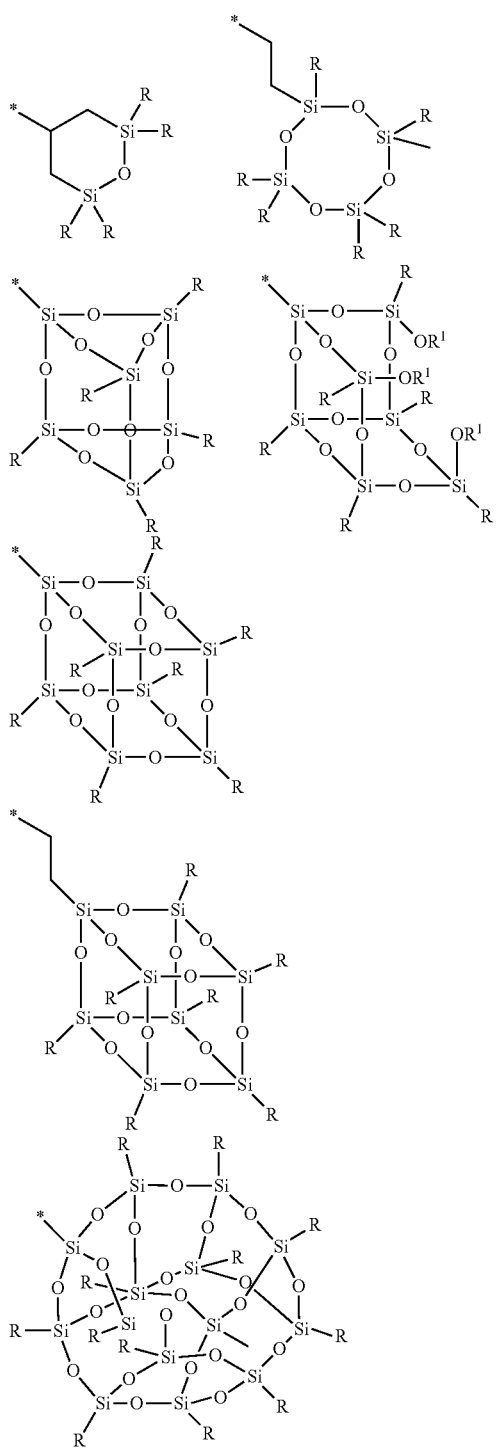

As the repeating unit having the aforementioned group, for example, a repeating unit derived from an acrylate or methacrylate compound having the aforementioned group or a repeating unit derived from a compound having the aforementioned group and a vinyl group is preferable.

It is preferable that the repeating unit having a silicon atom is preferably a repeating unit having a silsesquioxane structure. In a case where the repeating unit has a silsesquioxane structure, in forming an ultrafine pattern (for example, a line width equal to or smaller than 50 nm) having a cross-sectional shape with a high aspect ratio (for example, film thickness/line width is equal to or greater than 3), an extremely excellent collapse performance can be demonstrated.

Examples of the silsesquioxane structure include a cage-like silsesquioxane structure, a ladder-like silsesquioxane structure, and a random silsesquioxane structure. Among these, a cage-like silsesquioxane structure is preferable.

The cage-like silsesquioxane structure is a silsesquioxane structure having a cage-like skeleton. The cage-like silsesquioxane structure may be a complete cage-like silsesquioxane structure or an incomplete cage-like silsesquioxane structure, but is preferably a complete cage-like silsesquioxane structure.

The ladder-like silsesquioxane structure is a silsesquioxane structure having a ladder-like skeleton.

The random silsesquioxane structure is a silsesquioxane structure having a random skeleton.

The cage-like silsesquioxane structure is preferably a siloxane structure represented by Formula (S).

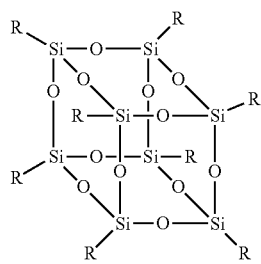

In Formula (S), R represents a monovalent organic group. A plurality of R's may be the same as or different from each other.

The organic group is not particularly limited, and specific examples thereof include a hydroxy group, a nitro group, a carboxy group, an alkoxy group, an amino group, a mercapto group, a blocked mercapto group (for example, a mercapto group blocked (protected) by an acyl group), an acyl group, an imide group, a phosphino group, a phosphinyl group, a silyl group, a vinyl group, a hydrocarbon group which may have a heteroatom, a (meth)acryl group-containing group, an epoxy group-containing group, and the like.

Examples of the heteroatom in the hydrocarbon group which may have a heteroatom include an oxygen atom, a nitrogen atom, a sulfur atom, a phosphorus atom, and the like.

Examples of the hydrocarbon group which may have a heteroatom include an aliphatic hydrocarbon group, an aromatic hydrocarbon group, a group obtained by combining these, and the like.

The aliphatic hydrocarbon group may be any of a linear, branched, or cyclic aliphatic hydrocarbon group. Specific examples of the aliphatic hydrocarbon group include a linear or branched alkyl group (particularly having 1 to 30 carbon atoms), a linear or branched alkenyl group (particularly having 2 to 30 carbon atoms), a linear or branched alkynyl group (particularly having 2 to 30 carbon atoms), and the like.

Examples of the aromatic hydrocarbon group include an aromatic hydrocarbon group having 6 to 18 carbon atoms such as a phenyl group, a tolyl group, a xylyl group, or a naphthyl group.

In a case where the resin P has the repeating unit having a silicon atom on a side chain, the content of the repeating unit with respect to all the repeating units in the resin P is preferably 1 to 30 mol %, more preferably 5 to 25 mol %, and even more preferably 5 to 20 mol %.

The weight-average molecular weight of the resin P that is measured by a Gel permeation chromatography (GPC) method and expressed in terms of polystyrene is preferably 1,000 to 200,000, more preferably 3,000 to 20,000, and even more preferably 5,000 to 15,000. In a case where the weight-average molecular weight is 1,000 to 200,000, it is possible to prevent the deterioration of heat resistance and dry etching resistance, to prevent the deterioration of developability, and to prevent film forming properties from deteriorating due to the increase in viscosity.

The dispersity (molecular weight distribution) is generally 1 to 5, preferably 1 to 3, more preferably 1.2 to 3.0, and even more preferably 1.2 to 2.0.

In the actinic ray-sensitive or radiation-sensitive resin composition, the content of the resin P in the total solid content is preferably 50% to 99.9% by mass, and more preferably 60% to 99.0% by mass.

In the actinic ray-sensitive or radiation-sensitive resin composition, one kind of resin P may be used, or a plurality of resins P may be used in combination.

(Photoacid Generator)

It is preferable that the actinic ray-sensitive or radiation-sensitive resin composition contains a photoacid generator. As the photoacid generator, known photoacid generators can be used without particular limitation.

The content of the photoacid generator in the actinic ray-sensitive or radiation-sensitive resin composition is not particularly limited. However, generally, the content of the photoacid generator with respect to the total solid content of the actinic ray-sensitive or radiation-sensitive resin composition is preferably 0.1% to 20% by mass, and more preferably 0.5% to 20% by mass. One kind of photoacid generator may be used singly, or two or more kinds of photoacid generators may be used in combination. In a case where two or more kinds of photoacid generators are used in combination, the total content thereof is preferably within the above range.

Examples of the photoacid generator include the compounds described in JP2016-057614A, JP2014-219664A, JP2016-138219A, and JP2015-135379A.

(Quencher)

The actinic ray-sensitive or radiation-sensitive resin composition may contain a quencher. As the quencher, known quenchers can be used without particular limitation.

The quencher is a basic compound and has a function of inhibiting the acid-decomposable resin from being unintentionally decomposed in an unexposed area by the acid spread from an exposed area.

The content of the quencher in the actinic ray-sensitive or radiation-sensitive resin composition is not particularly limited. However, generally, the content of the quencher with respect to the total solid content of the actinic ray-sensitive or radiation-sensitive resin composition is preferably 0.1% to 15% by mass, and more preferably 0.5% to 8% by mass. One kind of quencher may be used singly, or two or more kinds of quenchers may be used in combination. In a case where two or more kinds of quenchers are used in combination, the total content thereof is preferably within the above range.

Examples of the quencher include the compounds described in JP2016-057614A, JP2014-219664A, JP2016-138219A, and JP2015-135379A.

(Hydrophobic Resin)

The actinic ray-sensitive or radiation-sensitive resin composition may contain a hydrophobic resin.

It is preferable to design the hydrophobic resin such that the resin is localized within the surface of a resist film. However, unlike a surfactant, the hydrophobic resin does not need to have a hydrophilic group in a molecule and may not make a contribution to the homogeneous mixing of a polar substance with a nonpolar substance.

The addition of the hydrophobic resin brings about effects such as the control of static and dynamic contact angle formed between water and the resist film surface and the inhibition of outgas.

From the viewpoint of localization within the surface layer of a film, the hydrophobic resin preferably has any one or more kinds of groups among "fluorine atom", "silicon atom", and "$CH_3$ partial structure included in a side chain portion of the resin", and more preferably has two or more kinds of groups among the above. Furthermore, it is preferable that the hydrophobic resin has a hydrocarbon group having 5 or more carbon atoms. These groups may be positioned in the main chain of the resin or may substitute a side chain of the resin.

In a case where the hydrophobic resin contains a fluorine atom and/or a silicon atom, the fluorine atom and/or the silicon atom in the hydrophobic resin may be contained in the main chain or the side chain of the resin.

In a case where the hydrophobic resin contains a fluorine atom, as a partial structure having the fluorine atom, a fluorine atom-containing alkyl group, a fluorine atom-containing cycloalkyl group, or a fluorine atom-containing aryl group is preferable.

The fluorine atom-containing alkyl group (preferably having 1 to 10 carbon atoms and more preferably having 1 to 4 carbon atoms) is a linear or branched alkyl group in which at least one hydrogen atom is substituted with a fluorine atom and which may further have a substituent other than a fluorine atom.

The fluorine atom-containing cycloalkyl group is a monocyclic or polycyclic cycloalkyl group in which at least one hydrogen atom is substituted with a fluorine atom and which may further have a substituent other than a fluorine atom.

Examples of the fluorine atom-containing aryl group include an aryl group in which at least one hydrogen atom is substituted with a fluorine atom, such as a phenyl group or a naphthyl group. The fluorine atom-containing aryl group may further have a substituent other than a fluorine atom.

Examples of the repeating unit having a fluorine atom or a silicon atom include the repeating units exemplified in paragraph [0519] in US2012/0251948A1.

As described above, it is also preferable that the hydrophobic resin contains a $CH_3$ partial structure in a side chain portion.

Herein, the $CH_3$ partial structure that the side chain portion of the hydrophobic resin has includes a $CH_3$ partial structure that an ethyl group, a propyl group, or the like has.

A methyl group directly bonded to the main chain of the hydrophobic resin (for example, an α-methyl group of a repeating unit having a methacrylic acid structure) makes a small contribution to the surface localization of the hydrophobic resin due to the influence of the main chain. Accordingly, such a methyl group is not included in the $CH_3$ partial structure in the present invention.

Regarding the hydrophobic resin, the description in paragraphs [0348] to [0415] in JP2014-010245A can be referred to, and the entire contents thereof are incorporated into the present specification.

As the hydrophobic resin, in addition to the above resins, the resins described in JP2011-248019A, JP2010-175859A, and JP2012-032544A can also be preferably used.

As the hydrophobic resin, for example, resins represented by Formula (1b) to Formula (5b) are preferable.

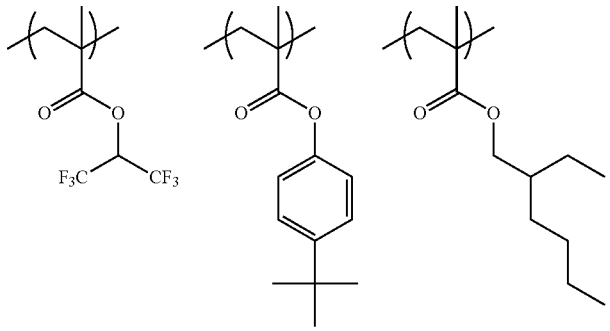

(1b)

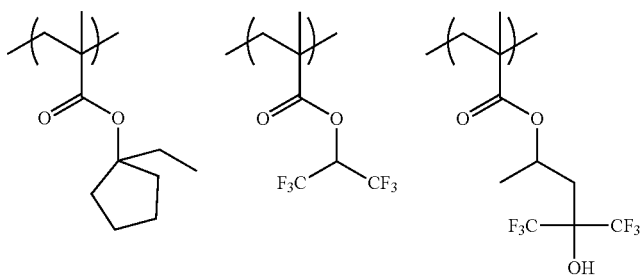

(2b)

-continued

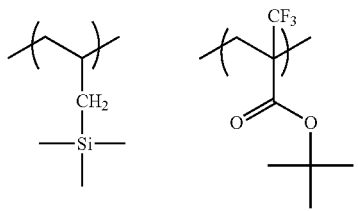

(3b)

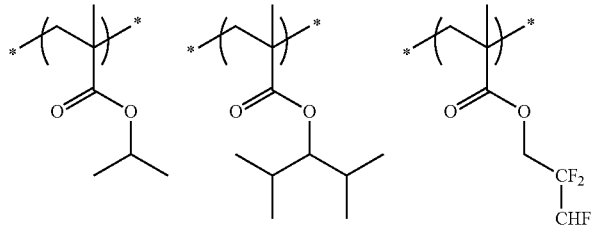

(4b)

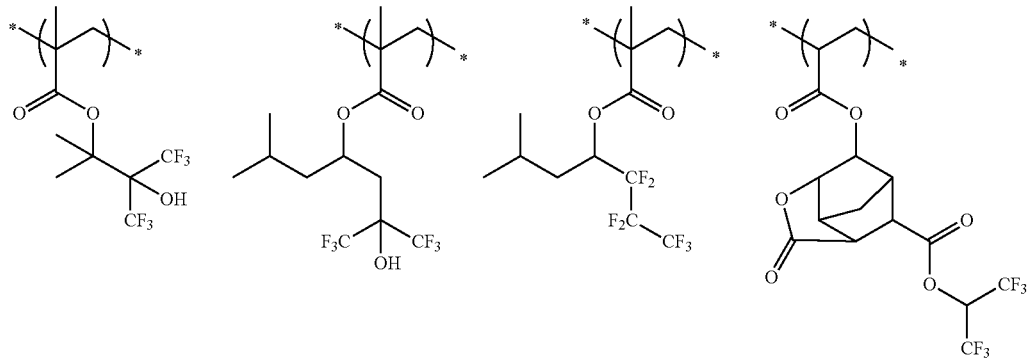

(5b)

In a case where the resist composition contains the hydrophobic resin, the content of the hydrophobic resin with respect to the total solid content of the composition is preferably 0.01% to 20% by mass, and more preferably 0.1% to 15% by mass.

(Solvent)

The actinic ray-sensitive or radiation-sensitive resin composition may contain a solvent. As the solvent, known solvents can be used without particular limitation.

The solvent to be incorporated into the actinic ray-sensitive or radiation-sensitive resin composition may be the same as or different from the organic solvent to be incorporated into the mixture in the chemical liquid described above.

The content of the solvent in the actinic ray-sensitive or radiation-sensitive resin composition is not particularly limited. However, generally, it is preferable that the solvent is incorporated into the composition such that the total solid content of the actinic ray-sensitive or radiation-sensitive resin composition is adjusted to be 0.1% to 20% by mass. One kind of solvent may be used singly, or two or more kinds of solvents may be used in combination. In a case where two or more kinds of solvents are used in combination, the total content thereof is preferably within the above range.

Examples of the solvent include the solvents described in JP2016-057614A, JP2014-219664A, JP2016-138219A, and JP2015-135379A.

(Other Additives)

If necessary, the actinic ray-sensitive or radiation-sensitive resin composition may additionally contain a surfactant, an acid proliferation agent, a dye, a plasticizer, a photosensitizer, a light absorber, an alkali-soluble resin other than the above resins, and/or a dissolution inhibitor.

[(C) Exposure Step]

The exposure step is a step of exposing the resist film. As the method for exposing the resist film, known methods can be used without particular limitation.

Examples of the method for exposing the resist film include a method of irradiating the resist film with actinic rays or radiation through a predetermined mask. In a case where the method of irradiating the resist film with electron beams is used, the resist film may be irradiated without the intervention of a mask (this is referred to as "direct imaging" as well in some cases).

The actinic rays or the radiation used for exposure is not particularly limited, and examples thereof include a KrF excimer laser, an ArF excimer laser, Extreme Ultra Violet (EUV), Electron Beam (EB), and the like. Among these, EUV or EB is preferable. The exposure may be immersion exposure.

<Post Exposure Bake (PEB) Step>

It is preferable that the aforementioned pattern forming method additionally includes a Post Exposure Bake (PEB) step of baking the exposed resist film between the exposure step and the development step. By the baking, the reaction in the exposed portion is accelerated, and either or both of sensitivity and pattern shape are further improved.

The heating temperature is preferably 80° C. to 150° C., more preferably 80° C. to 140° C., and even more preferably 80° C. to 130° C.

The heating time is preferably 30 to 1,000 seconds, more preferably 60 to 800 seconds, and even more preferably 60 to 600 seconds.

The heating can be performed by means comprising a general exposure•development machine, or may be performed using a hot plate or the like.

[(D) Development Step]

The development step is a step of developing the exposed resist film (hereinafter, referred to as "resist film obtained after exposure" as well) by using a developer.

As the development method, known development methods can be used without particular limitation. Examples of the development method include dipping method, a puddle method, a spray method, a dynamic dispense method, and the like.

Furthermore, the aforementioned pattern forming method may additionally include a step of substituting the developer with another solvent so as to stop the development after the development step.

The development time is not particularly limited, but is preferably 10 to 300 seconds in general and more preferably 10 to 120 seconds. The temperature of the developer is preferably 0° C. to 50° C., and more preferably 15° C. to 35° C. In the pattern forming method, the development step may be performed at least once or plural times.

<Developer>

As the developer, known developers can be used without particular limitation. Examples of the developer include an alkaline developer and a developer containing an organic solvent (organic developer).

In the development step, both the development using a developer containing an organic solvent and development using an alkaline developer may be performed (so-called double development may be performed).

<Rinsing Step>

It is preferable that the aforementioned pattern forming method additionally includes a rinsing step after the development step.

The rinsing step is a step of washing the wafer, which comprises the resist film obtained after development, by using a rinsing solution.

As the washing method, known washing methods can be used without particular limitation. Examples thereof include a rotation jetting method, a dipping method, a spray method, and the like.

Among these, it is preferable to use the rotation jetting method in which the wafer is washed and then rotated at a rotation speed of 2,000 to 4,000 rpm such that the rinsing solution is removed from the substrate.

The rinsing time is preferably 10 to 300 seconds in general, more preferably 10 to 180 seconds, and even more preferably 20 to 120 seconds. The temperature of the rinsing solution is preferably 0° C. to 50° C., and more preferably 15° C. to 35° C.

(Rinsing Solution)

In a case where the wafer comprising the resist film is rinsed after the development using an alkaline developer, as the rinsing solution, pure water is preferable. The rinsing solution may be pure water containing a surfactant.

In a case where the wafer comprising the resist film is rinsed after the development using an organic developer, as the rinsing solution, a rinsing solution containing an organic solvent is preferable. As the organic solvent contained in the rinsing solution, for example, at least one kind of organic solvent selected from the group consisting of a hydrocarbon-based solvent, a ketone-based solvent, an ester-based solvent, an alcohol-based solvent, an amide-based solvent, and an ether-based solvent is preferable, at least one kind of organic solvent selected from the group consisting of a hydrocarbon-based solvent, an ether-based solvent, and a ketone-based solvent is more preferable, and at least one kind of organic solvent selected from the group consisting of a hydrocarbon-based solvent and an ether-based solvent is even more preferable.

In a case where the developer containing an organic solvent is used in the development step, the aforementioned pattern forming method may include the rinsing step after the development step. However, from the viewpoint of throughput (productivity), the pattern forming method may not include the rinsing step.

As the pattern forming method that does not include a rinsing step, for example, the description in paragraphs [0014] to [0086] in JP2015-216403A can be cited, and the contents thereof are incorporated into the present specification.

As the rinsing solution, methyl isobutyl carbinol (MIBC) or the same liquid (particularly, butyl acetate) as the developer is also preferable.

<Other Steps>

The aforementioned pattern forming method may include other steps in addition to the steps described above. Examples of those other steps include a washing step using a supercritical fluid, a heating step, and the like.

(Removing Step Using Supercritical Fluid)

A removing step using a supercritical fluid is a step of removing the developer and/or the rinsing solution having adhered to the pattern surface by using a supercritical fluid after the development treatment and/or the rinsing treatment.

(Heating Step)

The heating step is a step of heating the resist film so as to remove the solvent remaining in the pattern after the development step, the rinsing step, or the removing step using a supercritical fluid.

The heating temperature is not particularly limited, but is preferably 40° C. to 160° C. in general, more preferably 50° C. to 150° C., and even more preferably 50° C. to 110° C.

The heating time is not particularly limited, but is preferably 15 to 300 seconds in general and more preferably 15 to 180 seconds.

[Kit]

The kit according to an embodiment of the present invention is a kit comprising the chemical liquid and an actinic ray-sensitive or radiation-sensitive resin composition.

The kit according to an embodiment of the present invention is a kit having the chemical liquid described above and an actinic ray-sensitive or radiation-sensitive resin composition. The aspect of the kit is not particularly limited, and examples thereof include an aspect having a chemical liquid storage body which has a first container and a chemical liquid stored in the first container and an actinic ray-sensitive or radiation-sensitive resin composition storage body which has a second container and an actinic ray-sensitive or radiation-sensitive resin composition stored in the second container. The chemical liquid and the actinic ray-sensitive or radiation-sensitive resin composition are as described above. Furthermore, as the first container and the second container, those described above as containers of the chemical liquid storage body can be used.

In the kit, the chemical liquid can be used as a prewet solution, a washing solution including the aspect of a rinsing solution, a developer, or the like. It is preferable that the chemical liquid is used as a prewet solution. That is, the chemical liquid in the kit can be used as a prewet solution, and the kit can be used for forming a resist film on a substrate, which has been pre-wetted by the chemical liquid, by the method described above by using the actinic ray-sensitive or radiation-sensitive resin composition in the kit. In a case where the kit is used, the occurrence of a defect is further inhibited.

The kit according to another embodiment of the present invention is a kit comprising the chemical liquid and an actinic ray-sensitive or radiation-sensitive resin composition containing a resin having a group generating a polar group by being decomposed by the action of an acid. The kit satisfies the following conditions 1 and 2.

Condition 1: Rsq1 calculated by Equation 1 based on a proton spin-spin relaxation time measured at 25° C. for a chemical liquid and a first test solution formed of a resin and the chemical liquid by using a pulsed nuclear magnetic resonance-type particle interface characteristic evaluator is higher than 0.5.

$$Rsq1=(\tau 0/\tau 1)-1 \quad \text{(Equation 1)}$$

In Equation 1, $\tau 0$ represents the spin-spin relaxation time of the chemical liquid, and $\tau 1$ represents the spin-spin relaxation time of the first test solution.

Condition 2: SRsq calculated by Equation 2 based on the proton spin-spin relaxation time measured at 25° C. for a second test solution, which is formed of the resin and the chemical liquid and in which the content of the resin is different from the content of the resin in the first test solution, and the first test solution by using a pulsed nuclear magnetic resonance-type particle interface characteristic evaluator is higher than −1.

$$SRsq=(Rsq2-Rsq1)/(c2-c1) \quad \text{(Equation 2)}$$

In Equation 2, Rsq1 represents a value calculated by Equation 1, and Rsq2 represents a value calculated by Equation 3. c1 and c2 represent a mass-based content of the resin in the first test solution and the second test solution respectively. The unit of the mass-based content is % by mass, and c2>c1.

$$Rsq2=(\tau 0/\tau 2)-1 \quad \text{(Equation 3)}$$

In Equation 3, $\tau 0$ has the same definition as $\tau 0$ in Equation 1, and $\tau 2$ represents a spin-spin relaxation time of the second test solution.

The above testing method is the same as what is explained in "Affinity between chemical liquid and resin" in the description of the pattern forming method. In the kit according to the above embodiment, the chemical liquid and the resin exhibit further improved affinity. Therefore, in a case where the chemical liquid in the kit is used as a prewet solution, and a resist film is formed on a substrate, which has been pre-wetted by the chemical liquid, by using the actinic ray-sensitive or radiation-sensitive resin composition, the occurrence of a defect resulting from solvent shock or the like is further inhibited.

EXAMPLES

Hereinafter, the present invention will be more specifically described based on examples. The materials, the amount and proportion of the materials used, the details of treatments, the procedure of treatments, and the like shown in the following examples can be appropriately modified as long as the gist of the present invention is maintained. Accordingly, the scope of the present invention is not limited to the following examples.

[Preparation of Organic Solvent]

In order to manufacture chemical liquids of examples and comparative examples, the following organic solvents were prepared. As each of the organic solvents, a high-purity grade with purity equal to or higher than 99% by mass was used. The abbreviation for each organic solvent is shown in the bracket.

Propylene glycol monomethyl ether (PGME)
Cyclopentanone (CyPn)
Butyl acetate (nBA)
Propylene glycol monomethyl ether acetate (PGMEA)
Cyclohexanone (CyHx)
Ethyl lactate (EL)
2-Hydroxymethyl isobutyrate (HBM)
Cyclopentanone dimethyl acetal (DBCPN)
Propylene carbonate (PC)
γ-Butyrolactone (GBL)
Dimethyl sulfoxide (DMSO)
Ethylene carbonate (EC)
1-Methyl-2-pyrrolidone (NMP)
3-Methoxymethyl propionate (MMP)
Ethylene glycol monomethyl ether acetate (EGMEA)
3-Ethoxyethyl propionate (EEP)
Anisole

[Preparation of Chemical Liquid]

Organic solvents of the types described in Table 1 were mixed together at the mass ratio described in Table 1, thereby obtaining a mixture. The obtained mixture was purified, thereby preparing a chemical liquid.

[Measurement of Content of Each Component Contained in Chemical Liquid, and the Like]

For measuring the content of each component contained in the chemical liquid, the following method was used. All of the following measurements were performed in a clean room that met the level equal to or lower than International Organization for Standardization (ISO) Class 2. In order to improve the measurement accuracy, at the time of measuring each component, in a case where the content of the component was found to be equal to or smaller than a detection limit by general measurement, the organic solvent was concentrated by 1/100 in terms of volume for performing the measurement, and the content was calculated by converting the concentration into the content of the organic solvent not yet being concentrated. The results are summarized in Table 1.

<Organic Solvent>

The content of the organic solvent and the organic impurity in each of the chemical liquids was measured using a gas chromatography mass spectrometry (tradename "GCMS-2020", manufactured by Shimadzu Corporation, the measurement conditions were as described below).

(Measurement Condition)

Capillary column: InertCap 5MS/NP 0.25 mmI.D.×30 m df=0.25 μm
Sample introduction method: slit 75 kPa constant pressure
Vaporizing chamber temperature: 230° C.
Column oven temperature: 80° C. (2 min)-500° C. (13 min) heating rate 15° C./min
Carrier gas: helium
Septum purge flow rate: 5 mL/min
Split ratio: 25:1
Interface temperature: 250° C.
Ion source temperature: 200° C.
Measurement mode: Scan m/z=85~500
Amount of sample introduced: 1

[Physical Properties of Chemical Liquid or Mixture]

The physical properties of each of the chemical liquids or the mixtures were measured or calculated by the following method.

<Surface Tension>

Based on a surface tension at 25° C. of each of the organic solvents contained in the mixture and a molar fraction of each of the organic solvents in the mixture, the surface tension of the mixture was calculated. The calculated values are shown in Table 1.

The surface tension at 25° C. of the organic solvents contained in each of the mixtures was measured using a surface tensiometer (trade name "CBVP-Z" manufactured by Kyowa Interface Science Co., LTD.).

<Hansen Solubility Parameter>

The hydrogen bond element and the dispersion element as Hansen solubility parameters of each of the organic solvents were calculated using Hansen Solubility Parameters in Practice (HSPiP). The calculated values are shown in Table 1.

<Vapor Pressure>

The vapor pressure of the mixture of the organic solvents was calculated by summing up the product of a vapor pressure (Pa) of each of the organic solvents at 25° C. and the molar fraction of each of the organic solvents in the mixture. The calculated values are shown in Table 1.

[Preparation of Actinic Ray-Sensitive or Radiation-Sensitive Resin Composition]

By the following method, actinic ray-sensitive or radiation-sensitive resin (resist) compositions were prepared. By mixing together components and then filtering the mixture through a polyethylene filter having a pore size of 0.03 μm, the resist compositions were prepared. Hereinafter, each of the actinic ray-sensitive or radiation-sensitive resin compositions 1 to 6 will be described.

<Resist Composition 1>

Acid-decomposable resin (resin represented by the following formula (weight-average molecular weight (Mw): 7,500): the numerical value described for each repeating unit means mol %): 100 parts by mass

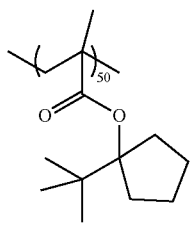
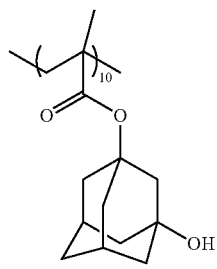
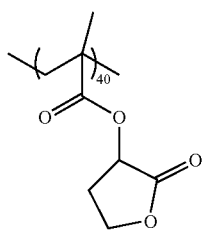

Photoacid generator shown below: 8 parts by mass

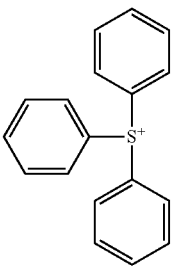
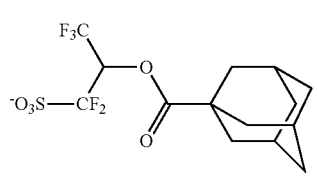

Quenchers shown below: 5 parts by mass (the mass ratio is 0.1:0.3:0.3:0.2 from left to right).

Among the following quenchers, a polymer-type quencher has a weight-average molecular weight (Mw) of 5,000. The numerical value described for each repeating unit means molar ratio.

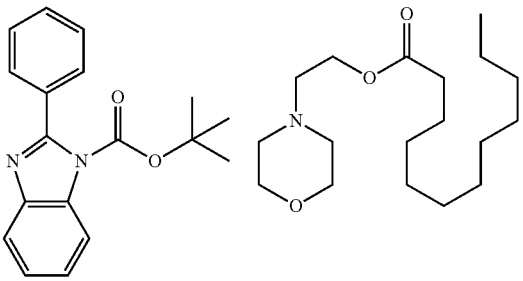

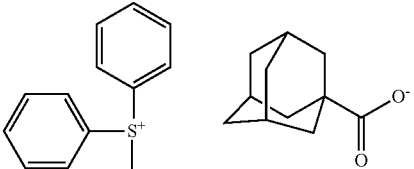

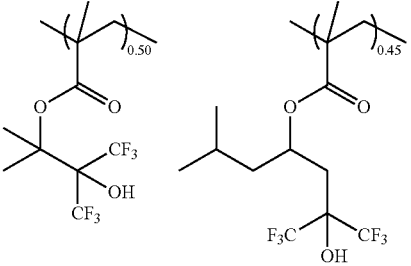

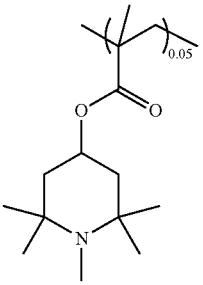
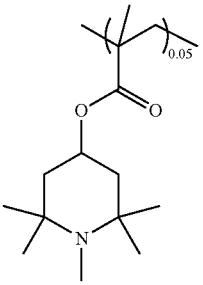

Hydrophobic resins shown below: 4 parts by mass (the mass ratio is 0.5:0.5 from left to right).

Between the following hydrophobic resins, the hydrophobic resin on the left side has a weight-average molecular weight (Mw) of 7,000, and the hydrophobic resin on the right side has a weight-average molecular weight (Mw) of 8,000. In each of the hydrophobic resins, the numerical value described for each repeating unit means molar ratio.

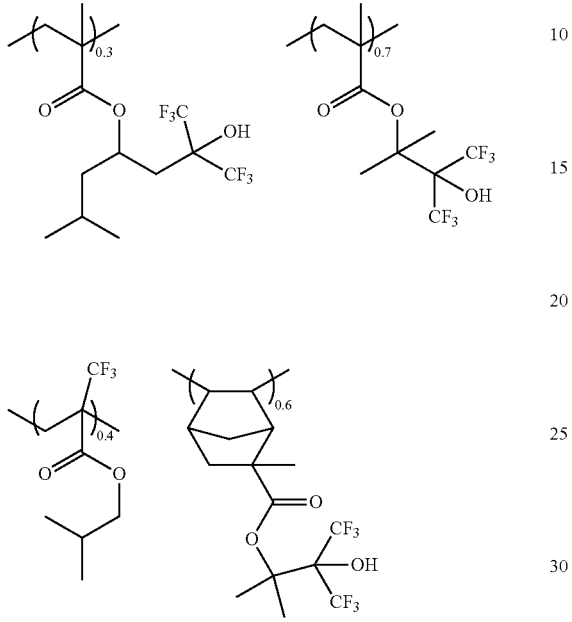

Solvent:
  Propylene glycol monomethyl ether acetate (PGMEA): 3 parts by mass
  Cyclohexanone: 600 parts by mass
  γ-Butyrolactone (γ-BL): 100 parts by mass <Resist Composition 2>

Acid-decomposable resin (resin represented by the following formula (weight-average molecular weight (Mw): 8,000): the numerical value described for each repeating unit means mol %): 100 parts by mass

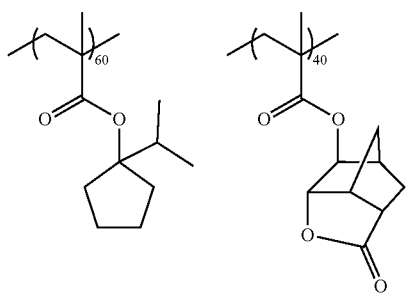

Photoacid generators shown below: 12 parts by mass (the mass ratio is 0.5:0.5 from left to right)

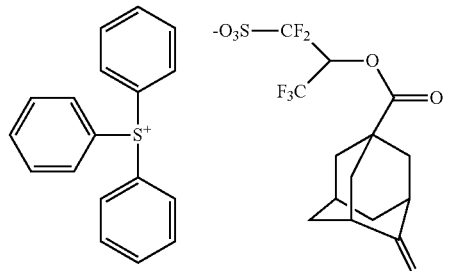

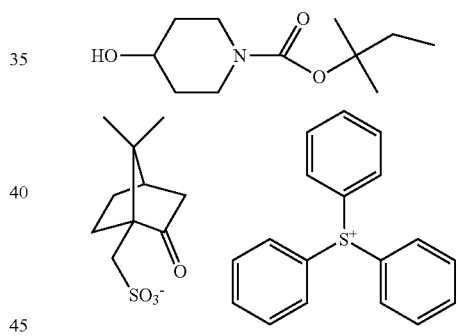

Quenchers shown below: 5 parts by mass (mass ratio is 0.3:0.7 from left to right.)

Hydrophobic resins shown below: 5 parts by mass (the mass ratio is 0.8:0.2 from top to bottom).

Between the following hydrophobic resins, the upper hydrophobic resin has a weight-average molecular weight (Mw) of 8,000, and the lower hydrophobic resin has a weight-average molecular weight (Mw) of 6,000. In each of the hydrophobic resins, the numerical value described for each repeating unit means molar ratio.

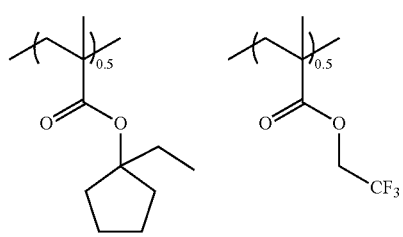

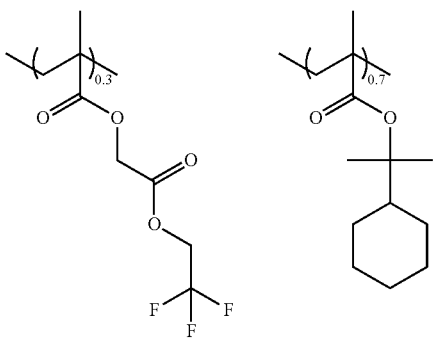

Solvent:
  Propylene glycol monomethyl ether acetate (PGMEA): 3 parts by mass
  Cyclohexanone: 600 parts by mass
  γ-Butyrolactone (γ-BL): 100 parts by mass <Resist Composition 3>

Acid-decomposable resin (resin represented by the following formula (weight-average molecular weight (Mw): 8,000): the numerical value described for each repeating unit means mol %): 100 parts by mass

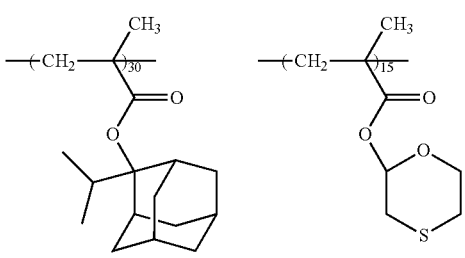

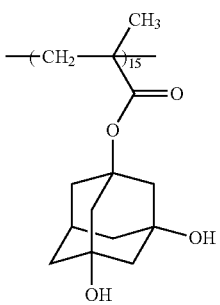

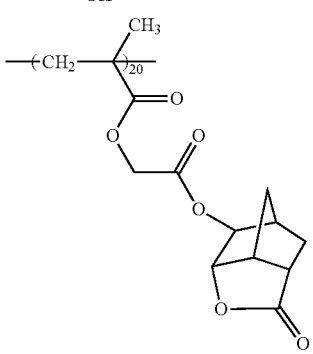

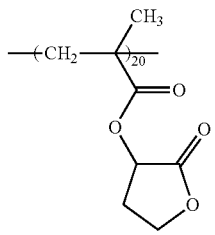

Photoacid generator shown below: 15 parts by mass

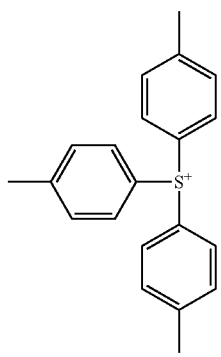

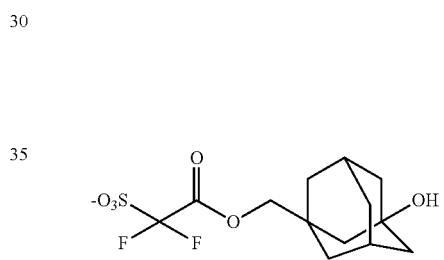

Quenchers shown below: 7 parts by mass (the mass ratio is 1:1 from left to right.)

Hydrophobic resins shown below: 20 parts by mass (the mass ratio is 3:7 from top to bottom.)

Between the following hydrophobic resins, the upper hydrophobic resin has a weight-average molecular weight (Mw) of 10,000, and the lower hydrophobic resin has a weight-average molecular weight (Mw) of 7,000. In the lower hydrophobic resin, the molar ratio of each of the repeating units is 0.67:0.33 from left to right.

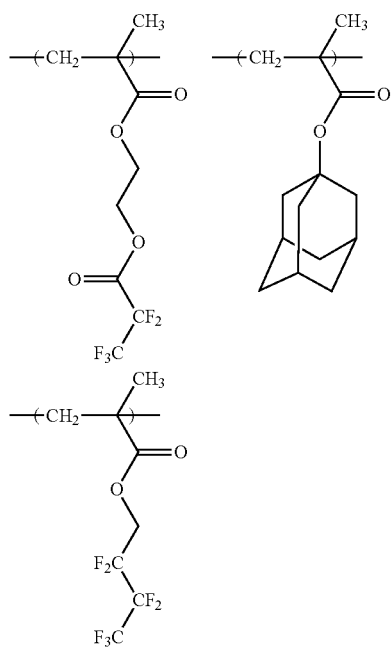

Solvent:
  Propylene glycol monomethyl ether acetate (PGMEA): 50 parts by mass
  Propylene glycol monomethyl ether (PGME): 100 parts by mass
  2-Heptanone: 100 parts by mass
  γ-Butyrolactone (γ-BL): 500 parts by mass <Resist Composition 4>
Resin having repeating unit represented by the following formula: 2.9% by mass with respect to total mass of resist composition

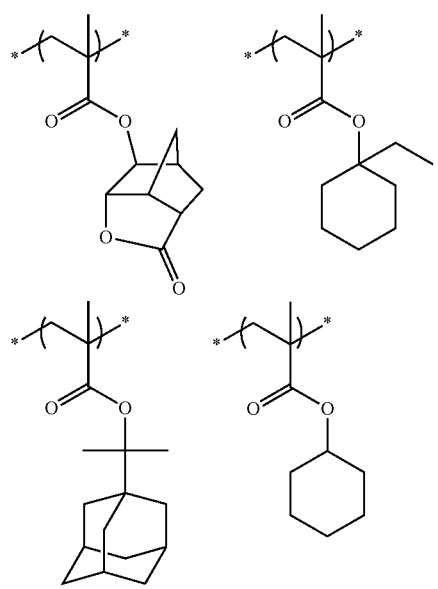

Photoacid generator shown below: 0.2% by mass with respect to total mass of resist composition

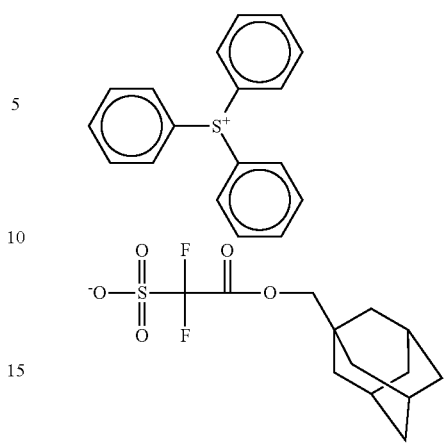

Photoacid generator shown below: 0.1% by mass with respect to total mass of resist composition

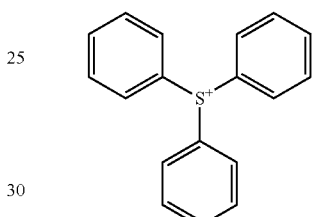

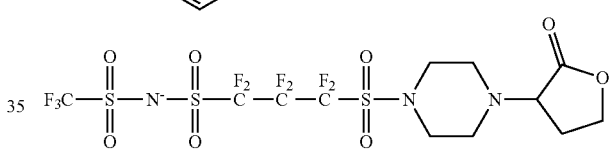

Hydrophobic resin having repeating units shown below: 0.02% by mass with respect to total mass of resist composition

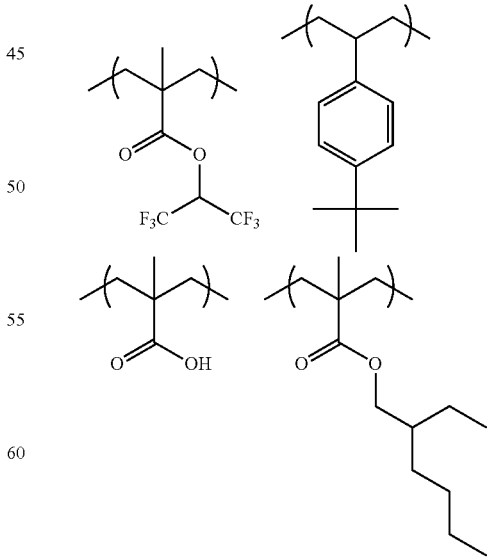

Quencher shown below: 0.25% by mass with respect to total mass of resist composition

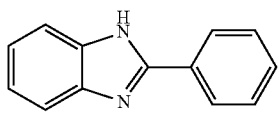 [SMILES: c1ccc(-c2nc3ccccc3[nH]2)cc1]

PGMEA: 67.7% by mass with respect to total mass of resist composition

CyHx: balance with respect to total mass of resist composition

<Resist Composition 5>

Resin having repeating units shown below (molar ratio of each of the repeating units is 10/30/10/35/15 from left): 2.8% by mass with respect to total mass of resist composition

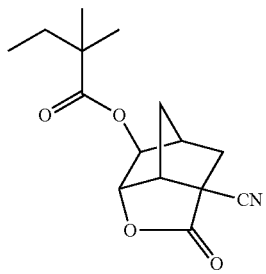

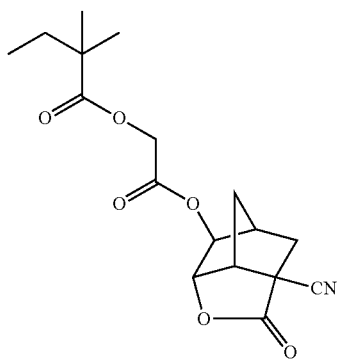

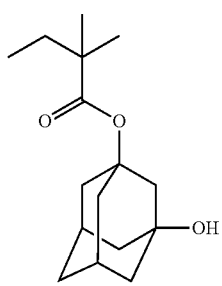

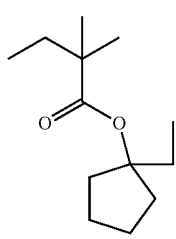

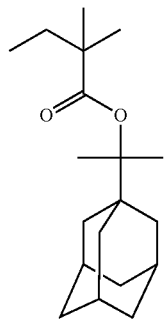

Hydrophobic resin having repeating units represented by the following formulae (molar ratio of each of the repeating units is 90/8/2 from left): 0.14% by mass with respect to total mass of resist composition

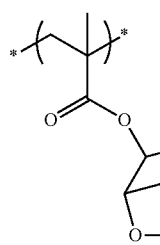

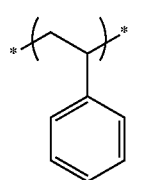

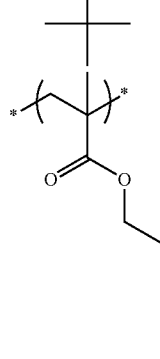

Photoacid generator shown below: 0.37% by mass with respect to total mass of resist composition

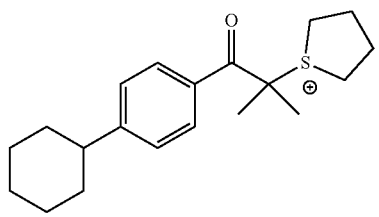

-continued

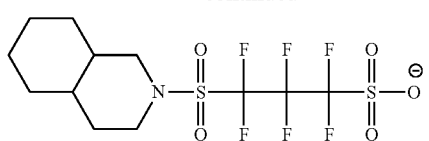

Photoacid generator shown below: 0.21% by mass with respect to total mass of resist composition

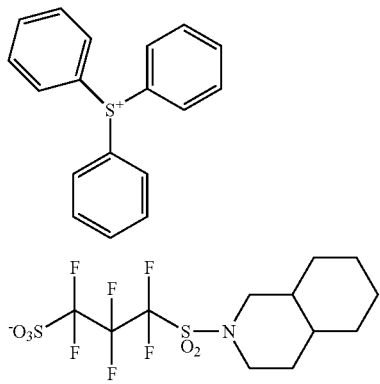

Quencher shown below: 0.026% by mass with respect to total mass of resist composition

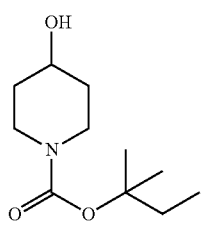

PGMEA: 93% by mass with respect to total mass of resist composition

GBL: balance with respect to total mass resist composition

<Resist Composition 6>

Resin having repeating units represented by the following formulae (a molar ratio of each of the repeating units is 63.33/25.25/11.49 from left, Mw is about 21,000): 13% by mass with respect to total mass of resist composition

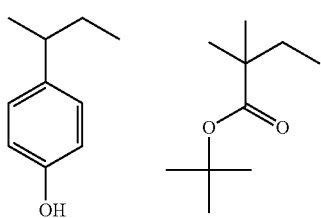

-continued

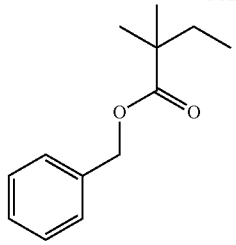

Photoacid generator shown below: 0.32% by mass with respect to total mass of resist composition

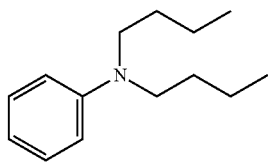

Quencher shown below: 0.018% by mass with respect to total mass of resist composition

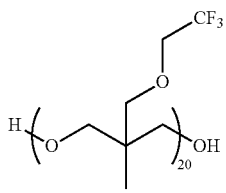

Compound shown below: 0.005% by mass with respect to total mass of resist composition

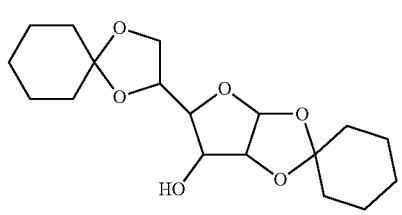 [SMILES: OC1C(C2COC3(CCCCC3)O2)OC2OC3(CCCCC3)OC21]

Compound shown below: 0.57% by mass with respect to total mass of resist composition PGMEA: 68% by mass with respect to total mass of resist composition 3-Ethoxyethyl propionate: balance with respect to total mass of resist composition Each of the above resist compositions was used after the above components were mixed together and then filtered through a filter made of UPE (ultra-high-molecular-weight polyethylene) having a pore size of 0.1 μm and a filter made of nylon having a pore size of 0.04

The weight-average molecular weight (Mw) of each of the resist compositions is a value determined by a GPC method by using tetrahydrofuran (THF) as a developing solvent and expressed in terms of polystyrene.

Specifically, the following device was used.

Device: HLC-8120 manufactured by Tosoh Corporation

Column: TSK gel Multipore HXL-M manufactured by Tosoh Corporation

[Affinity Between Chemical Liquid and Acid-Decomposable Resin]

The affinity between each of the chemical liquids and the resin was measured using a pulsed nuclear magnetic resonance-type particle interface characteristic evaluator (trade name: include "Acorn Area", manufactured by Xigo Nanotools).

As a first test solution, a solution was used which was obtained by dissolving the acid-decomposable resin contained in each of the actinic ray-sensitive or radiation-sensitive resin compositions in each of the chemical liquids at 0.5%.

As a second test solution, a solution was used which was obtained by dissolving the acid-decomposable resin contained in each of the actinic ray-sensitive or radiation-sensitive resin compositions in each of the chemical liquids at 3.0%.

For each of the solutions, τ0, τ1, and τ2 were determined under the condition of 25° C., and Rsq1 and SRsq were calculated. The results were classified based on the following standards, and shown in Table 1.

Rsq1
  A: Rsq1 was higher than 0.5.
  B: Rsq1 was equal to or lower than 0.5.
SRsq
  A: SRsq was higher than −1.
  B: SRsq was equal to or lower than −1.

[Evaluation of Defect Inhibition Performance of Chemical Liquid]

The defect inhibition performance of the chemical liquid was evaluated by the following method. For the following test, a coater/developer "RF$^{3S}$" manufactured by SOKUDO Co., Ltd was used.

First, a bare silicon substrate (silicon wafer) having a diameter of about 300 mm (12 inches) was prepared. Then, the silicon wafer was coated with an antireflection film composition and baked for 60 seconds at 200° C., thereby forming an antireflection film (thickness: 89 nm). Thereafter, each of the chemical liquids was added dropwise to the antireflection film, and the antireflection film was continuously coated with an actinic ray-sensitive or radiation-sensitive resin composition and baked for 60 seconds at 90° C., thereby forming a resist film having a thickness of 85 nm. Subsequently, the resist film was exposed and baked for 60 seconds at 100° C. Then, the resist film obtained after exposure was developed using an organic solvent-based developer. The resist film obtained after development was baked for 60 seconds at 100° C., thereby obtaining a pattern. By using a wafer inspection device "UVision 5" manufactured by Applied Materials, Inc., the image of the pattern was captured, and the obtained image was analyzed using a full automatic defect review device "SEMVision G4" manufactured by Applied Materials, Inc., thereby counting the number of pattern defects per unit area. In the present specification, the number of pattern defects means the number of residues in an unexposed portion (described as "Residue in unexposed portion" in Table 1), the number of defects in the form of bridge between patterns (number of BRIDGE defects, described as "BRIDGE" in Table 1), and the number of sites where pattern collapse occurs (described as "Pattern collapse" in Table 1). Table 1 shows the results evaluated based on the following standards.

AA: The number of pattern defects was less than 30.
A: The number of pattern defects was equal to or greater than 30 and less than 60.
B: The number of pattern defects was equal to or greater than 60 and less than 90.
C: The number of pattern defects was equal to or greater than 90 and less than 120.
D: The number of pattern defects was equal to or greater than 120.

[Resist Saving Properties of Resist Composition]

The resist saving properties of the resist composition after the coating of the chemical liquid were evaluated by the following method. In the present specification, having excellent resist saving properties means that the uniformity and the film thickness controllability are excellent.

<Uniformity>

First, as a control, a silicon wafer comprising an antireflection film and having a diameter of about 30 cm (12 inches) was directly coated with the resist composition. The coating was performed using a spin coater (trade name: "LITHIUS", manufactured by Tokyo Electron Limited). The obtained resist film was baked at 90° C. For the baked resist film, a 59-point map was measured using a film thickness measurement apparatus Lambda Ace manufactured by SCREEN Holdings Co., Ltd. so as to confirm that no coating mottle occurred. For checking the coating mottle, 59 circular measurement spots were extracted from the resist film to be measured, the thickness of the resist film was measured at each of the measurement spots, and the measured thicknesses were two-dimensionally arranged for the respective measurement spots and observed. At this time, in a case where no unevenness was found in the resist film thickness, it was considered that there was no coating mottle.

Then, another silicon wafer comprising an antireflection film and having a diameter of about 30 cm (12 inches) was prepared, and each of the chemical liquids was added dropwise thereto. Thereafter, the wafer was coated with the same amount of the resist composition used for the control, and baked at 90° C. The obtained resist film was observed by the same method as described above so as to confirm that no coating mottle occurred. Subsequently, the same test as above was performed by reducing the amount of the used resist composition such that the amount of the resist composition became 50% by mass and 30% by mass of the amount of the resist composition used for the control, and whether the coating mottle occurred was investigated.

The results were evaluated based on the following standards, and shown in Table 2.

A: Even though the amount of the used resist composition was reduced and became 30% by mass and 50% by mass of the amount of the resist composition used for the control, no coating mottle occurred.

B: Even though the amount of the used resist composition was reduced and became 50% by mass of the amount of the resist composition used for the control, no coating mottle occurred. However, in a case where the amount of the used resist composition was reduced and became 30% by mass of the amount of the resist composition used for the control, a coating mottle occurred.

C: In a case where the amount of the used resist composition was reduced and became 30% by mass and 50% by mass of the amount of the resist composition used for the control, a coating mottle occurred.

<Film Thickness Controllability>

Each of the chemical liquids was added dropwise to a silicon wafer comprising an antireflection film and having a diameter of about 30 cm (12 inches). Then, the wafer was directly coated with the aforementioned resist composition such that the thickness of the obtained resist film became 8.5 nm. The coating was performed using a spin coater (trade name: "LITHIUS", manufactured by Tokyo Electron Limited). The obtained resist film was baked at 90° C. For the baked resist film, a 59-point map was measured using a film thickness measurement apparatus Lambda Ace manufactured by SCREEN Holdings Co., Ltd., and a standard deviation (hereinafter, referred to as "σ" as well) of the thickness of the resist film was determined. Subsequently, from the standard deviation, 3σ was determined. The results were evaluated based on the following standards, and shown in Table 1.

A: 3σ was less than 0.15 nm.

B: 3σ was equal to or greater than 0.15 nm and less than 0.2 nm.

C: 3σ was equal to or greater than 0.2 nm.

TABLE 1-1-1

| | Chemical liquid Composition of mixture First organic solvent | | | | | | |
|---|---|---|---|---|---|---|---|
| | Type | Content (% by mass) | Molar mass (g/mol) | Vapor pressure (Pa) | Surface tension (mN/m) | δh $(MPa)^{0.5}$ | δd $(MPa)^{0.5}$ |
| Example 1 | DBCPN | 95 | 130.2 | 400 | 30.2 | 4.2 | 16.6 |
| Example 2 | HBM | 95 | 118.1 | 360 | 29.1 | 12.2 | 16.5 |
| Example 3 | EL | 95 | 118.1 | 333 | 29.8 | 12.5 | 16.0 |
| Example 4 | | | | | | | |
| Example 5 | | | | | | | |
| Example 6 | | | | | | | |
| Example 7 | HBM | 95 | 118.1 | 360 | 29.1 | 12.2 | 16.5 |
| Example 8 | EL | 95 | 118.1 | 333 | 29.8 | 12.5 | 16.0 |
| Example 9 | CyHx | 70 | 98.1 | 507 | 34.1 | 5.1 | 17.8 |
| Example 10 | PGMEA | 90 | 132.2 | 493 | 27.9 | 9.8 | 15.6 |
| Example 11 | PGMEA | 95 | 132.2 | 493 | 27.9 | 9.8 | 15.6 |
| Example 12 | MMP | 95 | 98.1 | 320 | 30.2 | 8.1 | 15.9 |
| Example 13 | MMP | 97 | 98.1 | 320 | 30.2 | 8.1 | 15.9 |
| Example 14 | | | | | | | |
| Example 15 | | | | | | | |
| Example 16 | | | | | | | |
| Example 17 | | | | | | | |
| Example 18 | CyHx | 95 | 98.1 | 507 | 34.1 | 5.1 | 17.8 |
| Example 19 | HBM | 95 | 118.1 | 360 | 29.1 | 12.2 | 16.5 |
| Example 20 | EL | 95 | 118.1 | 333 | 29.8 | 12.5 | 16.0 |
| Example 21 | PGMEA | 80 | 132.2 | 493 | 27.9 | 9.8 | 15.6 |
| Example 22 | PGMEA | 85 | 132.2 | 493 | 27.9 | 9.8 | 15.6 |
| Example 23 | PGMEA | 90 | 132.2 | 493 | 27.9 | 9.8 | 15.6 |
| Example 24 | PGMEA | 93 | 132.2 | 493 | 27.9 | 9.8 | 15.6 |
| Example 25 | MMP | 95 | 98.1 | 320 | 30.2 | 8.1 | 15.9 |
| Example 26 | MMP | 97 | 98.1 | 320 | 30.2 | 8.1 | 15.9 |
| Example 27 | DBCPN | 80 | 130.2 | 400 | 30.2 | 4.2 | 16.6 |
| Example 28 | | | | | | | |
| Example 29 | | | | | | | |
| Example 30 | HBM | 95 | 118.1 | 360 | 29.1 | 12.2 | 16.5 |
| Example 31 | EL | 95 | 118.1 | 333 | 29.8 | 12.5 | 16.0 |
| Example 32 | CyHx | 80 | 98.1 | 507 | 34.1 | 5.1 | 17.8 |
| Example 33 | PGMEA | 80 | 132.2 | 493 | 27.9 | 9.8 | 15.6 |
| Example 34 | | | | | | | |
| Example 35 | | | | | | | |
| Example 36 | HBM | 95 | 118.1 | 360 | 29.1 | 12.2 | 16.5 |
| Example 37 | EL | 95 | 118.1 | 333 | 29.8 | 12.5 | 16.0 |
| Example 38 | CyHx | 80 | 98.1 | 507 | 34.1 | 5.1 | 17.8 |
| Example 39 | PGMEA | 80 | 132.2 | 493 | 27.9 | 9.8 | 15.6 |
| Example 40 | DBCPN | 80 | 130.2 | 400 | 30.2 | 4.2 | 16.6 |

TABLE 1-1-2

| | Chemical liquid Composition of mixture First organic solvent | | | | | | |
|---|---|---|---|---|---|---|---|
| | Type | Content (% by mass) | Molar mass (g/mol) | Vapor pressure (Pa) | Surface tension (mN/m) | δh (MPa)$^{0.5}$ | δd (MPa)$^{0.5}$ |
| Example 1 | | | | | | | |
| Example 2 | | | | | | | |
| Example 3 | | | | | | | |
| Example 4 | | | | | | | |
| Example 5 | | | | | | | |
| Example 6 | | | | | | | |
| Example 7 | | | | | | | |
| Example 8 | | | | | | | |
| Example 9 | | | | | | | |
| Example 10 | | | | | | | |
| Example 11 | | | | | | | |
| Example 12 | | | | | | | |
| Example 13 | | | | | | | |
| Example 14 | | | | | | | |
| Example 15 | | | | | | | |
| Example 16 | | | | | | | |
| Example 17 | | | | | | | |
| Example 18 | | | | | | | |
| Example 19 | | | | | | | |
| Example 20 | | | | | | | |
| Example 21 | | | | | | | |
| Example 22 | | | | | | | |
| Example 23 | | | | | | | |
| Example 24 | | | | | | | |
| Example 25 | | | | | | | |
| Example 26 | | | | | | | |
| Example 27 | | | | | | | |
| Example 28 | | | | | | | |
| Example 29 | | | | | | | |
| Example 30 | | | | | | | |
| Example 31 | | | | | | | |
| Example 32 | | | | | | | |
| Example 33 | | | | | | | |
| Example 34 | | | | | | | |
| Example 35 | | | | | | | |
| Example 36 | | | | | | | |
| Example 37 | | | | | | | |
| Example 38 | | | | | | | |
| Example 39 | | | | | | | |
| Example 40 | | | | | | | |

TABLE 1-1-3

| | Chemical liquid Composition of mixture First organic solvent | | | | | | |
|---|---|---|---|---|---|---|---|
| | Type | Content (% by mass) | Molar mass (g/mol) | Vapor pressure (Pa) | Surface tension (mN/m) | δh (MPa)$^{0.5}$ | δd (MPa)$^{0.5}$ |
| Example 1 | | | | | | | |
| Example 2 | | | | | | | |
| Example 3 | | | | | | | |
| Example 4 | | | | | | | |
| Example 5 | | | | | | | |
| Example 6 | | | | | | | |
| Example 7 | | | | | | | |
| Example 8 | | | | | | | |
| Example 9 | | | | | | | |
| Example 10 | | | | | | | |
| Example 11 | | | | | | | |
| Example 12 | | | | | | | |
| Example 13 | | | | | | | |
| Example 14 | | | | | | | |
| Example 15 | | | | | | | |
| Example 16 | | | | | | | |
| Example 17 | | | | | | | |
| Example 18 | | | | | | | |
| Example 19 | | | | | | | |

TABLE 1-1-3-continued

| | Chemical liquid Composition of mixture First organic solvent | | | | | | |
|---|---|---|---|---|---|---|---|
| | Type | Content (% by mass) | Molar mass (g/mol) | Vapor pressure (Pa) | Surface tension (mN/m) | δh (MPa)$^{0.5}$ | δd (MPa)$^{0.5}$ |
| Example 20 | | | | | | | |
| Example 21 | | | | | | | |
| Example 22 | | | | | | | |
| Example 23 | | | | | | | |
| Example 24 | | | | | | | |
| Example 25 | | | | | | | |
| Example 26 | | | | | | | |
| Example 27 | | | | | | | |
| Example 28 | | | | | | | |
| Example 29 | | | | | | | |
| Example 30 | | | | | | | |
| Example 31 | | | | | | | |
| Example 32 | | | | | | | |
| Example 33 | | | | | | | |
| Example 34 | | | | | | | |
| Example 35 | | | | | | | |
| Example 36 | | | | | | | |
| Example 37 | | | | | | | |
| Example 38 | | | | | | | |
| Example 39 | | | | | | | |
| Example 40 | | | | | | | |

TABLE 1-1-4

| | Chemical liquid Composition of mixture Second organic solvent | | | | | | |
|---|---|---|---|---|---|---|---|
| | Type | Content (% by mass) | Molar mass (g/mol) | Vapor pressure (Pa) | Surface tension (mN/m) | δh (MPa)$^{0.5}$ | δd (MPa)$^{0.5}$ |
| Example 1 | | | | | | | |
| Example 2 | | | | | | | |
| Example 3 | | | | | | | |
| Example 4 | CyPn | 30 | 84.1 | 1,520 | 33.8 | 4.8 | 17.8 |
| Example 5 | nBA | 50 | 116.2 | 1,200 | 24.8 | 6.3 | 15.8 |
| Example 6 | nBA | 80 | 116.2 | 1,200 | 24.8 | 6.3 | 15.8 |
| Example 7 | | | | | | | |
| Example 8 | | | | | | | |
| Example 9 | | | | | | | |
| Example 10 | | | | | | | |
| Example 11 | | | | | | | |
| Example 12 | | | | | | | |
| Example 13 | | | | | | | |
| Example 14 | nBA | 60 | 116.2 | 1,200 | 24.8 | 6.3 | 15.8 |
| Example 15 | PGME | 50 | 90.1 | 1,453 | 27.6 | 13.3 | 16.4 |
| Example 16 | CyPn | 50 | 84.1 | 1,520 | 33.8 | 4.8 | 17.8 |
| Example 17 | CyPn | 10 | 84.1 | 1,520 | 33.8 | 4.8 | 17.8 |
| Example 18 | | | | | | | |
| Example 19 | | | | | | | |
| Example 20 | | | | | | | |
| Example 21 | | | | | | | |
| Example 22 | | | | | | | |
| Example 23 | | | | | | | |
| Example 24 | | | | | | | |
| Example 25 | | | | | | | |
| Example 26 | | | | | | | |
| Example 27 | | | | | | | |
| Example 28 | PGME | 50 | 90.1 | 1,453 | 27.6 | 13.3 | 16.4 |
| Example 29 | CyPn | 50 | 84.1 | 1,520 | 33.8 | 4.8 | 17.8 |
| Example 30 | | | | | | | |
| Example 31 | | | | | | | |
| Example 32 | | | | | | | |
| Example 33 | | | | | | | |
| Example 34 | PGME | 50 | 90.1 | 1,453 | 27.6 | 13.3 | 16.4 |
| Example 35 | CyPn | 50 | 84.1 | 1,520 | 33.8 | 4.8 | 17.8 |
| Example 36 | | | | | | | |
| Example 37 | | | | | | | |
| Example 38 | | | | | | | |

TABLE 1-1-4-continued

| | Chemical liquid Composition of mixture Second organic solvent | | | | | | |
|---|---|---|---|---|---|---|
| | Type | Content (% by mass) | Molar mass (g/mol) | Vapor pressure (Pa) | Surface tension (mN/m) | δh (MPa)$^{0.5}$ | δd (MPa)$^{0.5}$ |
| Example 39 | | | | | | | |
| Example 40 | | | | | | | |

TABLE 1-1-5

| | Chemical liquid Composition of mixture Third organic solvent | | | | | | | Ether-based compound |
|---|---|---|---|---|---|---|---|---|
| | Type | Content (% by mass) | Molar mass (g/mol) | Vapor pressure (Pa) | Surface tension (mN/m) | δh (Mpa)$^{0.5}$ | δd (Mpa)$^{0.5}$ | Content (mass ppm) |
| Example 1 | GBL | 5 | 86.1 | 147 | 44.1 | 7.0 | 17.4 | 0 |
| Example 2 | GBL | 5 | 86.1 | 147 | 44.1 | 7.0 | 17.4 | 0 |
| Example 3 | GBL | 5 | 86.1 | 147 | 44.1 | 7.0 | 17.4 | 0 |
| Example 4 | GBL | 70 | 86.1 | 147 | 44.1 | 7.0 | 17.4 | 0 |
| Example 5 | GBL | 50 | 86.1 | 147 | 44.1 | 7.0 | 17.4 | 0 |
| Example 6 | GBL | 20 | 86.1 | 147 | 44.1 | 7.0 | 17.4 | 0 |
| Example 7 | DMSO | 5 | 78.1 | 13 | 43.6 | 10.2 | 18.4 | 0 |
| Example 8 | DMSO | 5 | 78.1 | 13 | 43.6 | 10.2 | 18.4 | 0 |
| Example 9 | DMSO | 30 | 78.1 | 13 | 43.6 | 10.2 | 18.4 | 0 |
| Example 10 | DMSO | 10 | 78.1 | 13 | 43.6 | 10.2 | 18.4 | 0 |
| Example 11 | DMSO | 5 | 78.1 | 13 | 43.6 | 10.2 | 18.4 | 0 |
| Example 12 | DMSO | 5 | 78.1 | 13 | 43.6 | 10.2 | 18.4 | 0 |
| Example 13 | DMSO | 3 | 78.1 | 13 | 43.6 | 10.2 | 18.4 | 0 |
| Example 14 | DMSO | 40 | 78.1 | 13 | 43.6 | 10.2 | 18.4 | 0 |
| Example 15 | DMSO | 50 | 78.1 | 13 | 43.6 | 10.2 | 18.4 | 0 |
| Example 16 | DMSO | 50 | 78.1 | 13 | 43.6 | 10.2 | 18.4 | 0 |
| Example 17 | DMSO | 90 | 78.1 | 13 | 43.6 | 10.2 | 18.4 | 0 |
| Example 18 | PC | 5 | 102.1 | 53 | 40.9 | 6.5 | 17.3 | 0 |
| Example 19 | PC | 5 | 102.1 | 53 | 40.9 | 6.5 | 17.3 | 0 |
| Example 20 | PC | 5 | 102.1 | 53 | 40.9 | 6.5 | 17.3 | 0 |
| Example 21 | PC | 20 | 102.1 | 53 | 40.9 | 6.5 | 17.3 | 0 |
| Example 22 | PC | 15 | 102.1 | 53 | 40.9 | 6.5 | 17.3 | 0 |
| Example 23 | PC | 10 | 102.1 | 53 | 40.9 | 6.5 | 17.3 | 0 |
| Example 24 | PC | 7 | 102.1 | 53 | 40.9 | 6.5 | 17.3 | 0 |
| Example 25 | PC | 5 | 102.1 | 53 | 40.9 | 6.5 | 17.3 | 0 |
| Example 26 | PC | 3 | 102.1 | 53 | 40.9 | 6.5 | 17.3 | 0 |
| Example 27 | PC | 20 | 102.1 | 53 | 40.9 | 6.5 | 17.3 | 0 |
| Example 28 | PC | 50 | 102.1 | 53 | 40.9 | 6.5 | 17.3 | 0 |
| Example 29 | PC | 50 | 102.1 | 53 | 40.9 | 6.5 | 17.3 | 0 |
| Example 30 | EC | 5 | 88.1 | 67 | 41.5 | 8.0 | 18.1 | 0 |
| Example 31 | EC | 5 | 88.1 | 67 | 41.5 | 8.0 | 18.1 | 0 |
| Example 32 | EC | 20 | 88.1 | 67 | 41.5 | 8.0 | 18.1 | 0 |
| Example 33 | EC | 20 | 88.1 | 67 | 41.5 | 8.0 | 18.1 | 0 |
| Example 34 | EC | 50 | 88.1 | 67 | 41.5 | 8.0 | 18.1 | 0 |
| Example 35 | EC | 50 | 88.1 | 67 | 41.5 | 8.0 | 18.1 | 0 |
| Example 36 | NMP | 5 | 99.1 | 40 | 41.3 | 7.2 | 18.0 | 0 |
| Example 37 | NMP | 5 | 99.1 | 40 | 41.3 | 7.2 | 18.0 | 0 |
| Example 38 | NMP | 20 | 99.1 | 40 | 41.3 | 7.2 | 18.0 | 0 |
| Example 39 | NMP | 20 | 99.1 | 40 | 41.3 | 7.2 | 18.0 | 0 |
| Example 40 | NMP | 20 | 99.1 | 40 | 41.3 | 7.2 | 18.0 | 0 |

TABLE 1-1-6

| | Chemical liquid Physical properties of mixture | | | | | Resist composition | | | | |
|---|---|---|---|---|---|---|---|---|---|---|
| | | | | | | Resist saving properties | | Defect inhibition performance | | |
| | Vapor pressure | Surface tension | | Affinity | | | Film thickness | Pattern collapse | Residue in unexposed portion | BRIDGE |
| | (Pa) | (mN/m) | Type | Rsq1 | SRsq | Uniformity | controllability | | | |
| Example 1 | 381 | 31.2 | 1 | A | A | A | A | AA | AA | AA |
| Example 2 | 346 | 30.1 | 1 | A | B | A | A | AA | A | AA |
| Example 3 | 321 | 30.8 | 1 | A | B | A | A | AA | A | AA |
| Example 4 | 565 | 41.0 | 1 | A | A | A | A | AA | AA | B |
| Example 5 | 595 | 35.9 | 1 | A | A | A | A | AA | AA | B |
| Example 6 | 934 | 29.7 | 1 | A | A | A | B | AA | AA | B |
| Example 7 | 334 | 30.2 | 1 | A | B | A | A | AA | A | AA |
| Example 8 | 310 | 30.8 | 1 | A | B | A | A | AA | A | AA |
| Example 9 | 334 | 37.4 | 1 | A | A | A | A | AA | AA | A |
| Example 10 | 417 | 30.4 | 1 | A | A | A | A | AA | AA | A |
| Example 11 | 454 | 29.2 | 1 | A | A | A | A | AA | AA | AA |
| Example 12 | 301 | 31.0 | 1 | A | A | A | A | AA | AA | AA |
| Example 13 | 309 | 30.7 | 1 | A | A | A | A | AA | AA | AA |
| Example 14 | 609 | 34.2 | 1 | A | A | A | A | AA | AA | B |
| Example 15 | 682 | 36.2 | 1 | B | B | A | A | AA | B | B |
| Example 16 | 739 | 38.9 | 1 | A | A | A | A | AA | AA | B |
| Example 17 | 154 | 42.7 | 1 | A | A | A | A | A | A | B |
| Example 18 | 485 | 34.4 | 1 | A | A | A | A | AA | AA | AA |
| Example 19 | 342 | 29.8 | 1 | A | B | A | A | AA | A | AA |
| Example 20 | 317 | 30.4 | 1 | A | B | A | A | AA | A | AA |
| Example 21 | 386 | 31.1 | 1 | A | A | A | A | AA | AA | A |
| Example 22 | 411 | 30.3 | 1 | A | A | A | A | AA | AA | AA |
| Example 23 | 438 | 29.5 | 1 | A | A | A | A | AA | AA | AA |
| Example 24 | 454 | 29.1 | 1 | A | A | A | A | AA | AA | AA |
| Example 25 | 307 | 30.7 | 1 | A | A | A | A | AA | AA | AA |
| Example 26 | 312 | 30.5 | 1 | A | A | A | A | AA | AA | AA |
| Example 27 | 316 | 32.8 | 1 | A | A | A | A | AA | AA | A |
| Example 28 | 797 | 33.8 | 1 | B | B | A | A | AA | B | B |
| Example 29 | 857 | 37.0 | 1 | A | A | A | A | AA | AA | B |
| Example 30 | 341 | 29.9 | 1 | A | B | A | A | AA | B | AA |
| Example 31 | 316 | 30.6 | 1 | A | B | A | B | AA | A | AA |
| Example 32 | 411 | 35.7 | 1 | A | A | A | A | AA | AA | A |
| Example 33 | 377 | 31.6 | 1 | A | A | A | A | AA | AA | A |
| Example 34 | 752 | 34.6 | 1 | B | B | A | A | AA | B | B |
| Example 35 | 810 | 37.6 | 1 | A | A | A | A | AA | AA | B |
| Example 36 | 341 | 29.8 | 1 | A | B | A | A | AA | A | AA |
| Example 37 | 316 | 30.5 | 1 | A | B | A | A | AA | A | AA |
| Example 38 | 414 | 35.5 | 1 | A | A | A | A | AA | AA | A |
| Example 39 | 380 | 31.2 | 1 | A | A | A | A | AA | AA | A |
| Example 40 | 311 | 32.9 | 1 | A | A | A | A | AA | AA | A |

TABLE 1-1-7

| | Resist composition | | | | | | | |
|---|---|---|---|---|---|---|---|---|
| | | | | Evaluation | | | | |
| | | | | Resist saving properties | | Defect inhibition performance | | |
| | | Affinity | | | Film thickness | | Residue in unexposed | |
| | Type | Rsq1 | SRsq | Uniformity | controllability | Pattern collapse | portion | BRIDGE |
| Example 1 | 2 | A | A | A | A | AA | AA | AA |
| Example 2 | 2 | A | A | A | A | AA | AA | AA |
| Example 3 | 2 | A | A | A | A | AA | AA | AA |
| Example 4 | 2 | A | A | A | A | AA | AA | B |
| Example 5 | 2 | A | A | A | A | AA | AA | B |
| Example 6 | 2 | A | A | B | B | AA | AA | B |
| Example 7 | 2 | A | A | A | A | AA | AA | AA |
| Example 8 | 2 | A | A | A | A | AA | AA | AA |
| Example 9 | 2 | A | A | A | A | AA | AA | A |

TABLE 1-1-7-continued

| | Resist composition | | | | | | | |
|---|---|---|---|---|---|---|---|---|
| | | | | Evaluation | | | | |
| | | | | Resist saving properties | | Defect inhibition performance | | |
| | | Affinity | | | Film thickness | | Residue in unexposed | |
| | Type | Rsq1 | SRsq | Uniformity | controllability | Pattern collapse | portion | BRIDGE |
| Example 10 | 2 | A | B | A | A | AA | A | A |
| Example 11 | 2 | A | A | A | A | AA | AA | AA |
| Example 12 | 2 | A | A | A | A | AA | AA | AA |
| Example 13 | 2 | A | A | A | A | AA | AA | AA |
| Example 14 | 2 | A | A | A | A | AA | AA | B |
| Example 15 | 2 | B | B | A | A | AA | B | B |
| Example 16 | 2 | A | A | A | A | AA | AA | B |
| Example 17 | 2 | A | A | A | A | A | A | B |
| Example 18 | 2 | A | A | A | A | AA | AA | AA |
| Example 19 | 2 | A | A | A | A | AA | AA | AA |
| Example 20 | 2 | A | A | A | A | AA | AA | AA |
| Example 21 | 2 | A | B | A | A | AA | A | A |
| Example 22 | 2 | A | A | A | A | AA | AA | AA |
| Example 23 | 2 | A | A | A | A | AA | AA | AA |
| Example 24 | 2 | A | A | A | A | AA | AA | AA |
| Example 25 | 2 | A | A | A | A | AA | AA | AA |
| Example 26 | 2 | A | A | A | A | AA | AA | AA |
| Example 27 | 2 | A | A | A | A | AA | AA | A |
| Example 28 | 2 | B | B | A | A | AA | B | B |
| Example 29 | 2 | A | A | A | A | AA | AA | B |
| Example 30 | 2 | A | A | A | A | AA | AA | AA |
| Example 31 | 2 | A | A | A | A | AA | AA | AA |
| Example 32 | 2 | A | A | A | A | AA | AA | A |
| Example 33 | 2 | A | B | A | A | AA | A | A |
| Example 34 | 2 | B | B | A | A | AA | B | B |
| Example 35 | 2 | A | A | A | A | AA | AA | B |
| Example 36 | 2 | A | A | A | A | AA | AA | AA |
| Example 37 | 2 | A | A | A | A | AA | AA | AA |
| Example 38 | 2 | A | A | A | A | AA | AA | A |
| Example 39 | 2 | A | A | A | A | AA | A | A |
| Example 40 | 2 | A | A | A | A | AA | AA | A |

TABLE 1-1-8

| | Resist composition | | | | | | | |
|---|---|---|---|---|---|---|---|---|
| | | | | Evaluation | | | | |
| | | | | Resist saving properties | | Defect inhibition performance | | |
| | | Affinity | | | Film thickness | | Residue in unexposed | |
| | Type | Rsq1 | SRsq | Uniformity | controllability | Pattern collapse | portion | BRIDGE |
| Example 1 | 3 | A | A | A | A | AA | AA | AA |
| Example 2 | 3 | A | B | A | A | AA | A | AA |
| Example 3 | 3 | A | A | A | A | AA | AA | AA |
| Example 4 | 3 | A | A | A | A | AA | AA | B |
| Example 5 | 3 | A | A | A | A | AA | AA | B |
| Example 6 | 3 | A | A | B | B | AA | AA | B |
| Example 7 | 3 | A | B | A | A | AA | A | AA |
| Example 8 | 3 | A | A | A | A | AA | AA | AA |
| Example 9 | 3 | A | A | A | A | AA | AA | A |
| Example 10 | 3 | A | B | A | A | AA | AA | A |
| Example 11 | 3 | A | A | A | A | AA | AA | AA |
| Example 12 | 3 | A | A | A | A | AA | AA | AA |
| Example 13 | 3 | A | A | A | A | AA | AA | AA |
| Example 14 | 3 | A | A | A | A | AA | AA | B |
| Example 15 | 3 | A | A | A | A | AA | AA | B |
| Example 16 | 3 | A | A | A | A | AA | AA | B |
| Example 17 | 3 | A | A | A | A | A | A | B |
| Example 18 | 3 | A | A | A | A | AA | AA | AA |

TABLE 1-1-8-continued

| | | Resist composition | | | | | | |
|---|---|---|---|---|---|---|---|---|
| | | | | Evaluation | | | | |
| | | | | Resist saving properties | | Defect inhibition performance | | |
| | | Affinity | | | Film thickness | | Residue in unexposed | |
| | Type | Rsq1 | SRsq | Uniformity | controllability | Pattern collapse | portion | BRIDGE |
| Example 19 | 3 | A | B | A | A | AA | A | AA |
| Example 20 | 3 | A | A | A | A | AA | AA | AA |
| Example 21 | 3 | A | B | A | A | AA | A | A |
| Example 22 | 3 | A | A | A | A | AA | AA | AA |
| Example 23 | 3 | A | A | A | A | AA | AA | AA |
| Example 24 | 3 | A | A | A | A | AA | AA | AA |
| Example 25 | 3 | A | A | A | A | AA | AA | AA |
| Example 26 | 3 | A | A | A | A | AA | AA | AA |
| Example 27 | 3 | A | A | A | A | AA | AA | A |
| Example 28 | 3 | A | A | A | A | AA | AA | B |
| Example 29 | 3 | A | A | A | A | AA | AA | B |
| Example 30 | 3 | A | A | A | A | AA | AA | AA |
| Example 31 | 3 | A | A | A | A | AA | AA | AA |
| Example 32 | 3 | A | A | A | A | AA | AA | A |
| Example 33 | 3 | A | B | A | A | AA | A | A |
| Example 34 | 3 | A | A | A | A | AA | AA | B |
| Example 35 | 3 | A | A | A | A | AA | AA | B |
| Example 36 | 3 | B | B | A | A | AA | A | AA |
| Example 37 | 3 | A | A | A | A | AA | AA | AA |
| Example 38 | 3 | A | A | A | A | AA | AA | A |
| Example 39 | 3 | A | B | A | A | AA | A | A |
| Example 40 | 3 | A | A | A | A | AA | AA | A |

TABLE 1-1-9

| | | Resist composition | | | | | | |
|---|---|---|---|---|---|---|---|---|
| | | | | Evaluation | | | | |
| | | | | Resist saving properties | | Defect inhibition performance | | |
| | | Affinity | | | Film thickness | | Residue in unexposed | |
| | Type | Rsq1 | SRsq | Uniformity | controllability | Pattern collapse | portion | BRIDGE |
| Example 1 | 4 | B | A | A | A | AA | A | A |
| Example 2 | 4 | A | A | A | A | AA | AA | AA |
| Example 3 | 4 | A | A | A | A | AA | AA | AA |
| Example 4 | 4 | A | A | A | A | AA | AA | A |
| Example 5 | 4 | A | A | A | A | AA | AA | B |
| Example 6 | 4 | A | A | A | B | AA | AA | B |
| Example 7 | 4 | A | A | A | A | AA | A | AA |
| Example 8 | 4 | A | A | A | A | AA | AA | AA |
| Example 9 | 4 | A | A | A | A | AA | AA | A |
| Example 10 | 4 | A | A | A | A | AA | AA | AA |
| Example 11 | 4 | A | A | A | A | AA | AA | AA |
| Example 12 | 4 | A | A | A | A | AA | AA | AA |
| Example 13 | 4 | A | A | A | A | AA | AA | AA |
| Example 14 | 4 | A | A | A | A | AA | AA | B |
| Example 15 | 4 | A | A | A | A | AA | AA | B |
| Example 16 | 4 | A | A | A | A | AA | AA | B |
| Example 17 | 4 | A | A | A | B | A | A | B |
| Example 18 | 4 | A | A | A | A | AA | AA | AA |
| Example 19 | 4 | A | B | A | A | AA | A | AA |
| Example 20 | 4 | A | A | A | A | AA | AA | AA |
| Example 21 | 4 | A | B | A | B | AA | A | A |
| Example 22 | 4 | A | A | A | A | AA | AA | AA |
| Example 23 | 4 | A | A | A | A | AA | AA | AA |
| Example 24 | 4 | A | A | A | A | AA | AA | AA |
| Example 25 | 4 | A | A | A | A | AA | AA | AA |
| Example 26 | 4 | A | A | A | A | AA | AA | AA |
| Example 27 | 4 | B | A | A | A | AA | A | A |
| Example 28 | 4 | A | A | A | A | AA | AA | B |

TABLE 1-1-9-continued

| | Resist composition | | | | | | | |
|---|---|---|---|---|---|---|---|---|
| | | | | Evaluation | | | | |
| | | | | Resist saving properties | | Defect inhibition performance | | |
| | | Affinity | | | Film thickness | | Residue in unexposed | |
| | Type | Rsq1 | SRsq | Uniformity | controllability | Pattern collapse | portion | BRIDGE |
| Example 29 | 4 | A | A | A | A | AA | AA | B |
| Example 30 | 4 | A | A | A | A | AA | AA | AA |
| Example 31 | 4 | A | A | A | A | AA | AA | AA |
| Example 32 | 4 | A | A | A | A | AA | AA | A |
| Example 33 | 4 | A | A | A | A | AA | A | A |
| Example 34 | 4 | A | A | A | A | AA | AA | B |
| Example 35 | 4 | A | A | A | A | AA | AA | B |
| Example 36 | 4 | B | B | A | A | AA | A | AA |
| Example 37 | 4 | A | A | A | A | AA | AA | AA |
| Example 38 | 4 | A | A | A | A | AA | AA | A |
| Example 39 | 4 | B | A | A | A | AA | A | A |
| Example 40 | 4 | B | A | A | A | AA | AA | A |

TABLE 1-1-10

| | Resist composition | | | | | | | |
|---|---|---|---|---|---|---|---|---|
| | | | | Evaluation | | | | |
| | | | | Resist saving properties | | Defect inhibition performance | | |
| | | Affinity | | | Film thickness | | Residue in unexposed | |
| | Type | Rsq1 | SRsq | Uniformity | controllability | Pattern collapse | portion | BRIDGE |
| Example 1 | 5 | B | A | A | A | AA | A | A |
| Example 2 | 5 | B | A | A | A | A | A | A |
| Example 3 | 5 | B | A | A | A | A | A | A |
| Example 4 | 5 | A | A | A | A | AA | AA | A |
| Example 5 | 5 | A | A | A | A | AA | AA | B |
| Example 6 | 5 | A | A | A | B | AA | AA | B |
| Example 7 | 5 | B | A | A | A | A | A | A |
| Example 8 | 5 | B | A | A | A | A | A | A |
| Example 9 | 5 | A | A | A | A | AA | AA | A |
| Example 10 | 5 | A | A | A | A | AA | AA | AA |
| Example 11 | 5 | A | A | A | A | AA | AA | AA |
| Example 12 | 5 | A | A | A | A | AA | AA | AA |
| Example 13 | 5 | A | A | A | A | AA | AA | AA |
| Example 14 | 5 | A | A | A | A | AA | AA | B |
| Example 15 | 5 | A | A | A | A | AA | AA | B |
| Example 16 | 5 | A | A | A | A | AA | AA | B |
| Example 17 | 5 | A | A | A | B | A | A | B |
| Example 18 | 5 | A | A | A | A | AA | AA | AA |
| Example 19 | 5 | B | A | A | A | A | A | A |
| Example 20 | 5 | B | A | A | A | A | A | A |
| Example 21 | 5 | A | B | A | B | AA | A | A |
| Example 22 | 5 | A | A | A | A | AA | AA | AA |
| Example 23 | 5 | A | A | A | A | AA | AA | AA |
| Example 24 | 5 | A | A | A | A | AA | AA | AA |
| Example 25 | 5 | A | A | A | A | AA | AA | AA |
| Example 26 | 5 | A | A | A | A | AA | AA | AA |
| Example 27 | 5 | B | A | A | A | AA | A | A |
| Example 28 | 5 | A | A | A | A | AA | AA | B |
| Example 29 | 5 | A | A | A | A | AA | AA | B |
| Example 30 | 5 | B | A | A | A | A | A | A |
| Example 31 | 5 | B | A | A | A | A | A | A |
| Example 32 | 5 | A | A | A | A | AA | AA | A |
| Example 33 | 5 | A | A | A | A | AA | A | A |
| Example 34 | 5 | A | A | A | A | AA | AA | B |
| Example 35 | 5 | A | A | A | A | AA | AA | B |

TABLE 1-1-10-continued

| | Resist composition | | | | | | | |
|---|---|---|---|---|---|---|---|---|
| | | | | Evaluation | | | | |
| | | | | Resist saving properties | | Defect inhibition performance | | |
| | Affinity | | | | Film thickness | | Residue in unexposed | |
| | Type | Rsq1 | SRsq | Uniformity | controllability | Pattern collapse | portion | BRIDGE |
| Example 36 | 5 | B | B | A | A | AA | A | AA |
| Example 37 | 5 | A | A | A | A | AA | AA | AA |
| Example 38 | 5 | A | A | A | A | AA | AA | A |
| Example 39 | 5 | B | A | A | A | AA | A | A |
| Example 40 | 5 | B | A | A | A | AA | AA | A |

TABLE 1-1-11

| | Resist composition | | | | | | | |
|---|---|---|---|---|---|---|---|---|
| | | | | Evaluation | | | | |
| | | | | Resist saving properties | | Defect inhibition performance | | |
| | Affinity | | | | Film thickness | | Residue in unexposed | |
| | Type | Rsq1 | SRsq | Uniformity | controllability | Pattern collapse | portion | BRIDGE |
| Example 1 | 6 | B | A | A | A | AA | AA | A |
| Example 2 | 6 | A | A | A | A | AA | AA | AA |
| Example 3 | 6 | A | A | A | A | AA | AA | AA |
| Example 4 | 6 | A | A | A | A | AA | AA | A |
| Example 5 | 6 | A | A | A | A | AA | AA | B |
| Example 6 | 6 | A | A | A | B | AA | AA | B |
| Example 7 | 6 | A | A | A | A | AA | A | AA |
| Example 8 | 6 | A | A | A | A | AA | AA | AA |
| Example 9 | 6 | A | A | A | A | AA | AA | A |
| Example 10 | 6 | A | A | A | A | AA | AA | AA |
| Example 11 | 6 | A | A | A | A | AA | AA | AA |
| Example 12 | 6 | A | A | A | A | AA | AA | AA |
| Example 13 | 6 | A | A | A | A | AA | AA | AA |
| Example 14 | 6 | A | A | A | A | AA | AA | B |
| Example 15 | 6 | A | A | A | A | AA | AA | B |
| Example 16 | 6 | A | A | A | A | AA | AA | B |
| Example 17 | 6 | A | A | A | B | A | A | B |
| Example 18 | 6 | A | A | A | A | AA | AA | AA |
| Example 19 | 6 | A | B | A | A | AA | A | AA |
| Example 20 | 6 | A | A | A | A | AA | AA | AA |
| Example 21 | 6 | A | B | A | B | AA | A | A |
| Example 22 | 6 | A | A | A | A | AA | AA | AA |
| Example 23 | 6 | A | A | A | A | AA | AA | AA |
| Example 24 | 6 | A | A | A | A | AA | AA | AA |
| Example 25 | 6 | A | A | A | A | AA | AA | AA |
| Example 26 | 6 | A | A | A | A | AA | AA | AA |
| Example 27 | 6 | B | A | A | A | AA | A | A |
| Example 28 | 6 | A | A | A | A | AA | AA | B |
| Example 29 | 6 | A | A | A | A | AA | AA | B |
| Example 30 | 6 | A | A | A | A | AA | AA | AA |
| Example 31 | 6 | A | A | A | A | AA | AA | AA |
| Example 32 | 6 | A | A | A | A | AA | AA | A |
| Example 33 | 6 | A | A | A | A | AA | A | A |
| Example 34 | 6 | A | A | A | A | AA | AA | B |
| Example 35 | 6 | A | A | A | A | AA | AA | B |
| Example 36 | 6 | B | B | A | A | AA | A | AA |
| Example 37 | 6 | A | A | A | A | AA | AA | AA |
| Example 38 | 6 | A | A | A | A | AA | AA | A |
| Example 39 | 6 | B | A | A | A | AA | A | A |
| Example 40 | 6 | B | A | A | A | AA | AA | A |

TABLE 1-2-1

| | Chemical liquid Composition of mixture First organic solvent | | | | | | |
|---|---|---|---|---|---|---|---|
| | Type | Content (% by mass) | Molar mass (g/mol) | Vapor pressure (Pa) | Surface tension (mN/m) | δh $(Mpa)^{0.5}$ | δd $(Mpa)^{0.5}$ |
| Example 41 | | | | | | | |
| Example 42 | | | | | | | |
| Example 43 | PGMEA | 80 | 132.2 | 493 | 27.9 | 9.8 | 15.6 |
| Example 44 | PGMEA | 80 | 132.2 | 493 | 27.9 | 9.8 | 15.6 |
| Example 45 | CyHx | 80 | 98.1 | 507 | 34.1 | 5.1 | 17.8 |
| Example 46 | CyHx | 40 | 98.1 | 507 | 34.1 | 5.1 | 17.8 |
| Example 47 | CyHx | 80 | 98.1 | 507 | 34.1 | 5.1 | 17.8 |
| Example 48 | CyHx | 80 | 98.1 | 507 | 34.1 | 5.1 | 17.8 |
| Example 49 | CyHx | 80 | 98.1 | 507 | 34.1 | 5.1 | 17.8 |
| Example 50 | EL | 70 | 118.1 | 333 | 29.8 | 12.5 | 16.0 |
| Example 51 | EL | 90 | 118.1 | 333 | 29.8 | 12.5 | 16.0 |
| Example 52 | EL | 20 | 118.1 | 333 | 29.8 | 12.5 | 16.0 |
| Example 53 | EL | 40 | 118.1 | 333 | 29.8 | 12.5 | 16.0 |
| Example 54 | HBM | 80 | 118.1 | 360 | 29.1 | 12.2 | 16.5 |
| Example 55 | HBM | 80 | 118.1 | 360 | 29.1 | 12.2 | 16.5 |
| Example 56 | HBM | 80 | 118.1 | 360 | 29.1 | 12.2 | 16.5 |
| Example 57 | DBCPN | 80 | 130.2 | 400 | 30.2 | 4.2 | 16.6 |
| Example 58 | DBCPN | 80 | 130.2 | 400 | 30.2 | 4.2 | 16.6 |
| Example 59 | PGMEA | 70 | 132.2 | 493 | 27.9 | 9.8 | 15.6 |
| Example 60 | CyHx | 30 | 98.1 | 507 | 34.1 | 5.1 | 17.8 |
| Example 61 | DBCPN | 60 | 130.2 | 400 | 30.2 | 4.2 | 16.6 |
| Example 62 | HBM | 35 | 118.1 | 360 | 29.1 | 12.2 | 16.5 |
| Example 63 | EL | 70 | 118.1 | 333 | 29.8 | 12.5 | 16.0 |
| Example 64 | HBM | 25 | 118.1 | 360 | 29.1 | 12.2 | 16.5 |
| Example 65 | HBM | 25 | 118.1 | 360 | 29.1 | 12.2 | 16.5 |
| Example 66 | HBM | 35 | 118.1 | 360 | 29.1 | 12.2 | 16.5 |
| Example 67 | HBM | 35 | 118.1 | 360 | 29.1 | 12.2 | 16.5 |
| Example 68 | HBM | 35 | 118.1 | 360 | 29.1 | 12.2 | 16.5 |
| Example 69 | HBM | 35 | 118.1 | 360 | 29.1 | 12.2 | 16.5 |
| Example 70 | HBM | 35 | 118.1 | 360 | 29.1 | 12.2 | 16.5 |
| Example 71 | EL | 30 | 118.1 | 333 | 29.8 | 12.5 | 16.0 |
| Example 72 | HBM | 25 | 118.1 | 360 | 29.1 | 12.2 | 16.5 |
| Example 73 | HBM | 25 | 118.1 | 360 | 29.1 | 12.2 | 16.5 |
| Example 74 | HBM | 45 | 118.1 | 360 | 29.1 | 12.2 | 16.5 |
| Example 75 | EL | 30 | 118.1 | 333 | 29.8 | 12.5 | 16.0 |
| Example 76 | HBM | 25 | 118.1 | 360 | 29.1 | 12.2 | 16.5 |
| Example 77 | HBM | 25 | 118.1 | 360 | 29.1 | 12.2 | 16.5 |
| Example 78 | PGMEA | 50 | 132.2 | 493 | 27.9 | 9.8 | 15.6 |
| Example 79 | EGMEA | 50 | 98.1 | 380 | 30.7 | 8.1 | 15.9 |
| Example 80 | EGMEA | 50 | 98.1 | 380 | 30.7 | 8.1 | 15.9 |

TABLE 1-2-2

| | Chemical liquid Composition of mixture First organic solvent | | | | | | |
|---|---|---|---|---|---|---|---|
| | Type | Content (% by mass) | Molar mass (g/mol) | Vapor pressure (Pa) | Surface tension (mN/m) | δh $(Mpa)^{0.5}$ | δd $(Mpa)^{0.5}$ |
| Example 41 | | | | | | | |
| Example 42 | | | | | | | |
| Example 43 | | | | | | | |
| Example 44 | | | | | | | |
| Example 45 | | | | | | | |
| Example 46 | | | | | | | |
| Example 47 | EL | 20 | 118.1 | 333 | 29.8 | 12.5 | 16.0 |
| Example 48 | HBM | 20 | 118.1 | 360 | 29.1 | 12.2 | 16.5 |
| Example 49 | DBCPN | 20 | 130.2 | 400 | 30.2 | 4.2 | 16.6 |
| Example 50 | | | | | | | |
| Example 51 | | | | | | | |
| Example 52 | DBCPN | 80 | 130.2 | 400 | 30.2 | 4.2 | 16.6 |
| Example 53 | HBM | 60 | 118.1 | 360 | 29.1 | 12.2 | 16.5 |
| Example 54 | | | | | | | |
| Example 55 | | | | | | | |
| Example 56 | DBCPN | 20 | 130.2 | 400 | 30.2 | 4.2 | 16.6 |
| Example 57 | | | | | | | |
| Example 58 | | | | | | | |
| Example 59 | EL | 10 | 118.1 | 333 | 29.8 | 12.5 | 16.0 |

TABLE 1-2-2-continued

| | | Chemical liquid Composition of mixture First organic solvent | | | | | |
|---|---|---|---|---|---|---|---|
| | Type | Content (% by mass) | Molar mass (g/mol) | Vapor pressure (Pa) | Surface tension (mN/m) | δh (Mpa)$^{0.5}$ | δd (Mpa)$^{0.5}$ |
| Example 60 | PGMEA | 60 | 132.2 | 493 | 27.9 | 9.8 | 15.6 |
| Example 61 | EL | 30 | 118.1 | 333 | 29.8 | 12.5 | 16.0 |
| Example 62 | PGMEA | 55 | 132.2 | 493 | 27.9 | 9.8 | 15.6 |
| Example 63 | | | | | | | |
| Example 64 | CyHx | 70 | 98.1 | 507 | 34.1 | 5.1 | 17.8 |
| Example 65 | DBCPN | 70 | 130.2 | 400 | 30.2 | 4.2 | 16.6 |
| Example 66 | PGMEA | 60 | 132.2 | 493 | 27.9 | 9.8 | 15.6 |
| Example 67 | PGMEA | 55 | 132.2 | 493 | 27.9 | 9.8 | 15.6 |
| Example 68 | PGMEA | 45 | 132.2 | 493 | 27.9 | 9.8 | 15.6 |
| Example 69 | PGMEA | 40 | 132.2 | 493 | 27.9 | 9.8 | 15.6 |
| Example 70 | PGMEA | 35 | 132.2 | 493 | 27.9 | 9.8 | 15.6 |
| Example 71 | | | | | | | |
| Example 72 | CyHx | 65 | 98.1 | 507 | 34.1 | 5.1 | 17.8 |
| Example 73 | DBCPN | 65 | 130.2 | 400 | 30.2 | 4.2 | 16.6 |
| Example 74 | PGMEA | 45 | 132.2 | 493 | 27.9 | 9.8 | 15.6 |
| Example 75 | | | | | | | |
| Example 76 | CyHx | 65 | 98.1 | 507 | 34.1 | 5.1 | 17.8 |
| Example 77 | DBCPN | 65 | 130.2 | 400 | 30.2 | 4.2 | 16.6 |
| Example 78 | EL | 10 | 118.1 | 333 | 29.8 | 12.5 | 16.0 |
| Example 79 | PGMEA | 50 | 132.2 | 493 | 27.9 | 9.8 | 15.6 |
| Example 80 | EL | 50 | 118.1 | 333 | 29.8 | 12.5 | 16.0 |

TABLE 1-2-3

| | | Chemical liquid Composition of mixture First organic solvent | | | | | |
|---|---|---|---|---|---|---|---|
| | Type | Content (% by mass) | Molar mass (g/mol) | Vapor pressure (Pa) | Surface tension (mN/m) | δh (Mpa)$^{0.5}$ | δd (Mpa)$^{0.5}$ |
| Example 41 | | | | | | | |
| Example 42 | | | | | | | |
| Example 43 | | | | | | | |
| Example 44 | | | | | | | |
| Example 45 | | | | | | | |
| Example 46 | | | | | | | |
| Example 47 | | | | | | | |
| Example 48 | | | | | | | |
| Example 49 | | | | | | | |
| Example 50 | | | | | | | |
| Example 51 | | | | | | | |
| Example 52 | | | | | | | |
| Example 53 | | | | | | | |
| Example 54 | | | | | | | |
| Example 55 | | | | | | | |
| Example 56 | | | | | | | |
| Example 57 | | | | | | | |
| Example 58 | | | | | | | |
| Example 59 | | | | | | | |
| Example 60 | | | | | | | |
| Example 61 | | | | | | | |
| Example 62 | | | | | | | |
| Example 63 | | | | | | | |
| Example 64 | | | | | | | |
| Example 65 | | | | | | | |
| Example 66 | | | | | | | |
| Example 67 | | | | | | | |
| Example 68 | | | | | | | |
| Example 69 | | | | | | | |
| Example 70 | | | | | | | |
| Example 71 | | | | | | | |
| Example 72 | | | | | | | |
| Example 73 | | | | | | | |
| Example 74 | | | | | | | |
| Example 75 | | | | | | | |
| Example 76 | | | | | | | |
| Example 77 | | | | | | | |
| Example 78 | HBM | 40 | 118.1 | 360 | 29.1 | 12.2 | 16.5 |

TABLE 1-2-3-continued

| | Chemical liquid Composition of mixture First organic solvent | | | | | | |
|---|---|---|---|---|---|---|---|
| | Type | Content (% by mass) | Molar mass (g/mol) | Vapor pressure (Pa) | Surface tension (mN/m) | δh $(Mpa)^{0.5}$ | δd $(Mpa)^{0.5}$ |
| Example 79 | | | | | | | |
| Example 80 | | | | | | | |

TABLE 1-2-4

| | Chemical liquid Composition of mixture Second organic solvent | | | | | | |
|---|---|---|---|---|---|---|---|
| | Type | Content (% by mass) | Molar mass (g/mol) | Vapor pressure (Pa) | Surface tension (mN/m) | δh $(Mpa)^{0.5}$ | δd $(Mpa)^{0.5}$ |
| Example 41 | PGME | 50 | 90.1 | 1,453 | 27.6 | 13.3 | 16.4 |
| Example 42 | CyPn | 50 | 84.1 | 1,520 | 33.8 | 4.8 | 17.8 |
| Example 43 | CyPn | 20 | 84.1 | 1,520 | 33.8 | 4.8 | 17.8 |
| Example 44 | CyPn | 20 | 84.1 | 1,520 | 33.8 | 4.8 | 17.8 |
| Example 45 | CyPn | 20 | 84.1 | 1,520 | 33.8 | 4.8 | 17.8 |
| Example 46 | CyPn | 60 | 84.1 | 1,520 | 33.8 | 4.8 | 17.8 |
| Example 47 | | | | | | | |
| Example 48 | | | | | | | |
| Example 49 | | | | | | | |
| Example 50 | PGME | 30 | 90.1 | 1,453 | 27.6 | 13.3 | 16.4 |
| Example 51 | CyPn | 10 | 84.1 | 1,520 | 33.8 | 4.8 | 17.8 |
| Example 52 | | | | | | | |
| Example 53 | | | | | | | |
| Example 54 | PGME | 20 | 90.1 | 1,453 | 27.6 | 13.3 | 16.4 |
| Example 55 | CyPn | 20 | 84.1 | 1,520 | 33.8 | 4.8 | 17.8 |
| Example 56 | | | | | | | |
| Example 57 | PGME | 20 | 90.1 | 1,453 | 27.6 | 13.3 | 16.4 |
| Example 58 | CyPn | 20 | 84.1 | 1,520 | 33.8 | 4.8 | 17.8 |
| Example 59 | CyPn | 20 | 84.1 | 1,520 | 33.8 | 4.8 | 17.8 |
| Example 60 | CyPn | 10 | 84.1 | 1,520 | 33.8 | 4.8 | 17.8 |
| Example 61 | CyPn | 10 | 84.1 | 1,520 | 33.8 | 4.8 | 17.8 |
| Example 62 | | | | | | | |
| Example 63 | CyPn | 25 | 84.1 | 1,520 | 33.8 | 4.8 | 17.8 |
| Example 64 | | | | | | | |
| Example 65 | | | | | | | |
| Example 66 | | | | | | | |
| Example 67 | | | | | | | |
| Example 68 | | | | | | | |
| Example 69 | | | | | | | |
| Example 70 | | | | | | | |
| Example 71 | CyPn | 60 | 84.1 | 1,520 | 33.8 | 4.8 | 17.8 |
| Example 72 | | | | | | | |
| Example 73 | | | | | | | |
| Example 74 | | | | | | | |
| Example 75 | CyPn | 60 | 84.1 | 1,520 | 33.8 | 4.8 | 17.8 |
| Example 76 | | | | | | | |
| Example 77 | | | | | | | |
| Example 78 | | | | | | | |
| Example 79 | | | | | | | |
| Example 80 | | | | | | | |

TABLE 1-2-5

| | Chemical liquid | | | | | | Ether-based compound |
|---|---|---|---|---|---|---|---|
| | Composition of mixture Third organic solvent | | | | | | |
| | Type | Content (% by mass) | Molar mass (g/mol) | Vapor pressure (Pa) | Surface tension (mN/m) | δh $(Mpa)^{0.5}$ | δd $(Mpa)^{0.5}$ | Content (mass ppm) |
| Example 41 | NMP | 50 | 99.1 | 40 | 41.3 | 7.2 | 18.0 | 0 |
| Example 42 | NMP | 50 | 99.1 | 40 | 41.3 | 7.2 | 18.0 | 0 |
| Example 43 | | | | | | | | 0 |

TABLE 1-2-5-continued

| | Chemical liquid | | | | | | | Ether-based compound |
|---|---|---|---|---|---|---|---|---|
| | Composition of mixture Third organic solvent | | | | | | | |
| | Type | Content (% by mass) | Molar mass (g/mol) | Vapor pressure (Pa) | Surface tension (mN/m) | $\delta h$ $(Mpa)^{0.5}$ | $\delta d$ $(Mpa)^{0.5}$ | Content (mass ppm) |
| Example 44 | | | | | | | | 5 |
| Example 45 | | | | | | | | 0 |
| Example 46 | | | | | | | | 0 |
| Example 47 | | | | | | | | 0 |
| Example 48 | | | | | | | | 0 |
| Example 49 | | | | | | | | 0 |
| Example 50 | | | | | | | | 0 |
| Example 51 | | | | | | | | 0 |
| Example 52 | | | | | | | | 0 |
| Example 53 | | | | | | | | 0 |
| Example 54 | | | | | | | | 0 |
| Example 55 | | | | | | | | 0 |
| Example 56 | | | | | | | | 0 |
| Example 57 | | | | | | | | 0 |
| Example 58 | | | | | | | | 0 |
| Example 59 | | | | | | | | 0 |
| Example 60 | | | | | | | | 0 |
| Example 61 | | | | | | | | 0 |
| Example 62 | DMSO | 10 | 78.1 | 13 | 43.6 | 10.2 | 18.4 | 0 |
| Example 63 | DMSO | 5 | 78.1 | 13 | 43.6 | 10.2 | 18.4 | 0 |
| Example 64 | DMSO | 5 | 78.1 | 13 | 43.6 | 10.2 | 18.4 | 0 |
| Example 65 | DMSO | 5 | 78.1 | 13 | 43.6 | 10.2 | 18.4 | 0 |
| Example 66 | GBL | 5 | 86.1 | 147 | 44.1 | 7.0 | 17.4 | 0 |
| Example 67 | GBL | 10 | 86.1 | 147 | 44.1 | 7.0 | 17.4 | 0 |
| Example 68 | GBL | 20 | 86.1 | 147 | 44.1 | 7.0 | 17.4 | 0 |
| Example 69 | GBL | 25 | 86.1 | 147 | 44.1 | 7.0 | 17.4 | 0 |
| Example 70 | GBL | 30 | 86.1 | 147 | 44.1 | 7.0 | 17.4 | 0 |
| Example 71 | GBL | 10 | 86.1 | 147 | 44.1 | 7.0 | 17.4 | 0 |
| Example 72 | GBL | 10 | 86.1 | 147 | 44.1 | 7.0 | 17.4 | 0 |
| Example 73 | GBL | 10 | 86.1 | 147 | 44.1 | 7.0 | 17.4 | 0 |
| Example 74 | EC | 10 | 88.1 | 67 | 41.5 | 8.0 | 18.1 | 0 |
| Example 75 | EC | 10 | 88.1 | 67 | 41.5 | 8.0 | 18.1 | 0 |
| Example 76 | EC | 10 | 88.1 | 67 | 41.5 | 8.0 | 18.1 | 0 |
| Example 77 | EC | 10 | 88.1 | 67 | 41.5 | 8.0 | 18.1 | 0 |
| Example 78 | | | | | | | | 5 |
| Example 79 | | | | | | | | 0 |
| Example 80 | | | | | | | | 0 |

TABLE 1-2-6

| | Chemical liquid Physical properties of mixture | | Resist composition | | | | | | | |
|---|---|---|---|---|---|---|---|---|---|---|
| | | | Evaluation | | | | | | | |
| | | | Resist saving properties | | | | | Defect inhibition performance | | |
| | Vapor pressure (Pa) | Surface tension (mN/m) | Affinity | | | Uniformity | Film thickness controllability | Pattern collapse | Residue in unexposed portion | BRIDGE |
| | | | Type | Rsq1 | SRsq | | | | | |
| Example 41 | 780 | 34.1 | 1 | B | B | A | A | AA | B | B |
| Example 42 | 841 | 37.2 | 1 | A | A | A | A | AA | AA | B |
| Example 43 | 783 | 29.6 | 1 | A | A | A | A | AA | AA | AA |
| Example 44 | 783 | 29.6 | 1 | A | A | A | A | A | A | A |
| Example 45 | 735 | 34.0 | 1 | A | A | A | A | AA | AA | AA |
| Example 46 | 1,151 | 33.9 | 1 | A | A | A | B | A | AA | A |
| Example 47 | 477 | 33.4 | 1 | A | A | A | A | AA | AA | AA |
| Example 48 | 481 | 33.2 | 1 | A | A | A | A | AA | AA | AA |
| Example 49 | 490 | 33.5 | 1 | A | A | A | A | AA | AA | AA |
| Example 50 | 736 | 29.0 | 1 | A | B | A | A | AA | B | AA |
| Example 51 | 493 | 30.3 | 1 | A | B | A | A | AA | A | AA |
| Example 52 | 386 | 30.1 | 1 | A | B | A | A | AA | AA | A |
| Example 53 | 349 | 29.4 | 1 | A | B | A | A | AA | A | B |
| Example 54 | 630 | 28.7 | 1 | A | B | B | A | AA | A | AA |
| Example 55 | 661 | 30.3 | 1 | A | B | A | A | AA | A | AA |
| Example 56 | 367 | 29.3 | 1 | A | B | A | A | AA | A | AA |

TABLE 1-2-6-continued

| | Chemical liquid Physical properties of mixture | | Resist composition | | | | | | | |
|---|---|---|---|---|---|---|---|---|---|---|
| | | | | | | Evaluation | | | | |
| | | | | | | Resist saving properties | | Defect inhibition performance | | |
| | Vapor pressure (Pa) | Surface tension (mN/m) | Type | Affinity Rsq1 | SRsq | Uniformity | Film thickness controllability | Pattern collapse | Residue in unexposed portion | BRIDGE |
| Example 57 | 679 | 29.5 | 1 | A | A | A | A | AA | AA | AA |
| Example 58 | 712 | 31.2 | 1 | A | A | A | A | AA | AA | AA |
| Example 59 | 764 | 29.7 | 1 | A | A | A | A | AA | AA | AA |
| Example 60 | 637 | 30.9 | 1 | A | A | A | A | AA | AA | AA |
| Example 61 | 539 | 30.6 | 1 | A | A | A | A | AA | AA | AA |
| Example 62 | 373 | 30.7 | 1 | A | A | A | A | AA | AA | AA |
| Example 63 | 682 | 32.0 | 1 | A | B | A | A | AA | A | AA |
| Example 64 | 443 | 33.6 | 1 | A | A | A | A | AA | AA | AA |
| Example 65 | 359 | 31.0 | 1 | A | A | A | A | AA | AA | AA |
| Example 66 | 420 | 29.5 | 1 | A | A | A | A | AA | AA | AA |
| Example 67 | 397 | 30.6 | 1 | A | A | A | A | AA | AA | A |
| Example 68 | 355 | 32.6 | 1 | A | A | A | A | AA | AA | A |
| Example 69 | 336 | 33.6 | 1 | A | A | A | A | AA | AA | A |
| Example 70 | 317 | 34.5 | 1 | A | A | A | A | AA | AA | A |
| Example 71 | 1,094 | 34.0 | 1 | A | A | A | B | A | AA | A |
| Example 72 | 433 | 34.2 | 1 | A | A | A | A | AA | AA | AA |
| Example 73 | 354 | 31.9 | 1 | A | A | A | A | AA | AA | AA |
| Example 74 | 374 | 30.3 | 1 | A | B | A | A | AA | A | AA |
| Example 75 | 1,088 | 33.7 | 1 | A | A | A | B | A | AA | A |
| Example 76 | 425 | 33.9 | 1 | A | A | A | A | AA | AA | AA |
| Example 77 | 344 | 31.5 | 1 | A | A | A | A | AA | AA | AA |
| Example 78 | 420 | 28.6 | 1 | A | B | B | A | AA | B | A |
| Example 79 | 417 | 29.5 | 1 | A | A | A | A | AA | AA | AA |
| Example 80 | 348 | 30.3 | 1 | A | B | A | A | AA | A | AA |

TABLE 1-2-7

| | Resist composition | | | | | | | |
|---|---|---|---|---|---|---|---|---|
| | | | | Evaluation | | | | |
| | | | | Resist saving properties | | Defect inhibition performance | | |
| | Affinity | | | | Film | | Residue in | |
| | Type | Rsq1 | SRsq | Uniformity | thickness controllability | Pattern collapse | unexposed portion | BRIDGE |
| Example 41 | 2 | B | B | A | A | AA | B | B |
| Example 42 | 2 | A | A | A | A | AA | AA | B |
| Example 43 | 2 | A | B | A | A | AA | A | AA |
| Example 44 | 2 | A | B | A | A | A | A | B |
| Example 45 | 2 | A | A | A | A | AA | AA | AA |
| Example 46 | 2 | A | A | A | B | A | AA | A |
| Example 47 | 2 | A | A | A | A | AA | AA | AA |
| Example 48 | 2 | A | A | A | A | AA | AA | AA |
| Example 49 | 2 | A | A | A | A | AA | AA | AA |
| Example 50 | 2 | B | B | A | A | AA | B | AA |
| Example 51 | 2 | A | A | A | A | AA | AA | AA |
| Example 52 | 2 | A | A | A | A | AA | AA | AA |
| Example 53 | 2 | A | A | A | A | AA | AA | B |
| Example 54 | 2 | B | B | B | A | AA | A | AA |
| Example 55 | 2 | A | A | A | A | AA | AA | AA |
| Example 56 | 2 | A | A | A | A | AA | AA | AA |
| Example 57 | 2 | B | B | A | A | AA | B | A |
| Example 58 | 2 | A | A | A | A | AA | AA | AA |
| Example 59 | 2 | A | B | A | A | AA | A | B |
| Example 60 | 2 | A | B | A | A | AA | A | AA |
| Example 61 | 2 | A | A | A | A | AA | AA | AA |
| Example 62 | 2 | A | A | A | A | AA | AA | AA |
| Example 63 | 2 | A | A | A | A | AA | AA | AA |
| Example 64 | 2 | A | A | A | A | AA | AA | AA |
| Example 65 | 2 | A | A | A | A | AA | AA | AA |
| Example 66 | 2 | A | A | A | A | AA | AA | AA |

TABLE 1-2-7-continued

| | Resist composition | | | | | | | |
|---|---|---|---|---|---|---|---|---|
| | | | | Evaluation | | | | |
| | | | | Resist saving properties | | Defect inhibition performance | | |
| | | Affinity | | | Film thickness | | Residue in unexposed | |
| | Type | Rsq1 | SRsq | Uniformity | controllability | Pattern collapse | portion | BRIDGE |
| Example 67 | 2 | A | A | A | A | AA | AA | A |
| Example 68 | 2 | A | A | A | A | AA | AA | A |
| Example 69 | 2 | A | A | A | A | AA | AA | A |
| Example 70 | 2 | A | A | A | A | AA | AA | A |
| Example 71 | 2 | A | A | A | B | A | AA | A |
| Example 72 | 2 | A | A | A | A | AA | AA | A |
| Example 73 | 2 | A | A | A | A | AA | AA | AA |
| Example 74 | 2 | A | A | A | A | AA | AA | AA |
| Example 75 | 2 | A | A | A | B | A | AA | A |
| Example 76 | 2 | A | A | A | A | AA | AA | A |
| Example 77 | 2 | A | A | A | A | AA | AA | AA |
| Example 78 | 2 | A | B | B | A | AA | B | AA |
| Example 79 | 2 | A | A | A | A | AA | AA | AA |
| Example 80 | 2 | A | A | A | A | AA | AA | AA |

TABLE 1-2-8

| | Resist composition | | | | | | | |
|---|---|---|---|---|---|---|---|---|
| | | | | Evaluation | | | | |
| | | | | Resist saving properties | | Defect inhibition performance | | |
| | | Affinity | | | Film thickness | | Residue in unexposed | |
| | Type | Rsq1 | SRsq | Uniformity | controllability | Pattern collapse | portion | BRIDGE |
| Example 41 | 3 | A | A | A | A | AA | AA | B |
| Example 42 | 3 | A | A | A | A | AA | AA | B |
| Example 43 | 3 | A | B | A | A | AA | A | AA |
| Example 44 | 3 | A | B | A | A | A | A | B |
| Example 45 | 3 | A | A | A | A | AA | AA | AA |
| Example 46 | 3 | A | A | A | B | A | AA | A |
| Example 47 | 3 | A | A | A | A | AA | AA | AA |
| Example 48 | 3 | A | A | A | A | AA | AA | AA |
| Example 49 | 3 | A | A | A | A | AA | AA | AA |
| Example 50 | 3 | A | A | A | A | AA | AA | AA |
| Example 51 | 3 | A | A | A | A | AA | AA | AA |
| Example 52 | 3 | A | A | A | A | AA | AA | AA |
| Example 53 | 3 | A | A | A | A | AA | AA | B |
| Example 54 | 3 | A | B | B | A | AA | A | AA |
| Example 55 | 3 | A | B | A | B | AA | A | AA |
| Example 56 | 3 | A | B | A | A | AA | A | AA |
| Example 57 | 3 | A | A | A | A | AA | AA | AA |
| Example 58 | 3 | A | A | A | A | AA | AA | AA |
| Example 59 | 3 | A | A | A | A | AA | AA | AA |
| Example 60 | 3 | A | A | A | A | AA | AA | AA |
| Example 61 | 3 | A | A | A | A | AA | AA | AA |
| Example 62 | 3 | A | A | A | A | AA | AA | AA |
| Example 63 | 3 | A | A | A | A | AA | AA | AA |
| Example 64 | 3 | A | A | A | A | AA | AA | AA |
| Example 65 | 3 | A | A | A | A | AA | AA | AA |
| Example 66 | 3 | A | A | A | A | AA | AA | AA |
| Example 67 | 3 | A | A | A | A | AA | AA | A |
| Example 68 | 3 | A | A | A | A | AA | AA | A |
| Example 69 | 3 | A | A | A | A | AA | AA | A |
| Example 70 | 3 | A | A | A | A | AA | AA | A |
| Example 71 | 3 | A | A | A | B | A | AA | A |
| Example 72 | 3 | A | A | A | A | AA | AA | AA |
| Example 73 | 3 | A | A | A | A | AA | AA | AA |
| Example 74 | 3 | A | A | A | A | AA | AA | AA |
| Example 75 | 3 | A | A | A | B | A | AA | A |
| Example 76 | 3 | A | A | A | A | AA | AA | AA |
| Example 77 | 3 | A | A | A | A | AA | AA | AA |

TABLE 1-2-8-continued

| | | Resist composition | | | | | |
|---|---|---|---|---|---|---|---|
| | | | Evaluation | | | | |
| | | | Resist saving properties | | Defect inhibition performance | | |
| | Affinity | | | Film thickness | | Residue in unexposed | |
| | Type | Rsq1 | SRsq | Uniformity | controllability | Pattern collapse | portion | BRIDGE |
| Example 78 | 3 | A | B | B | A | AA | B | A |
| Example 79 | 3 | A | A | A | A | AA | AA | AA |
| Example 80 | 3 | A | A | A | A | AA | AA | AA |

TABLE 1-2-9

| | | Resist composition | | | | | |
|---|---|---|---|---|---|---|---|
| | | | Evaluation | | | | |
| | | | Resist saving properties | | Defect inhibition performance | | |
| | Affinity | | | Film thickness | | Residue in unexposed | |
| | Type | Rsq1 | SRsq | Uniformity | controllability | Pattern collapse | portion | BRIDGE |
| Example 41 | 4 | A | A | A | A | AA | AA | B |
| Example 42 | 4 | A | A | A | A | AA | AA | B |
| Example 43 | 4 | A | B | A | A | AA | A | AA |
| Example 44 | 4 | A | B | A | A | A | A | B |
| Example 45 | 4 | A | A | A | A | AA | AA | AA |
| Example 46 | 4 | A | A | A | B | A | AA | A |
| Example 47 | 4 | A | A | A | A | AA | AA | AA |
| Example 48 | 4 | A | A | A | A | AA | AA | AA |
| Example 49 | 4 | A | A | A | A | AA | AA | AA |
| Example 50 | 4 | A | A | A | A | AA | AA | AA |
| Example 51 | 4 | A | A | A | A | AA | AA | AA |
| Example 52 | 4 | A | A | A | A | AA | AA | AA |
| Example 53 | 4 | A | A | A | A | AA | AA | B |
| Example 54 | 4 | A | A | A | A | AA | A | AA |
| Example 55 | 4 | A | A | A | B | AA | A | AA |
| Example 56 | 4 | A | A | A | A | AA | A | AA |
| Example 57 | 4 | B | A | A | A | AA | A | A |
| Example 58 | 4 | B | A | A | A | AA | AA | A |
| Example 59 | 4 | A | A | A | A | AA | AA | AA |
| Example 60 | 4 | A | A | A | A | AA | AA | AA |
| Example 61 | 4 | A | A | A | A | AA | AA | AA |
| Example 62 | 4 | A | A | A | A | AA | AA | AA |
| Example 63 | 4 | A | A | A | A | AA | AA | AA |
| Example 64 | 4 | A | A | A | A | AA | AA | AA |
| Example 65 | 4 | A | A | A | A | AA | AA | AA |
| Example 66 | 4 | A | A | A | A | AA | AA | AA |
| Example 67 | 4 | A | A | A | A | AA | AA | A |
| Example 68 | 4 | A | A | A | A | AA | AA | A |
| Example 69 | 4 | A | A | A | A | AA | AA | A |
| Example 70 | 4 | A | A | A | A | AA | AA | A |
| Example 71 | 4 | A | A | A | B | A | AA | A |
| Example 72 | 4 | A | A | A | A | AA | AA | AA |
| Example 73 | 4 | A | A | A | A | AA | AA | AA |
| Example 74 | 4 | A | A | A | A | AA | AA | AA |
| Example 75 | 4 | A | A | A | B | A | AA | A |
| Example 76 | 4 | A | A | A | A | AA | AA | AA |
| Example 77 | 4 | A | A | A | A | AA | AA | AA |
| Example 78 | 4 | A | B | A | A | AA | B | A |
| Example 79 | 4 | A | A | A | A | AA | AA | AA |
| Example 80 | 4 | A | A | A | A | AA | AA | AA |

TABLE 1-2-10

| | | Resist composition | | | | | | |
|---|---|---|---|---|---|---|---|---|
| | | | | Evaluation | | | | |
| | | | | Resist saving properties | | Defect inhibition performance | | |
| | | Affinity | | | Film | | Residue in | |
| | | | | | thickness | | unexposed | |
| | Type | Rsq1 | SRsq | Uniformity | controllability | Pattern collapse | portion | BRIDGE |
| Example 41 | 5 | A | A | A | A | AA | AA | B |
| Example 42 | 5 | A | A | A | A | AA | AA | B |
| Example 43 | 5 | A | B | A | A | AA | A | AA |
| Example 44 | 5 | A | B | A | A | A | A | B |
| Example 45 | 5 | A | A | A | A | AA | AA | AA |
| Example 46 | 5 | A | A | A | B | A | AA | A |
| Example 47 | 5 | A | A | A | A | AA | AA | AA |
| Example 48 | 5 | A | A | A | A | AA | AA | AA |
| Example 49 | 5 | A | A | A | A | AA | AA | AA |
| Example 50 | 5 | A | A | A | A | AA | AA | AA |
| Example 51 | 5 | B | A | A | A | A | A | A |
| Example 52 | 5 | A | A | A | A | AA | AA | AA |
| Example 53 | 5 | A | A | A | A | AA | AA | B |
| Example 54 | 5 | A | A | A | A | AA | A | AA |
| Example 55 | 5 | A | A | A | B | AA | A | AA |
| Example 56 | 5 | B | A | A | A | A | B | A |
| Example 57 | 5 | B | A | A | A | AA | B | A |
| Example 58 | 5 | B | A | A | A | AA | A | A |
| Example 59 | 5 | A | A | A | A | AA | AA | AA |
| Example 60 | 5 | A | A | A | A | AA | AA | AA |
| Example 61 | 5 | B | A | A | A | AA | B | A |
| Example 62 | 5 | A | A | A | A | AA | AA | AA |
| Example 63 | 5 | A | A | A | A | AA | AA | AA |
| Example 64 | 5 | A | A | A | A | AA | AA | AA |
| Example 65 | 5 | A | A | A | A | AA | AA | AA |
| Example 66 | 5 | B | A | A | A | AA | B | A |
| Example 67 | 5 | A | A | A | A | AA | AA | A |
| Example 68 | 5 | B | A | A | A | AA | AA | A |
| Example 69 | 5 | A | A | A | A | AA | AA | A |
| Example 70 | 5 | A | A | A | A | AA | AA | A |
| Example 71 | 5 | A | A | A | B | A | AA | A |
| Example 72 | 5 | A | A | A | A | AA | AA | AA |
| Example 73 | 5 | A | A | A | A | AA | AA | AA |
| Example 74 | 5 | A | A | A | A | AA | AA | AA |
| Example 75 | 5 | A | A | A | B | A | AA | A |
| Example 76 | 5 | A | A | A | A | AA | AA | AA |
| Example 77 | 5 | A | A | A | A | AA | AA | AA |
| Example 78 | 5 | A | B | A | A | AA | B | A |
| Example 79 | 5 | A | A | A | A | AA | AA | AA |
| Example 80 | 5 | A | A | A | A | AA | AA | AA |

TABLE 1-2-11

| | | Resist composition | | | | | | |
|---|---|---|---|---|---|---|---|---|
| | | | | Evaluation | | | | |
| | | | | Resist saving properties | | Defect inhibition performance | | |
| | | Affinity | | | Film | | Residue in | |
| | | | | | thickness | | unexposed | |
| | Type | Rsq1 | SRsq | Uniformity | controllability | Pattern collapse | portion | BRIDGE |
| Example 41 | 6 | A | A | A | A | AA | AA | B |
| Example 42 | 6 | A | A | A | A | AA | AA | B |
| Example 43 | 6 | A | B | A | A | AA | A | AA |
| Example 44 | 6 | A | B | A | A | A | A | B |
| Example 45 | 6 | A | A | A | A | AA | AA | AA |
| Example 46 | 6 | A | A | A | B | A | AA | A |
| Example 47 | 6 | A | A | A | A | AA | AA | AA |
| Example 48 | 6 | A | A | A | A | AA | AA | AA |
| Example 49 | 6 | A | A | A | A | AA | AA | AA |
| Example 50 | 6 | A | A | A | A | AA | AA | AA |
| Example 51 | 6 | A | A | A | A | AA | AA | AA |

TABLE 1-2-11-continued

| | | Resist composition | | | | | | |
|---|---|---|---|---|---|---|---|---|
| | | | | Evaluation | | | | |
| | | | Resist saving properties | | | Defect inhibition performance | | |
| | | Affinity | | | Film thickness | | Residue in unexposed | |
| | Type | Rsq1 | SRsq | Uniformity | controllability | Pattern collapse | portion | BRIDGE |
| Example 52 | 6 | A | A | A | A | AA | AA | AA |
| Example 53 | 6 | A | A | A | A | AA | AA | B |
| Example 54 | 6 | A | A | A | A | AA | A | AA |
| Example 55 | 6 | A | A | A | B | AA | A | AA |
| Example 56 | 6 | A | A | A | A | AA | A | AA |
| Example 57 | 6 | B | A | A | A | AA | A | A |
| Example 58 | 6 | B | A | A | A | AA | AA | A |
| Example 59 | 6 | A | A | A | A | AA | AA | AA |
| Example 60 | 6 | A | A | A | A | AA | AA | AA |
| Example 61 | 6 | A | A | A | A | AA | AA | AA |
| Example 62 | 6 | A | A | A | A | AA | AA | AA |
| Example 63 | 6 | A | A | A | A | AA | AA | AA |
| Example 64 | 6 | A | A | A | A | AA | AA | AA |
| Example 65 | 6 | A | A | A | A | AA | AA | AA |
| Example 66 | 6 | A | A | A | A | AA | AA | AA |
| Example 67 | 6 | A | A | A | A | AA | AA | A |
| Example 68 | 6 | A | A | A | A | AA | AA | A |
| Example 69 | 6 | A | A | A | A | AA | AA | A |
| Example 70 | 6 | A | A | A | A | AA | AA | A |
| Example 71 | 6 | A | A | A | B | A | AA | A |
| Example 72 | 6 | A | A | A | A | AA | AA | AA |
| Example 73 | 6 | A | A | A | A | AA | AA | AA |
| Example 74 | 6 | A | A | A | A | AA | AA | AA |
| Example 75 | 6 | A | A | A | B | A | AA | A |
| Example 76 | 6 | A | A | A | A | AA | AA | AA |
| Example 77 | 6 | A | A | A | A | AA | AA | AA |
| Example 78 | 6 | A | B | A | A | AA | B | A |
| Example 79 | 6 | A | A | A | A | AA | AA | AA |
| Example 80 | 6 | A | A | A | A | AA | AA | AA |

TABLE 1-3-1

| | | Chemical liquid Composition of mixture First organic solvent | | | | | |
|---|---|---|---|---|---|---|---|
| | Type | Content (% by mass) | Molar mass (g/mol) | Vapor pressure (Pa) | Surface tension (mN/m) | δh (Mpa)$^{0.5}$ | δd (Mpa)$^{0.5}$ |
| Example 81 | EGMEA | 80 | 98.1 | 380 | 30.7 | 8.1 | 15.9 |
| Example 82 | EGMEA | 80 | 98.1 | 380 | 30.7 | 8.1 | 15.9 |
| Example 83 | EGMEA | 90 | 98.1 | 380 | 30.7 | 8.1 | 15.9 |
| Example 84 | EGMEA | 90 | 98.1 | 380 | 30.7 | 8.1 | 15.9 |
| Example 85 | EGMEA | 90 | 98.1 | 380 | 30.7 | 8.1 | 15.9 |
| Example 86 | MMP | 50 | 98.1 | 320 | 30.2 | 8.1 | 15.9 |
| Example 87 | MMP | 80 | 98.1 | 320 | 30.2 | 8.1 | 15.9 |
| Example 88 | MMP | 80 | 98.1 | 320 | 30.2 | 8.1 | 15.9 |
| Example 89 | MMP | 90 | 98.1 | 320 | 30.2 | 8.1 | 15.9 |
| Example 90 | MMP | 90 | 98.1 | 320 | 30.2 | 8.1 | 15.9 |
| Example 91 | MMP | 90 | 98.1 | 320 | 30.2 | 8.1 | 15.9 |
| Example 92 | EEP | 30 | | 160 | 27.2 | 6.9 | 16.0 |
| Comparative Example 1 | | | | | | | |
| Comparative Example 2 | PGMEA | 18 | 132.2 | 493 | 27.9 | 9.8 | 15.6 |
| Comparative Example 3 | CyHx | 20 | 98.1 | 507 | 34.1 | 5.1 | 17.8 |
| Comparative Example 4 | PGMEA | 50 | 132.2 | 493 | 27.9 | 9.8 | 15.6 |
| Comparative Example 5 | PGMEA | 50 | 132.2 | 493 | 27.9 | 9.8 | 15.6 |
| Example 93 | MMP | 5 | 98.1 | 320 | 30.2 | 8.1 | 15.9 |
| Example 94 | MMP | 30 | 98.1 | 320 | 30.2 | 8.1 | 15.9 |

TABLE 1-3-2

| | Chemical liquid Composition of mixture First organic solvent | | | | | | |
|---|---|---|---|---|---|---|---|
| | Type | Content (% by mass) | Molar mass (g/mol) | Vapor pressure (Pa) | Surface tension (mN/m) | δh (Mpa)$^{0.5}$ | δd (Mpa)$^{0.5}$ |
| Example 81 | DBCPN | 20 | 130.2 | 400 | 30.2 | 4.2 | 16.6 |
| Example 82 | | | | | | | |
| Example 83 | | | | | | | |
| Example 84 | | | | | | | |
| Example 85 | | | | | | | |
| Example 86 | PGMEA | 50 | 132.2 | 493 | 27.9 | 9.8 | 15.6 |
| Example 87 | | | | | | | |
| Example 88 | DBCPN | 20 | 130.2 | 400 | 30.2 | 4.2 | 16.6 |
| Example 89 | | | | | | | |
| Example 90 | | | | | | | |
| Example 91 | | | | | | | |
| Example 92 | EL | 70 | 118.1 | 333 | 29.8 | 12.5 | 16.0 |
| Comparative Example 1 | | | | | | | |
| Comparative Example 2 | | | | | | | |
| Comparative Example 3 | PGMEA | 80 | 132.2 | 493 | 27.9 | 9.8 | 15.6 |
| Comparative Example 4 | EL | 10 | 118.1 | 333 | 29.8 | 12.5 | 16.0 |
| Comparative Example 5 | EL | 50 | 118.1 | 333 | 29.8 | 12.5 | 16.0 |
| Example 93 | PGMEA | 95 | 132.2 | 493 | 27.9 | 9.8 | 15.6 |
| Example 94 | | | | | | | |

TABLE 1-3-3

| | Chemical liquid Composition of mixture First organic solvent | | | | | | |
|---|---|---|---|---|---|---|---|
| | Type | Content (% by mass) | Molar mass (g/mol) | Vapor pressure (Pa) | Surface tension (mN/m) | δh (Mpa)$^{0.5}$ | δd (Mpa)$^{0.5}$ |
| Example 81 | | | | | | | |
| Example 82 | | | | | | | |
| Example 83 | | | | | | | |
| Example 84 | | | | | | | |
| Example 85 | | | | | | | |
| Example 86 | | | | | | | |
| Example 87 | | | | | | | |
| Example 88 | | | | | | | |
| Example 89 | | | | | | | |
| Example 90 | | | | | | | |
| Example 91 | | | | | | | |
| Example 92 | | | | | | | |
| Comparative Example 1 | | | | | | | |
| Comparative Example 2 | | | | | | | |
| Comparative Example 3 | | | | | | | |
| Comparative Example 4 | HBM | 40 | 118.1 | 360 | 29.1 | 12.2 | 16.5 |
| Comparative Example 5 | | | | | | | |
| Example 93 | | | | | | | |
| Example 94 | | | | | | | |

TABLE 1-3-4

| | Chemical liquid Composition of mixture Second organic solvent | | | | | | |
|---|---|---|---|---|---|---|---|
| | Type | Content (% by mass) | Molar mass (g/mol) | Vapor pressure (Pa) | Surface tension (mN/m) | δh (Mpa)$^{0.5}$ | δd (Mpa)$^{0.5}$ |
| Example 81 | | | | | | | |
| Example 82 | PGME | 20 | 90.1 | 1,453 | 27.6 | 13.3 | 16.4 |
| Example 83 | | | | | | | |
| Example 84 | | | | | | | |
| Example 85 | | | | | | | |
| Example 86 | | | | | | | |
| Example 87 | PGME | 20 | 90.1 | 1,453 | 27.6 | 13.3 | 16.4 |
| Example 88 | | | | | | | |
| Example 89 | | | | | | | |
| Example 90 | | | | | | | |
| Example 91 | | | | | | | |
| Example 92 | | | | | | | |
| Comparative Example 1 | PGME | 60 | 90.1 | 1,453 | 27.6 | 13.3 | 16.4 |
| Comparative Example 2 | PGME | 42 | 90.1 | 1,453 | 27.6 | 13.3 | 16.4 |
| Comparative Example 3 | | | | | | | |
| Comparative Example 4 | | | | | | | |
| Comparative Example 5 | | | | | | | |
| Example 93 | | | | | | | |
| Example 94 | PGME | 70 | 90.1 | 1453 | 27.6 | 13.3 | 16.4 |

TABLE 1-3-5

| | Chemical liquid | | | | | | | |
|---|---|---|---|---|---|---|---|---|
| | Composition of mixture Third organic solvent | | | | | | | Ether-based compound |
| | Type | Content (% by mass) | Molar mass (g/mol) | Vapor pressure (Pa) | Surface tension (mN/m) | δh (Mpa)$^{0.5}$ | δd (Mpa)$^{0.5}$ | Content (mass ppm) |
| Example 81 | | | | | | | | 0 |
| Example 82 | | | | | | | | 0 |
| Example 83 | GBL | 10 | 86.1 | 147 | 44.1 | 7.0 | 17.4 | 0 |
| Example 84 | DMSO | 10 | 78.1 | 13 | 43.6 | 10.2 | 18.4 | 0 |
| Example 85 | PC | 10 | 102.1 | 53 | 40.9 | 6.5 | 17.3 | 0 |
| Example 86 | | | | | | | | 0 |
| Example 87 | | | | | | | | 0 |
| Example 88 | | | | | | | | 0 |
| Example 89 | GBL | 10 | 86.1 | 147 | 44.1 | 7.0 | 17.4 | 0 |
| Example 90 | DMSO | 10 | 78.1 | 13 | 43.6 | 10.2 | 18.4 | 0 |
| Example 91 | PC | 10 | 102.1 | 53 | 40.9 | 6.5 | 17.3 | 0 |
| Example 92 | | | | | | | | 0 |
| Comparative Example 1 | GBL | 40 | 86.1 | 147 | 44.1 | 7.0 | 17.4 | 0 |
| Comparative Example 2 | GBL | 40 | 86.1 | 147 | 44.1 | 7.0 | 17.4 | 0 |
| Comparative Example 3 | | | | | | | | 0 |
| Comparative Example 4 | | | | | | | | 10 |
| Comparative Example 5 | | | | | | | | 0 |
| Example 93 | | | | | | | | 0 |
| Example 94 | | | | | | | | 0 |

TABLE 1-3-6

| | Chemical liquid Physical properties of mixture | | Resist composition | | | | | | | |
|---|---|---|---|---|---|---|---|---|---|---|
| | | | | | | Evaluation | | | | |
| | | | | | | Resist saving properties | | Defect inhibition performance | | |
| | Vapor pressure (Pa) | Surface tension (mN/m) | Type | Affinity Rsq1 | SRsq | Uniformity | Film thickness controllability | Pattern collapse | Residue in unexposed portion | BRIDGE |
| Example 81 | 366 | 30.6 | 1 | A | A | A | A | AA | AA | AA |
| Example 82 | 594 | 30.0 | 1 | A | B | A | A | AA | A | AA |
| Example 83 | 336 | 32.2 | 1 | A | A | A | A | AA | AA | AA |
| Example 84 | 318 | 32.3 | 1 | A | A | A | A | AA | AA | AA |
| Example 85 | 330 | 31.7 | 1 | A | A | A | A | AA | AA | AA |
| Example 86 | 394 | 29.2 | 1 | A | A | A | A | AA | AA | AA |
| Example 87 | 562 | 29.6 | 1 | A | B | A | A | AA | A | AA |
| Example 88 | 333 | 30.2 | 1 | A | A | A | A | AA | AA | AA |
| Example 89 | 300 | 31.8 | 1 | A | A | A | A | AA | AA | AA |
| Example 90 | 282 | 31.8 | 1 | A | A | A | A | AA | AA | AA |
| Example 91 | 294 | 31.2 | 1 | A | A | A | A | AA | AA | AA |
| Example 92 | 333 | 29.8 | 1 | A | B | A | A | AA | A | AA |
| Comparative Example 1 | 916 | 34.4 | 1 | B | B | A | C | AA | D | B |
| Comparative Example 2 | 762 | 34.8 | 1 | B | B | A | A | AA | D | B |
| Comparative Example 3 | 497 | 29.5 | 1 | A | A | C | A | AA | AA | AA |
| Comparative Example 4 | 420 | 28.6 | 1 | A | B | B | C | A | D | A |
| Comparative Example 5 | 409 | 28.9 | 1 | A | B | B | C | AA | B | A |
| Example 93 | 482 | 28.1 | 1 | A | B | B | B | AA | B | A |
| Example 94 | 1,133 | 28.3 | 1 | B | B | B | B | AA | B | B |

TABLE 1-3-7

| | Resist composition | | | | | | | |
|---|---|---|---|---|---|---|---|---|
| | | | | Evaluation | | | | |
| | | | | Resist saving properties | | Defect inhibition performance | | |
| | | Affinity | | | Film thickness | | Residue in unexposed | |
| | Type | Rsq1 | SRsq | Uniformity | controllability | Pattern collapse | portion | BRIDGE |
| Example 81 | 2 | A | A | A | A | AA | AA | AA |
| Example 82 | 2 | A | A | A | A | AA | AA | AA |
| Example 83 | 2 | A | A | A | A | AA | AA | AA |
| Example 84 | 2 | A | A | A | A | AA | AA | AA |
| Example 85 | 2 | A | A | A | A | AA | AA | AA |
| Example 86 | 2 | A | A | A | A | AA | AA | AA |
| Example 87 | 2 | A | A | A | A | AA | AA | AA |
| Example 88 | 2 | A | A | A | A | AA | AA | AA |
| Example 89 | 2 | A | A | A | A | AA | AA | AA |
| Example 90 | 2 | A | A | A | A | AA | AA | AA |
| Example 91 | 2 | A | A | A | A | AA | AA | AA |
| Example 92 | 2 | A | A | A | A | AA | AA | AA |
| Comparative Example 1 | 2 | B | B | A | C | AA | D | B |
| Comparative Example 2 | 2 | B | B | A | A | AA | D | B |
| Comparative Example 3 | 2 | A | A | C | A | AA | AA | AA |
| Comparative Example 4 | 2 | A | B | B | A | A | C | A |
| Comparative Example 5 | 2 | A | B | B | C | AA | B | A |
| Example 93 | 2 | A | B | B | B | AA | B | A |
| Example 94 | 2 | B | B | B | B | AA | B | B |

TABLE 1-3-8

| | Resist composition | | | | | | |
|---|---|---|---|---|---|---|---|
| | | | | Evaluation | | | |
| | | | Resist saving properties | | Defect inhibition performance | | |
| | | Affinity | | Film | | Residue in | |
| | Type | Rsq1 SRsq | Uniformity | thickness controllability | Pattern collapse | unexposed portion | BRIDGE |
| Example 81 | 3 | A A | A | A | AA | AA | AA |
| Example 82 | 3 | A A | A | A | AA | AA | AA |
| Example 83 | 3 | A A | A | A | AA | AA | AA |
| Example 84 | 3 | A A | A | A | AA | AA | AA |
| Example 85 | 3 | A A | A | A | AA | AA | AA |
| Example 86 | 3 | A A | A | A | AA | AA | AA |
| Example 87 | 3 | A A | A | A | AA | AA | AA |
| Example 88 | 3 | A A | A | A | AA | AA | AA |
| Example 89 | 3 | A A | A | A | AA | AA | AA |
| Example 90 | 3 | A A | A | A | AA | AA | AA |
| Example 91 | 3 | A A | A | A | AA | AA | AA |
| Example 92 | 3 | A A | A | A | AA | AA | AA |
| Comparative Example 1 | 3 | A A | A | C | AA | AA | B |
| Comparative Example 2 | 3 | A B | A | A | AA | C | B |
| Comparative Example 3 | 3 | A B | A | A | AA | C | AA |
| Comparative Example 4 | 3 | A B | B | A | A | C | A |
| Comparative Example 5 | 3 | A B | B | C | AA | B | A |
| Example 93 | 3 | A A | B | B | AA | B | A |
| Example 94 | 3 | A B | B | B | AA | B | B |

TABLE 1-3-9

| | Resist composition | | | | | | |
|---|---|---|---|---|---|---|---|
| | | | | Evaluation | | | |
| | | | Resist saving properties | | Defect inhibition performance | | |
| | | Affinity | | Film | | Residue in | |
| | Type | Rsq1 SRsq | Uniformity | thickness controllability | Pattern collapse | unexposed portion | BRIDGE |
| Example 81 | 4 | A A | A | A | AA | AA | AA |
| Example 82 | 4 | A A | A | A | AA | AA | AA |
| Example 83 | 4 | A A | A | A | AA | AA | AA |
| Example 84 | 4 | A A | A | A | AA | AA | AA |
| Example 85 | 4 | A A | A | A | AA | AA | AA |
| Example 86 | 4 | A A | A | A | AA | AA | AA |
| Example 87 | 4 | A A | A | A | AA | AA | AA |
| Example 88 | 4 | A A | A | A | AA | AA | AA |
| Example 89 | 4 | A A | A | A | AA | AA | AA |
| Example 90 | 4 | A A | A | A | AA | AA | AA |
| Example 91 | 4 | A A | A | A | AA | AA | AA |
| Example 92 | 4 | A A | A | A | AA | AA | AA |
| Comparative Example 1 | 4 | A A | A | C | AA | AA | B |
| Comparative Example 2 | 4 | A A | A | B | AA | AA | B |
| Comparative Example 3 | 4 | B A | A | A | AA | A | AA |
| Comparative Example 4 | 4 | A A | A | B | A | AA | A |
| Comparative Example 5 | 4 | A A | A | C | A | AA | A |
| Example 93 | 4 | A A | A | B | AA | AA | A |
| Example 94 | 4 | A A | A | B | AA | AA | B |

TABLE 1-3-10

| | Resist composition | | | | | | | |
|---|---|---|---|---|---|---|---|---|
| | | | | Evaluation | | | | |
| | | | | Resist saving properties | | Defect inhibition performance | | |
| | | Affinity | | | Film thickness | | Residue in unexposed | |
| | Type | Rsq1 | SRsq | Uniformity | controllability | Pattern collapse | portion | BRIDGE |
| Example 81 | 5 | A | A | A | A | AA | AA | AA |
| Example 82 | 5 | A | A | A | A | AA | AA | AA |
| Example 83 | 5 | A | A | A | A | AA | AA | AA |
| Example 84 | 5 | A | A | A | A | AA | AA | AA |
| Example 85 | 5 | A | A | A | A | AA | AA | AA |
| Example 86 | 5 | A | A | A | A | AA | AA | AA |
| Example 87 | 5 | A | A | A | A | AA | AA | AA |
| Example 88 | 5 | A | A | A | A | AA | AA | AA |
| Example 89 | 5 | A | A | A | A | AA | AA | AA |
| Example 90 | 5 | A | A | A | A | AA | AA | AA |
| Example 91 | 5 | A | A | A | A | AA | AA | AA |
| Example 92 | 5 | A | A | A | A | AA | AA | AA |
| Comparative Example 1 | 5 | A | A | A | C | AA | AA | B |
| Comparative Example 2 | 5 | A | A | A | B | AA | AA | B |
| Comparative Example 3 | 5 | B | A | A | A | AA | A | AA |
| Comparative Example 4 | 5 | A | A | A | B | A | AA | A |
| Comparative Example 5 | 5 | A | A | A | C | A | AA | A |
| Example 93 | 5 | A | A | A | B | AA | AA | A |
| Example 94 | 5 | A | A | A | B | AA | AA | B |

TABLE 1-3-11

| | Resist composition | | | | | | | |
|---|---|---|---|---|---|---|---|---|
| | | | | Evaluation | | | | |
| | | | | Resist saving properties | | Defect inhibition performance | | |
| | | Affinity | | | Film thickness | | Residue in unexposed | |
| | Type | Rsq1 | SRsq | Uniformity | controllability | Pattern collapse | portion | BRIDGE |
| Example 81 | 6 | A | A | A | A | AA | AA | AA |
| Example 82 | 6 | A | A | A | A | AA | AA | AA |
| Example 83 | 6 | A | A | A | A | AA | AA | AA |
| Example 84 | 6 | A | A | A | A | AA | AA | AA |
| Example 85 | 6 | A | A | A | A | AA | AA | AA |
| Example 86 | 6 | A | A | A | A | AA | AA | AA |
| Example 87 | 6 | A | A | A | A | AA | AA | AA |
| Example 88 | 6 | A | A | A | A | AA | AA | AA |
| Example 89 | 6 | A | A | A | A | AA | AA | AA |
| Example 90 | 6 | A | A | A | A | AA | AA | AA |
| Example 91 | 6 | A | A | A | A | AA | AA | AA |
| Example 92 | 6 | A | A | A | A | AA | AA | AA |
| Comparative Example 1 | 6 | A | A | A | C | AA | AA | B |
| Comparative Example 2 | 6 | A | A | A | B | AA | AA | B |
| Comparative Example 3 | 6 | B | A | A | A | AA | A | AA |
| Comparative Example 4 | 6 | A | A | A | B | A | AA | A |
| Comparative Example 5 | 6 | A | A | A | C | A | AA | A |
| Example 93 | 6 | A | A | A | B | AA | AA | A |
| Example 94 | 6 | A | A | A | B | AA | AA | B |

Table 1 is divided into 33 tables of Table 1-1-1 to Table 1-3-11.

In Table 1, the chemical liquid of Example 1 is described in the respective lines of Table 1-1-1 to Table 1-1-11. That is, the chemical liquid of the example is described in the first line in each of Table 1-1-1 to Table 1-1-11. The tables show that the chemical liquid of Example 1 contains a mixture of 95% by mass of DBCPN (the physical properties of DBCPN are as described in the tables) as a first organic solvent and 5% by mass of GBL (the physical properties of GBL are as described in the tables) as a third organic solvent without a second organic solvent, in which the content of an ether-based compound is 0 mass ppm, and the mixture has physical properties including a vapor pressure of 381 Pa and a surface tension of 31.2 mN/m. Furthermore, the tables show that Rsq1 and SRsq indicating the affinity between the chemical liquid of Example 1 and the resist composition 1 are evaluated as "A", the chemical liquid of Example 1 is evaluated as "A" in terms of uniformity, "A" in terms of film thickness controllability, "AA" in terms of pattern collapse, "AA" in terms of residue in unexposed portion, and "AA" in terms of BRIDGE in a case where the chemical liquid is used for the resist composition 1. The tables show that Rsq1 and SRsq indicating the affinity between the chemical liquid of Example 1 and the resist composition 2 are evaluated as "A", the chemical liquid of Example 1 is evaluated as "A" in terms of uniformity, "A" in terms of film thickness controllability, "AA" in terms of pattern collapse, "AA" in terms of residue in unexposed portion, and "AA" in terms of BRIDGE in a case where the chemical liquid is used for the resist composition 2. The tables show that Rsq1 and SRsq indicating the affinity between the chemical liquid of Example 1 and the resist composition 3 are evaluated as "A", the chemical liquid of Example 1 is evaluated as "A" in terms of uniformity, "A" in terms of film thickness controllability, "AA" in terms of pattern collapse, "AA" in terms of residue in unexposed portion, and "AA" in terms of BRIDGE in a case where the chemical liquid is used for the resist composition 3. The tables show that Rsq1 and SRsq indicating the affinity between the chemical liquid of Example 1 and the resist composition 4 are evaluated as "B" and "A" respectively, the chemical liquid of Example 1 is evaluated as "A" in terms of uniformity, "A" in terms of film thickness controllability, "AA" in terms of pattern collapse, "A" in terms of residue in unexposed portion, and "A" in terms of BRIDGE in a case where the chemical liquid is used for the resist composition 4. The tables show that Rsq1 and SRsq indicating the affinity between the chemical liquid of Example 1 and the resist composition 5 are evaluated as "B" and "A", the chemical liquid of Example 1 is evaluated as "A" in terms of uniformity, "A" in terms of film thickness controllability, "AA" in terms of pattern collapse, "A" in terms of residue in unexposed portion, and "A" in terms of BRIDGE in a case where the chemical liquid is used for the resist composition 5. The tables show that Rsq1 and SRsq indicating the affinity between the chemical liquid of Example 1 and the resist composition 6 are evaluated as "B" and "A" respectively, the chemical liquid of Example 1 is evaluated as "A" in terms of uniformity, "A" in terms of film thickness controllability, "AA" in terms of pattern collapse, "AA" in terms of residue in unexposed portion, and "A" in terms of BRIDGE in a case where the chemical liquid is used for the resist composition 6. The same shall be applied to other examples and comparative examples. The components and the evaluation results of the chemical liquid of Example 41 are described in Table 1-2-1 to Table 1-2-11. The components and the evaluation results of the chemical liquid of Example 81 are described in Table 1-3-1 to Table 1-3-11. The same shall be applied to other examples and comparative examples.

In Table 1, "Content" of each organic solvent represents the content of each organic solvent in the mixture contained in the chemical liquid.

As described in Table 1, the chemical liquid of each of the examples had the effects of the present invention. In contrast, the chemical liquid of each of the comparative examples did not have the effects of the present invention.

The chemical liquid of Example 38, which contained a mixture having a vapor pressure within a range of 160 to 1,000 Pa at 25° C., had resist saving properties and defect inhibition performance better than those of the chemical liquid of Example 46. Furthermore, the chemical liquid of Example 38 had defect inhibition performance better than that of the chemical liquid of Example 17.

What is claimed is:
1. A chemical liquid comprising:
a mixture of two or more kinds of organic solvents;
wherein the organic solvents are selected from the group consisting of compounds represented by Formulae (1) to (7), compounds represented by Formulae (9) to (11), a 3- to 5-membered cyclic ketone compound that may have a substituent, a cyclic ketone compound with 6 or more members that may have a substituent, a lactone compound, and a lactam compound,
so that the chemical liquid does not contain an ether-based compound other than the compounds represented by Formula (1), Formula (5), Formula (7), Formula (9), and Formulae (10) to (11);
in the chemical liquid containing the ether-based compound other than the compounds represented by Formula (1), Formula (5), Formula (7), Formula (9), and Formulae (10) to (11), a content of the ether-based compound other than the compounds represented by Formula (1), Formula (5), Formula (7), Formula (9), and Formulae (10) to (11) in the chemical liquid is less than 10 mass ppm with respect to a total mass of the chemical liquid, and
the chemical liquid does not include a chemical liquid in which the mixture is formed of a lactone compound and the compound represented by Formula (5), a chemical liquid in which the mixture is formed of the cyclic ketone compound with 6 or more members that may have a substituent and the compound represented by Formula (1), a chemical liquid in which the mixture is formed of a lactone compound, the compound represented by Formula (1), and the compound represented by Formula (5), a chemical liquid in which the mixture is formed of the compound represented by Formula (1) and the compound represented by Formula (3), a chemical liquid in which the mixture is formed of the compound represented by Formula (1) and the compound represented by Formula (5), and a chemical liquid in which the mixture is formed of a lactone compound and the compound represented by Formula (11),

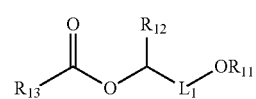

(1)

-continued

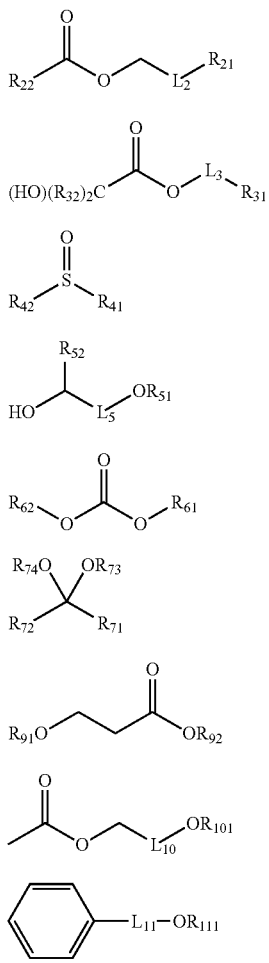

in Formula (1), $R_{11}$ and $R_{12}$ each independently represent an alkyl group, $R_{13}$ represents a hydrogen atom or an alkyl group, and $L_1$ represents a single bond or an alkylene group, in Formula (2), $R_{21}$ and $R_{22}$ each independently represent a hydrogen atom or an alkyl group, and $L_2$ represents a single bond or an alkylene group, in Formula (3), $R_{31}$ and $R_{32}$ each independently represent a hydrogen atom or an alkyl group, at least one of a plurality of $R_{32}$'s represents an alkyl group, and $L_3$ represents a single bond or an alkylene group, in Formula (4), $R_{41}$ and $R_{42}$ each independently represent an alkyl group, in Formula (5), $R_{51}$ and $R_{52}$ each independently represent an alkyl group, and $L_5$ represents a single bond or an alkylene group, in Formula (6), $R_{61}$ and $R_{62}$ each independently represent an alkyl group, and $R_{61}$ and $R_{62}$ may form a ring by being bonded to each other, in Formula (7), $R_{71}$, $R_{72}$, $R_{73}$, and $R_{74}$ each independently represent an alkyl group, and $R_{71}$ and $R_{72}$ may form a ring by being bonded to each other, in Formula (9), $R_{91}$ and $R_{92}$ each independently represent an alkyl group, in Formula (10), $L_{10}$ represents a single bond or an alkylene group, and $R_{101}$ represents an alkyl group, and in Formula (11), $L_{11}$ represents a single bond or an alkylene group, and $R_{111}$ represents an alkyl group.

2. The chemical liquid according to claim 1, consisting of the mixture of two or more kinds of organic solvents.

3. The chemical liquid according to claim 2, wherein a vapor pressure of the mixture is 160 to 1,000 Pa at 25° C.

4. The chemical liquid according to claim 2, wherein the mixture contains a first organic solvent which has a vapor pressure of 160 to 1,000 Pa at 25° C. and a second organic solvent which has a vapor pressure higher than 1,000 Pa at 25° C. or contains two or more kinds of the first organic solvents.

5. The chemical liquid according to claim 1, wherein a vapor pressure of the mixture is 160 to 1,000 Pa at 25° C.

6. The chemical liquid according to claim 1, wherein the mixture contains a first organic solvent which has a vapor pressure of 160 to 1,000 Pa at 25° C. and a second organic solvent which has a vapor pressure higher than 1,000 Pa at 25° C. or contains two or more kinds of the first organic solvents.

7. The chemical liquid according to claim 1, wherein the mixture contains a third organic solvent which has a vapor pressure lower than 160 Pa at 25° C.

8. The chemical liquid according to claim 1, wherein a surface tension of the mixture is equal to or higher than 28 mN/m at 25° C.

9. The chemical liquid according to claim 1, wherein the mixture contains an organic solvent having a Hansen solubility parameter higher than 9.5 (MPa) 0.5 in terms of a hydrogen bond element or having a Hansen solubility parameter higher than 15.5 (MPa) 0.5 in terms of a dispersion element.

10. The chemical liquid according to claim 1 that is used for pre-wetting.

11. A pattern forming method comprising:
a pre-wetting step of coating a substrate with the chemical liquid according to claim 1 so as to obtain a pre-wetted substrate;
a resist film forming step of forming a resist film on the pre-wetted substrate by using an actinic ray-sensitive or radiation-sensitive resin composition;
an exposure step of exposing the resist film; and
a development step of developing the exposed resist film by using a developer,
wherein the actinic ray-sensitive or radiation-sensitive resin composition contains a resin including at least one kind of repeating unit selected from the group consisting of a repeating unit represented by Formula (a), a repeating unit represented by Formula (b), a repeating unit represented by Formula (c), a repeating unit represented by Formula (d), and a repeating unit represented by Formula (e),

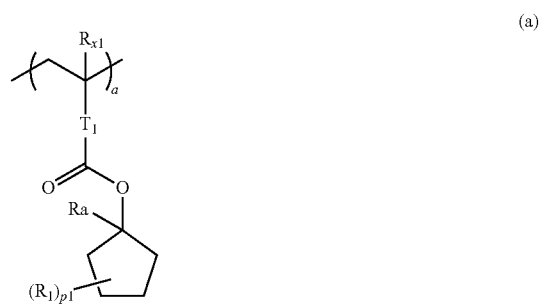

-continued

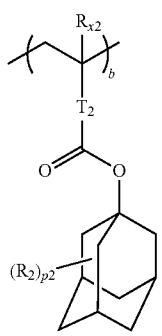

(b)

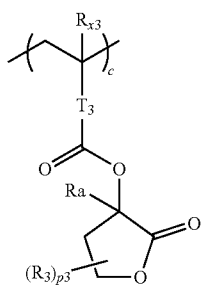

(c)

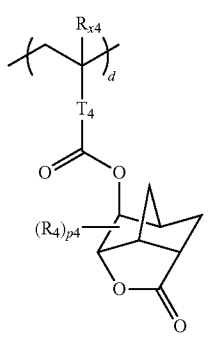

(d)

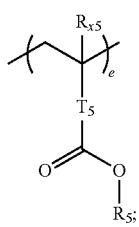

(e)

$R_{x1}$ to $R_{x5}$ each independently represent a hydrogen atom or an alkyl group which may have a substituent, $R_1$ to $R_4$ each independently represent a monovalent substituent, p1 to p4 each independently represent 0 or a positive integer, Ra represents a linear or branched alkyl group, $T_1$ to $T_5$ each independently represent a single bond or a divalent linking group, $R_5$ represents a monovalent organic group, a to e represent mol % and each independently represent a number included in a range of $0 \le a \le 100$, $0 \le b \le 100$, $0 \le c < 100$, $0 \le d < 100$, and $0 \le e < 100$, provided that $a+b+c+d+e=100$ and $a+b \ne 0$, and the repeating unit represented by Formula (e) is different from all of the repeating units represented by Formula (a) to Formula (d).

12. The pattern forming method according to claim 11, wherein the chemical liquid with which the substrate is coated in the pre-wetting step satisfies the following conditions 1 and 2 at 25° C., condition 1: Rsq1 calculated by Equation 1 based on a proton spin-spin relaxation time measured for the chemical liquid and a first test solution formed of the resin and the chemical liquid by using a pulsed nuclear magnetic resonance-type particle interface characteristic evaluator is higher than 0.5, $Rsq1 = (\tau 0 / \tau 1) - 1$ (Equation 1)

in Equation 1, $\tau 0$ represents the spin-spin relaxation time of the chemical liquid, and $\tau 1$ represents the spin-spin relaxation time of the first test solution, condition 2: SRsq calculated by Equation 2 based on the proton spin-spin relaxation time measured for a second test solution, which is formed of the resin and the chemical liquid and in which the content of the resin is different from the content of the resin in the first test solution, and the first test solution by using the pulsed nuclear magnetic resonance-type particle interface characteristic evaluator is higher than $-1$, $SRsq = (Rsq2 - Rsq1) / (c2 - c1)$ (Equation 2)

in Equation 2, Rsq1 represents a value calculated by Equation 1, Rsq2 represents a value calculated by the following Equation 3, c1 and c2 represent a mass-based content of the resin in the first test solution and the second test solution respectively, the unit of the mass-based content is % by mass, and $c2 > c1$, $Rsq2 = (\tau 0 / \tau 2) - 1$ (Equation 3)

in Equation 3, $\tau 0$ has the same definition as $\tau 0$ in Equation 1, and $\tau 2$ represents the spin-spin relaxation time of the second test solution.

13. A kit comprising:

the chemical liquid according to claim 1; and and an actinic ray-sensitive or radiation-sensitive resin composition which contains a resin including at least one kind of repeating unit selected from the group consisting of a repeating unit represented by Formula (a), a repeating unit represented by Formula (b), a repeating unit represented by Formula (c), a repeating unit represented by Formula (d), and a repeating unit represented by Formula (e),

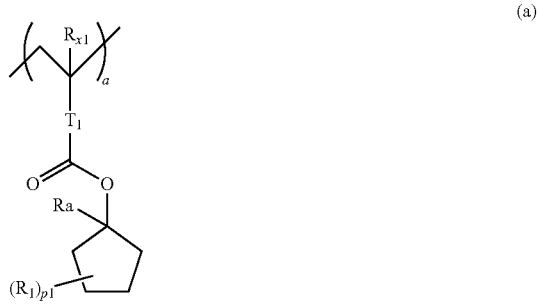

(a)

-continued

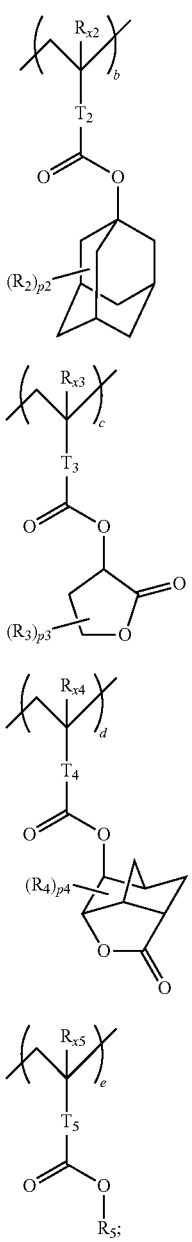

$R_{x1}$ to $R_{x5}$ each independently represent a hydrogen atom or an alkyl group which may have a substituent, $R_1$ to $R_4$ each independently represent a monovalent substituent, p1 to p4 each independently represent 0 or a positive integer, Ra represents a linear or branched alkyl group, $T_1$ to $T_5$ each independently represent a single bond or a divalent linking group, $R_5$ represents a monovalent organic group, a to e represent mol % and each independently represent a number included in a range of $0 \leq a \leq 100$, $0 \leq b \leq 100$, $0 \leq c < 100$, $0 \leq d < 100$, and $0 \leq e < 100$, provided that a+b+c+d+e=100 and a+b≠0, and the repeating unit represented by Formula (e) is different from all of the repeating units represented by Formula (a) to Formula (d).

14. A kit comprising:
the chemical liquid according to claim 1; and
an actinic ray-sensitive or radiation-sensitive resin composition,
wherein the actinic ray-sensitive or radiation-sensitive resin composition contains a resin which has a repeating unit having a phenolic hydroxyl group and has a group generating a polar group by being decomposed by the action of an acid.

15. A kit comprising:
the chemical liquid according to claim 1; and
an actinic ray-sensitive or radiation-sensitive resin composition,
wherein the actinic ray-sensitive or radiation-sensitive resin composition contains a hydrophobic resin and a resin which has a group generating a polar group by being decomposed by the action of an acid.

16. A kit comprising:
the chemical liquid according to claim 1; and
an actinic ray-sensitive or radiation-sensitive resin composition containing a resin,
wherein the kit satisfies the following conditions 1 and 2,
condition 1: Rsq1 calculated by Equation 1 based on a proton spin-spin relaxation time measured at 25° C. for the chemical liquid and a first test solution formed of the resin and the chemical liquid by using a pulsed nuclear magnetic resonance-type particle interface characteristic evaluator is higher than 0.5, $$Rsq1=(\tau 0/\tau 1)-1 \qquad \text{(Equation 1)}$$

in Equation 1, τ0 represents the spin-spin relaxation time of the chemical liquid, and τ1 represents the spin-spin relaxation time of the first test solution, condition 2: SRsq calculated by Equation 2 based on the proton spin-spin relaxation time measured at 25° C. for a second test solution, which is formed of the resin and the chemical liquid and in which the content of the resin is different from the content of the resin in the first test solution, and the first test solution by using the pulsed nuclear magnetic resonance-type particle interface characteristic evaluator is higher than −1, $$SRsq=(Rsq2-Rsq1)/(c2-c1) \qquad \text{(Equation 2)}$$

in Equation 2, Rsq1 represents a value calculated by Equation 1, Rsq2 represents a value calculated by Equation 3, c1 and c2 represent a mass-based content of the resin in the first test solution and the second test solution respectively, the unit of the mass-based content is % by mass, and c2>c1, $$Rsq2=(\tau 0/\tau 2)-1 \qquad \text{(Equation 3)}$$

in Equation 3, τ0 has the same definition as τ0 in Equation 1, and τ2 represents the spin-spin relaxation time of the second test solution.

17. A chemical liquid comprising:
a mixture of two or more kinds of organic solvents,
wherein the mixture contains γ-butyrolactone and at least one kind of organic solvent selected from the group consisting of butyl acetate, ethyl lactate, 2-hydroxymethyl isobutyrate, cyclopentanone dimethyl acetal, cyclopentanone, phenetole, ethylene glycol monomethyl ether acetate, 3-methoxymethyl propionate, and 3-ethoxyethyl propionate, contains dimethyl sulfoxide and at least one kind of organic solvent selected from the group consisting of propylene glycol monomethyl ether acetate, butyl acetate, ethyl lactate, 2-hydroxymethyl isobutyrate, propylene glycol monomethyl ether, cyclopentanone dimethyl acetal, cyclopentanone, cyclohexanone, anisole, phenetole, ethylene glycol monomethyl ether acetate, 3-methoxymethyl propionate, and 3-ethoxyethyl propionate, contains ethylene carbonate and at least one kind of organic solvent selected from the group consisting of propylene glycol monomethyl ether acetate, butyl acetate, ethyl lactate, 2-hydroxymethyl isobutyrate, propylene glycol monomethyl ether, cyclopentanone dimethyl acetal, cyclopentanone, cyclohexanone, anisole, phenetole, ethylene glycol monomethyl ether acetate, 3-methoxymethyl propionate, and 3-ethoxyethyl propionate, contains propylene carbonate and at least one kind of organic solvent selected from the group consisting of propylene glycol monomethyl ether acetate, butyl acetate, ethyl lactate, 2-hydroxymethyl isobutyrate, propylene glycol monomethyl ether, cyclopentanone dimethyl acetal, cyclopentanone, cyclohexanone, anisole, phenetole, ethylene glycol monomethyl ether acetate, 3-methoxymethyl propionate, and 3-ethoxyethyl propionate, contains 1-methyl-2-pyrrolidone and at least one kind of organic solvent selected from the group consisting of propylene glycol monomethyl ether acetate, butyl acetate, ethyl lactate, 2-hydroxymethyl isobutyrate, propylene glycol monomethyl ether, cyclopentanone dimethyl acetal, cyclopentanone, cyclohexanone, anisole, phenetole, ethylene glycol monomethyl ether acetate, 3-methoxymethyl propionate, and 3-ethoxyethyl propionate, contains propylene glycol monomethyl ether acetate and at least one kind of organic solvent selected from the group consisting of butyl acetate, cyclopentanone dimethyl acetal, cyclopentanone, anisole, phenetole, ethylene glycol monomethyl ether acetate, 3-methoxymethyl propionate, and 3-ethoxyethyl propionate, contains cyclohexanone and at least one kind of organic solvent selected from the group consisting of butyl acetate, ethyl lactate, 2-hydroxymethyl isobutyrate, propylene glycol monomethyl ether, cyclopentanone dimethyl acetal, cyclopentanone, anisole, phenetole, ethylene glycol monomethyl ether acetate, 3-methoxymethyl propionate, and 3-ethoxyethyl propionate, contains ethyl lactate and at least one kind of organic solvent selected from the group consisting of butyl acetate, propylene glycol monomethyl ether, cyclopentanone dimethyl acetal, cyclopentanone, anisole, phenetole, ethylene glycol monomethyl ether acetate, 3-methoxymethyl propionate, and 3-ethoxyethyl propionate, contains 2-hydroxymethyl isobutyrate and at least one kind of organic solvent selected from the group consisting of butyl acetate, propylene glycol monomethyl ether, cyclopentanone dimethyl acetal, cyclopentanone, anisole, phenetole, ethylene glycol monomethyl ether acetate, 3-methoxymethyl propionate, and 3-ethoxyethyl propionate, or contains cyclopentanone dimethyl acetal and at least one kind of organic solvent selected from the group consisting of butyl acetate, propylene glycol monomethyl ether, cyclopentanone, anisole, phenetole, ethylene glycol monomethyl ether acetate, 3-methoxymethyl propionate, and 3-ethoxyethyl propionate, and the two or more kinds of organic solvents are mixed at a ratio satisfies a content of at least one of the two or more kinds of organic solvents having a vapor pressure of 160 to 1,000 Pa at 25° C. with respect to the total mass of the mixture is 30% to 80% by mass, a content of at least one of the two or more kinds of organic solvents having a vapor pressure higher than 1,000 Pa at 25° C. with respect to the total mass of the mixture is 20% to 60% by mass, and a content of at least one of the two or more kinds of organic solvents having a vapor pressure lower than 160 Pa at 25° C. with respect to the total mass of the mixture is 0% to 50% by mass or satisfies a content of at least one of the two or more kinds of organic solvents having a vapor pressure of 160 to 1,000 Pa at 25° C. with respect to the total mass of the mixture is 70% to 97% by mass and a content of at least one of the two or more kinds of organic solvents having a vapor pressure lower than 160 Pa at 25° C. with respect to the total mass of the mixture is 3% to 30% by mass.

18. The chemical liquid according to claim 17,
consisting of the mixture of two or more kinds of organic solvents.

19. The chemical liquid according to claim 17,
wherein a vapor pressure of the mixture is 160 to 1,000 Pa at 25° C.

20. The chemical liquid according to claim 17,
wherein the mixture contains a first organic solvent which has a vapor pressure of 160 to 1,000 Pa at 25° C. and a second organic solvent which has a vapor pressure higher than 1,000 Pa at 25° C. or contains two or more kinds of the first organic solvents.

* * * * *